(12) United States Patent
Leonov et al.

(10) Patent No.: US 7,875,791 B2
(45) Date of Patent: Jan. 25, 2011

(54) METHOD FOR MANUFACTURING A THERMOPILE ON A MEMBRANE AND A MEMBRANE-LESS THERMOPILE, THE THERMOPILE THUS OBTAINED AND A THERMOELECTRIC GENERATOR COMPRISING SUCH THERMOPILES

(75) Inventors: Vladimir Leonov, Leuven (BE); Paolo Fiorini, Brussels (BE); Chris Van Hoof, Leuven (BE)

(73) Assignee: Stichting IMEC Nederland, Eindhoven (NL)

( * ) Notice: Subject to any disclaimer, the term of this patent is extended or adjusted under 35 U.S.C. 154(b) by 26 days.

(21) Appl. No.: 12/058,544

(22) Filed: Mar. 28, 2008

(65) Prior Publication Data
US 2008/0271772 A1 Nov. 6, 2008

Related U.S. Application Data

(60) Provisional application No. 60/920,593, filed on Mar. 29, 2007.

(30) Foreign Application Priority Data
Aug. 31, 2007 (EP) .................. 07075738

(51) Int. Cl.
*H01L 35/28* (2006.01)
(52) U.S. Cl. .................. 136/212; 136/203; 136/205; 136/224; 136/225
(58) Field of Classification Search .............. 250/338.1; 136/212, 203, 205, 224, 225
See application file for complete search history.

(56) References Cited

U.S. PATENT DOCUMENTS 3,790,829 A * 2/1974 Roth .................. 310/306

| 4,394,600 | A | 7/1983 | Flannagan |
| 4,995,023 | A | 2/1991 | Muller et al. |
| 5,022,989 | A | 6/1991 | Put |

(Continued)

FOREIGN PATENT DOCUMENTS

DE 3404137 8/1985

(Continued)

OTHER PUBLICATIONS

Gyselinckx et al., "Human++: Autonomous Wireless Sensors for Body Area Networks," Proc. of the Custom Integrated Circuit Conference (CICC'05) pp. 13-19 (2005).

(Continued)

*Primary Examiner*—Jeffrey T Barton
*Assistant Examiner*—Devina Pillay
(74) *Attorney, Agent, or Firm*—McDonnell Boehnen Hulbert & Berghoff LLP

(57) ABSTRACT

A method for manufacturing thermopile carrier chips comprises forming first type thermocouple legs and second type thermocouple legs on a first surface of a substrate and afterwards removing part of the substrate form a second surface opposite to the first surface, thereby forming a carrier frame from the substrate and at least partially releasing the thermocouple legs from the substrate, wherein the thermocouple legs are attached between parts of the carrier frame. First type thermocouple legs and second type thermocouple legs may be formed on the same substrate or on a separate substrate. In the latter approach both types of thermocouple legs may be optimised independently. The thermocouple legs may be self-supporting or they may be supported by a thin membrane layer. After mounting the thermopile carrier chips in a thermopile unit or in a thermoelectric generator, the sides of the carrier frame to which no thermocouple legs are attached are removed. A thermoelectric generator according to the present disclosure may be used for generating electrical power, for example for powering an electrical device such as a watch. It may be used with a heat source and/or heat sink with high thermal resistance, such as a human body.

16 Claims, 37 Drawing Sheets

U.S. PATENT DOCUMENTS

| | | | |
|---|---|---|---|
| 5,052,644 | A | 10/1991 | Arieh et al. |
| 5,712,448 | A | 1/1998 | Vandersande et al. |
| 6,046,398 | A | 4/2000 | Foote et al. |
| 6,075,199 | A | 6/2000 | Wong |
| 6,222,114 | B1 | 4/2001 | Mitamura |
| 6,291,760 | B1 | 9/2001 | Mitamura |
| 6,407,965 | B1 | 6/2002 | Matoge et al. |
| 6,426,921 | B1 | 7/2002 | Mitamura |
| 6,438,964 | B1 | 8/2002 | Giblin |
| 6,819,226 | B2 | 11/2004 | Randall |
| 6,958,443 | B2 | 10/2005 | Stark et al. |
| 2002/0092557 | A1 | 7/2002 | Ghoshal |
| 2003/0097845 | A1* | 5/2003 | Saunders et al. ............... 62/3.3 |
| 2004/0113076 | A1* | 6/2004 | Guo et al. ................ 250/338.1 |
| 2006/0000502 | A1 | 1/2006 | Fiorini et al. |
| 2006/0048809 | A1 | 3/2006 | Onvural |
| 2006/0243317 | A1 | 11/2006 | Venkatasubramanian |
| 2007/0186970 | A1* | 8/2007 | Takahashi et al. ........... 136/255 |
| 2008/0314429 | A1 | 12/2008 | Leonov |

FOREIGN PATENT DOCUMENTS

| | | |
|---|---|---|
| EP | 1001470 | 5/2000 |
| EP | 1227375 | 7/2002 |
| EP | 1612870 | 1/2006 |
| JP | PCT/JP2004/004405 | * 11/2004 |
| WO | 2004/105143 | 12/2004 |
| WO | 2005/112141 | 11/2005 |

OTHER PUBLICATIONS

Leonov et al., "Wireless microsystems powered by homeotherms," Proc. Smart Systems Integration Conference, Paris, 27-28 (Mar. 2007).

Min et al., "R3cent Concepts in Thermoelectric Power Generation," The 21st International Conference on Thermoelectronics, 365-374 (2002).

European Search Report for EP Application No. 04447161 dated Dec. 21, 2004.

Mayer et al., "Thin-film thermoelectric generator element characterisation," IEEE (2005).

Bottner, Harald et al., "New Thermoelectric Components Using Microsystem Technologies", Journal of Microelectromechanical Systems, vol. 13, No. 3, pp. 414-420 (Jun. 2004).

Bottner, H., "Thermoelectric Micro Devices: Current State, Recent Developments and Future Aspects for Technological Progress and Applications", 21st International Conference on Thermoelectronics, pp. 511-518 (2002).

Hasebe, S. et al., "Polymer Based Smart Flexible Thermopile for Power Generation", Micro Electro Mechanical Systems, 17th IEEE International Conference, pp. 689-692 (Jan. 2004).

Jacquot, A. et al., "Fabrication and Modeling of an In-Plane Thermoelectric Micro-Generator", 21st International Conference on Thermoelectronics, pp. 561-564 (2002).

Kishi, M. et al., "Micro-Thermoelectric Modules and Their Application to Wristwatches as an Energy Source", IEEE, Eighteenth International Conference on Thermoelectrics, Proceedings ICT '99, pp. 301-307 (Aug. 24, 1999).

Leonov, V. et al., "Thermoelectric MEMS Generators as a Power Supply For a Body Area Network", The 13th International Conference on Solid-State Sensors, Actuators and Microsystems, Seoul, Korea, pp. 291-294 (Jun. 5-9, 2005).

Stark, Ingo et al., "New Micro Thermoelectric Devices Based on Bismuth Telluride-Type Thin Solid Films", 18th International Conference on Thermoelectrics, pp. 465-472 (1999).

Stark, Ingo, "Thermal Energy Harvesting With Thermo Life", Proceedings of the International Workshop on Wearable and Implantable Body Sensor Networks, 4 pages (2006).

Strasser, M. et al., "Micromachined CMOS Thermoelectric Generators as On-Chip Power Supply", Transducers 2003, The 12th International Conference on Solid State Sensors, Actuators and Microsystems, Boston, pp. 45-48 (Jun. 8-12, 2003).

Torfs, Tom et al., "Body-Heat Powered Autonomous Pulse Oximeter", IEEE Sensors 2006, EXCO, Daegu, Korea, pp. 427-430 (Oct. 22-25, 2006).

Bottner, H. et al., "New Thermoelectric Components Using Micro-Systems-Technologies", ETS 2001—6th European Workshop on Thermoelectrics (2001).

European Search Report, European Patent Application 07447010.5 dated Sep. 7, 2007.

Toriyama et al., "Thermoelectric Micro Power Generator Utilizing Self-Standing Polysilicon-Metal Thermopile", IEEE, pp. 562-565 (Jan. 21, 2001).

Ryan et al., "Where there is Heat, There is a Way", The Electrochemical Society Interface, pp. 30-33 (Jun. 2002).

Wang et al., "A New Type of Micro-Thermoelectric Power Generator Fabricated by Nanowire Array Thermoelectric Material", 22nd International Conference on Thermoelectrics, pp. 682-684 (Aug. 17, 2003).

Stordeur et al., "Low Power Thermoelectric Generator—Self-Sufficient Energy Supply for Micro Systems", 16th International Conference on Thermoelectrics, pp. 575-577 (Aug. 26, 1997).

* cited by examiner

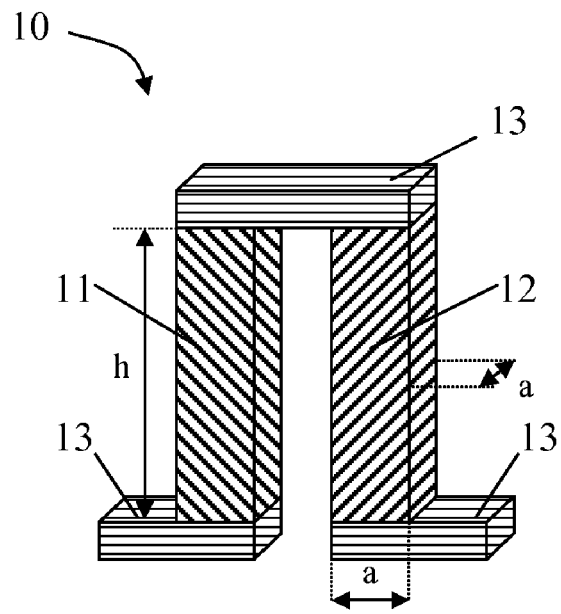
Fig. 1 – PRIOR ART
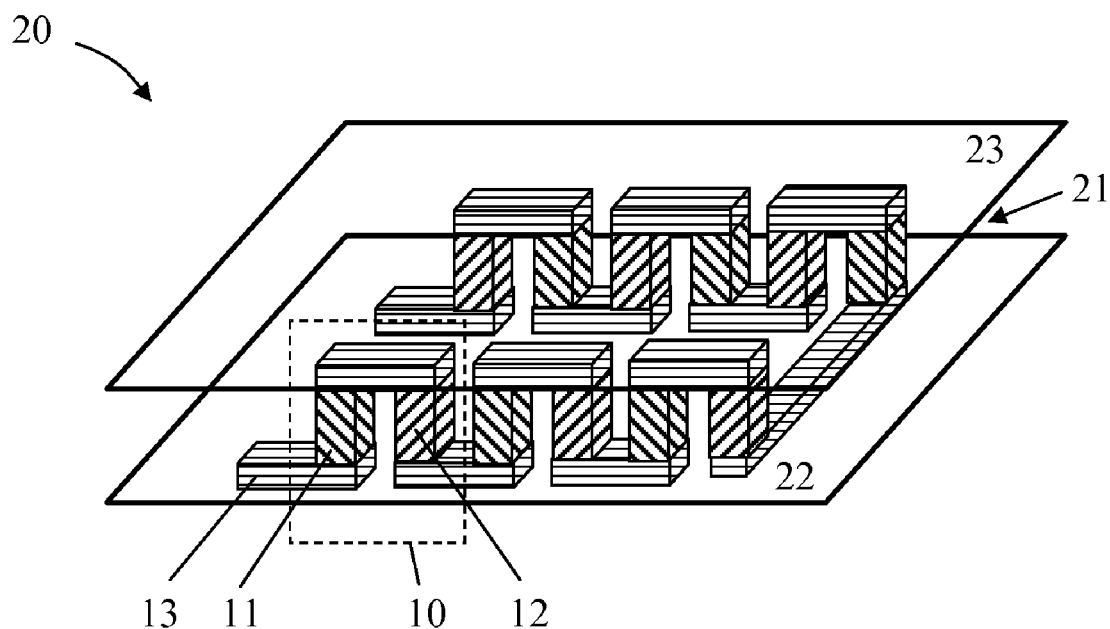
Fig. 2 – PRIOR ART

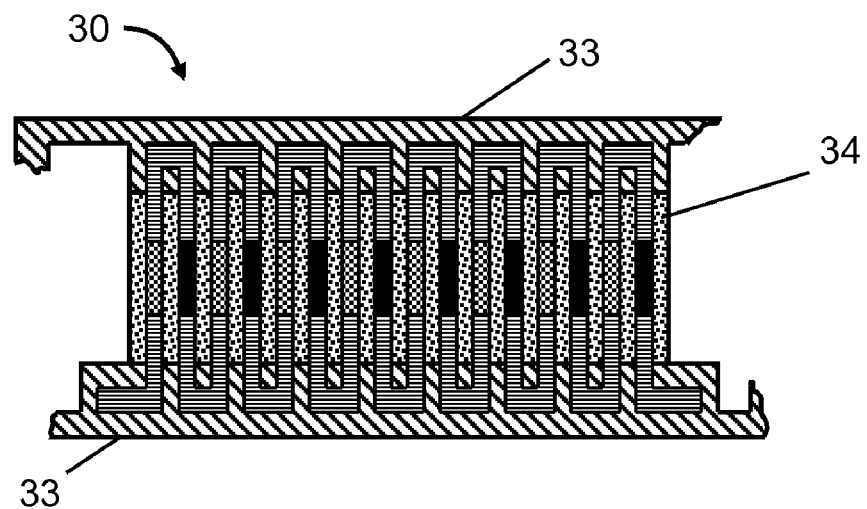
Fig. 8b
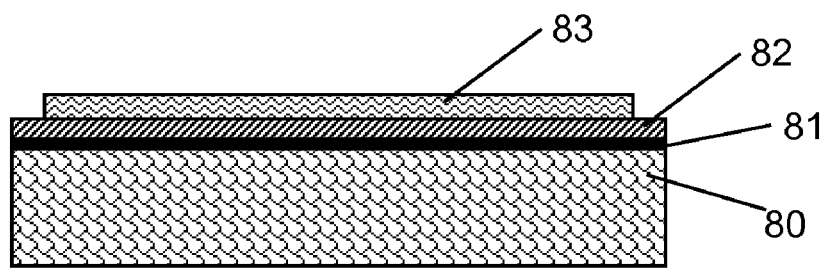
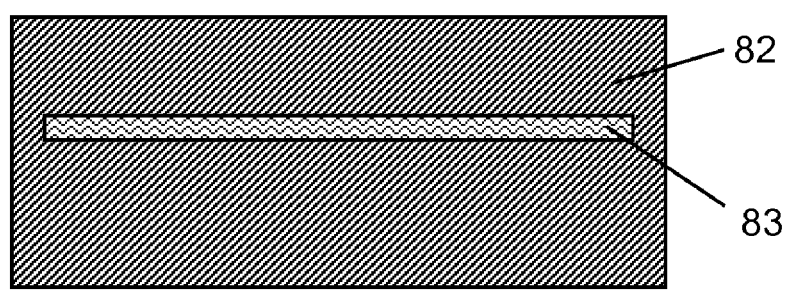
Fig. 9a

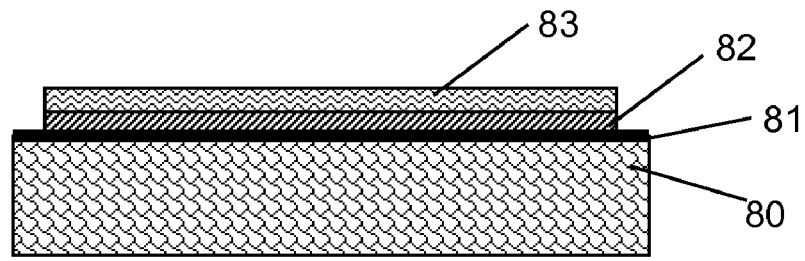
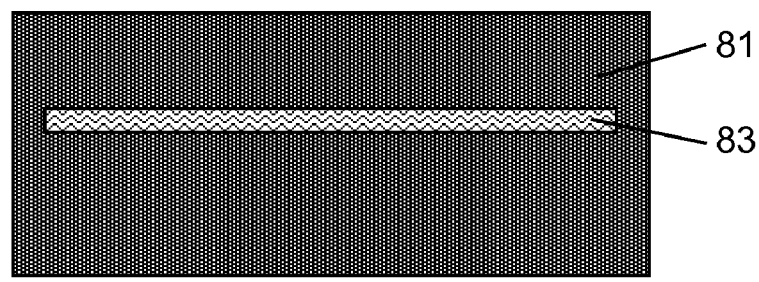
Fig. 9b
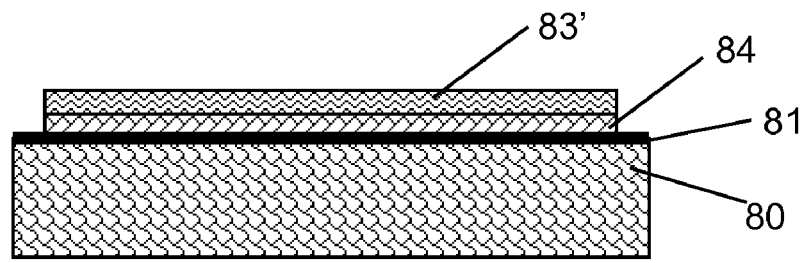
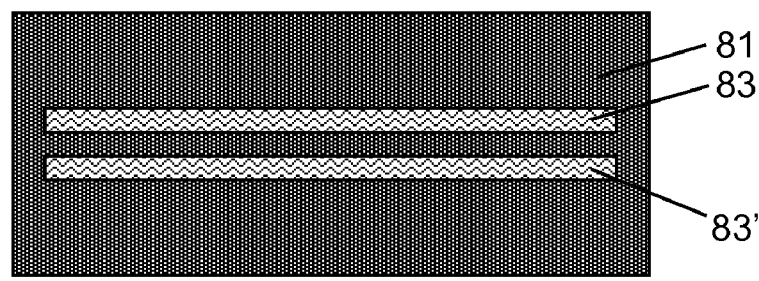
Fig. 9c

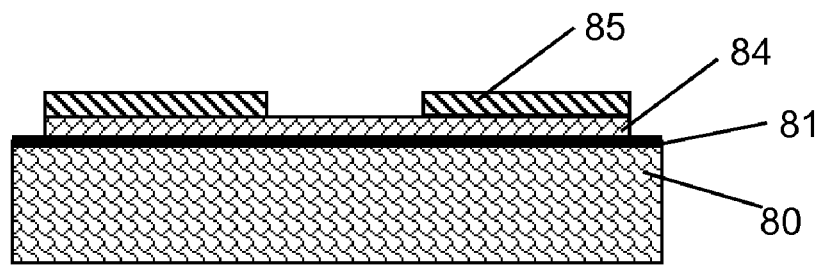
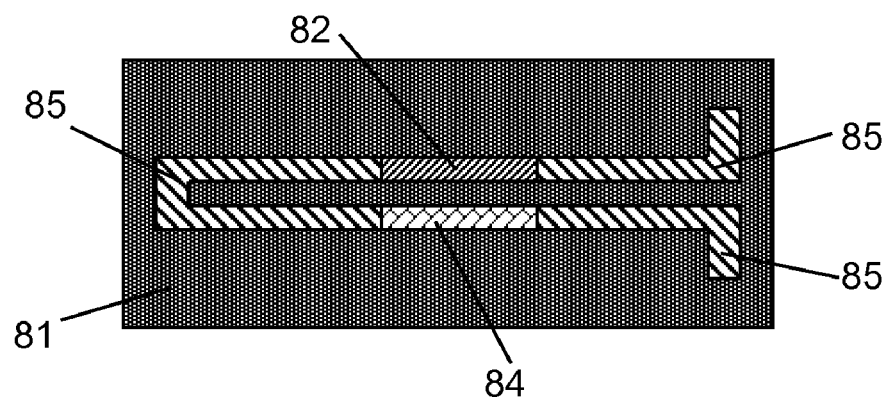
Fig. 9d
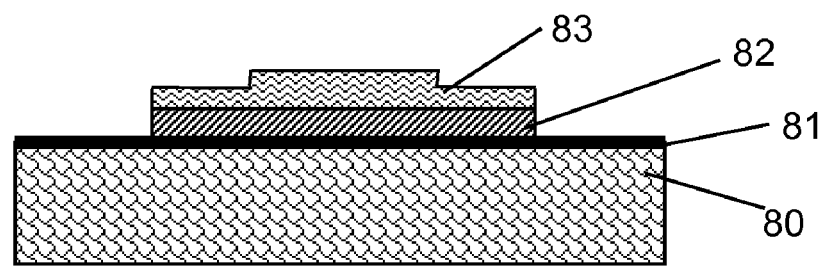
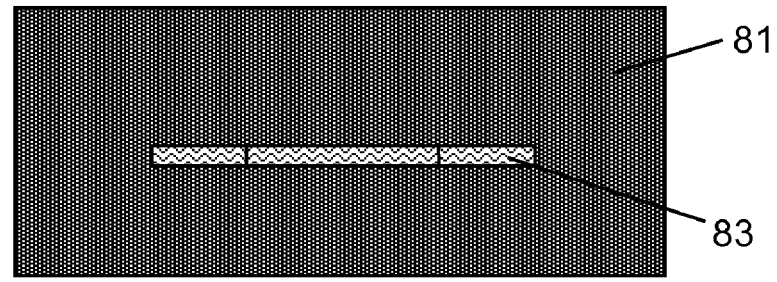
Fig. 10a

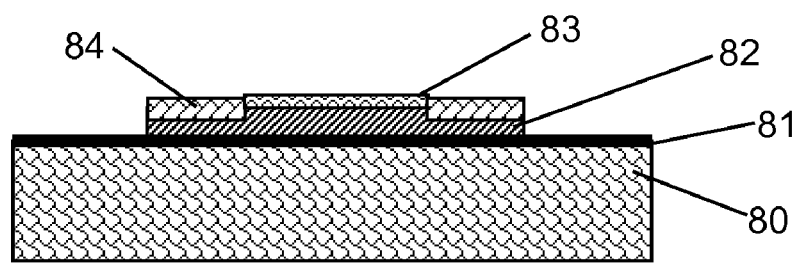
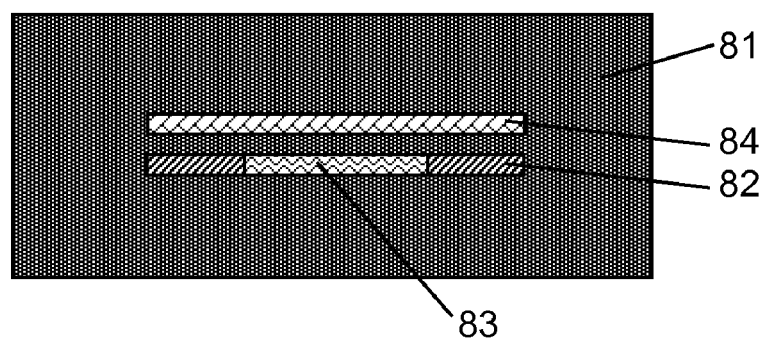
Fig. 10b
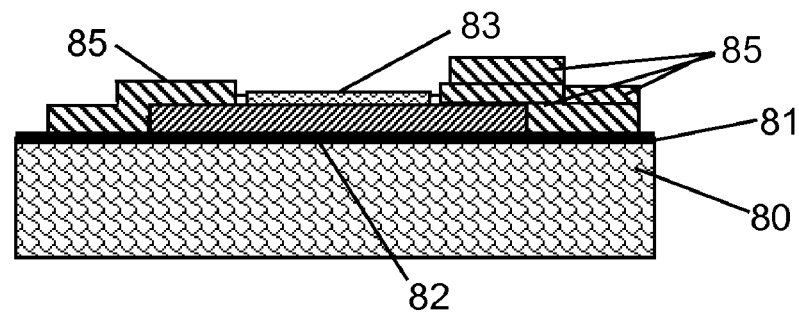
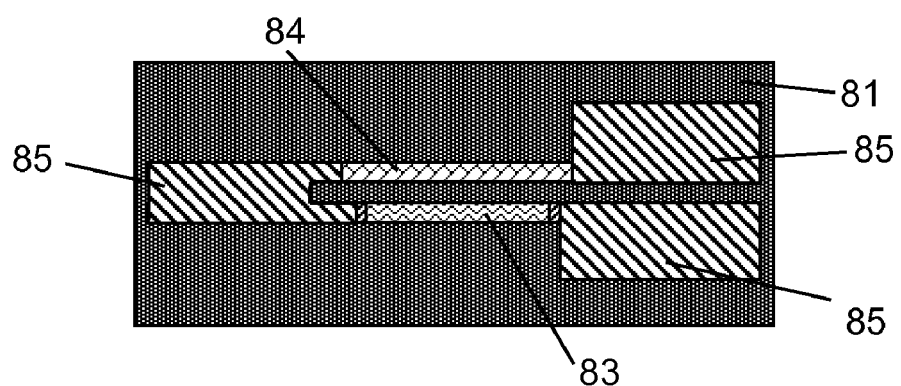
Fig. 10c

Length of thermocouple legs and of a membrane (mm)

METHOD FOR MANUFACTURING A THERMOPILE ON A MEMBRANE AND A MEMBRANE-LESS THERMOPILE, THE THERMOPILE THUS OBTAINED AND A THERMOELECTRIC GENERATOR COMPRISING SUCH THERMOPILES

TECHNICAL FIELD

The present disclosure relates to thermopiles and to thermoelectric generators (TEGs) for scavenging of ambient energy, and more specifically to TEGs operated with a heat source and/or with a heat sink having a large thermal resistance, e.g. to TEGs operated under conditions of non-constant heat flow and non-constant temperature difference. The disclosure also relates to a method of manufacturing thermopiles suited for applications on a heat source or a heat sink with high thermal resistance, e.g. on a human body or on a body of any other endotherm. The disclosure furthermore relates to applications where a TEG dissipates heat into a fluid with high thermal resistance such as for example air or receives heat from a fluid with high thermal resistance such as for example air, having a different temperature with respect to the heat source and/or the heat sink where the TEG is positioned.

BACKGROUND

A thermoelectric generator (TEG) utilises a temperature difference occurring between a hot (warm) object, i.e. a heat source, and its colder surrounding, i.e. a heat sink, and is used to transform a consequent heat flow into a useful electrical power. The necessary heat can be produced by radioactive materials, as e.g. in space applications, or by sources available in the ambient, like e.g. standard cooling/heating systems, pipe lines including pipe lines with warm waste water, surfaces of engines, parts of machinery and buildings or by endotherms (i.e. by warm-blooded animals including human beings and birds, as well as by other endotherms). Natural temperature gradients also could be used, such as geothermal temperature gradients and temperature gradients on ambient objects when naturally heating/cooling at day/night, etc.

There is a growing commercial interest in small-size TEGs, which could replace batteries in consumer electronic products operating at low power and in autonomous devices. For example, TEGs mounted in a wristwatch have been used to generate electricity from wasted human heat, thus providing a power source for the watch itself, see M. Kishi, H. Nemoto, T. Hamao, M. Yamamoto, S. Sudou, M. Mandai and S. Yamamoto in "Micro-Thermoelectric Modules and Their Application to Wristwatches as an Energy Source", Proceedings ICT'99 $18^{th}$ Int. Conference on Thermoelectrics, p. 301-307, 1999. Also, the first wireless sensor nodes fully powered by TEGs have been practically demonstrated and successfully tested on people as reported by V. Leonov, P. Fiorini, S. Sedky, T. Torfs and C. Van Hoof in "Thermoelectric MEMS generators as a power supply for a body area network", Proceedings of the 13th International Conference on Solid-State Sensors, Actuators and Microsystems (Transducers'05), Seoul, Korea, Jun. 5-9, 2005, pp. 291-294; by B. Gyselinckx, C. Van Hoof, J. Ryckaert, R. Yazicioglu, P. Fiorini and V. Leonov in "Human++: Autonomous Wireless Sensors for Body Area Networks", Proc. of the Custom Integrated Circuit Conference (CICC'05), 2005, pp. 13-19; and by V. Leonov and R. Vullers in "Wireless Microsystems powered by homeotherms", Proc. Smart Systems Integration Conference, Paris, 27-28 Mar. 2007. Also the first practically useful device for medical applications, a wireless pulse oximeter, has been demonstrated which is fully powered by a wrist TEG and does not contain any battery as reported by T. Torfs, V. Leonov, B. Gyselinckx and C. Van Hoof in "Body-Heat Powered Autonomous Pulse Oximeter", Proc. of the IEEE Int. Conf. on Sensors, Daegu, Korea, 22-25 Oct. 2006, see also in Abstract book, p. 122.

Recently, MEMS technology has also been used to fabricate miniaturised thermopiles, as described by M. Strasser, R. Aigner, C. Lauterbach, T. F. Sturm, M. Franosh and G. Wachutka in "Micromachined CMOS Thermoelectric Generators as On-chip Power Supply", Transducers '03. $12^{th}$ International Conference on Solid State Sensors, Actuators and Microsystems, p. 45-48, 2003 (Infineon Technologies); by A. Jacquot, W. L. Liu, G. Chen, J.-P. Fleurial, A. Dausher, B. Lenoir in "Fabrication and modeling of an in-plane thermoelectric micro-generator", Proceedings ICT'02. $21^{st}$ International Conference on Thermoelectrics, p. 561-564, 2002; and by H. Bötner, J. Nurnus, A. Gavrikov, G. Kühner, M. Jägle, C. Künzel, D. Eberhard, G. Plescher A. Schubert and K.-H. Schlereth in "New Thermoelectric Components using Microsystem Technologies", Journal of Microelectromechanical Systems, vol. 13, no. 3, p. 414-420, 2004.

Recently, thin film technology has also been used to fabricate miniaturised TEGs on a thin polymer tape, as described by S. Hasebe, J. Ogawa, M. Shiozaki, T. Toriyama, S. Sugiyama, H. Ueno and K. Itoigawa in "Polymer based smart flexible thermopile for power generation", 17th IEEE Int. Conf. Micro Electro Mechanical Systems (MEMS), 2004, pp. 689-692; by I. Stark and M. Stordeur in "New micro thermoelectric devices based on bismuth telluride-type thin solid films", Proceeding of the $18^{th}$ International Conference on Thermoelectrics (ICT), Baltimore, 1999, p. 465-472; and by I. Stark in "Thermal Energy Harvesting with Thermo Life®", Proceedings of International Workshop on Wearable and Implantable Body Sensor Networks (BSN'06), 2006.

Recently, thin-film technology has also been used to fabricate miniaturised thermopiles on a membrane, where the membrane is a thin layer of material suspended on and sustained by a carrier frame, the membrane being much thinner than the carrier frame. Miniaturised thermopiles on a membrane are e.g. described by A. Jacquot, W. L. Liu, G. Chen, J.-P. Fleurial, A. Dausher, B. Lenoir in "Fabrication and modelling of an in-plane thermoelectric micro-generator", Proceedings ICT'02. $21^{st}$ International Conference on Thermoelectrics, p. 561-564, 2002.

In the patent application US-2006-0000502, a micromachined TEG is proposed specially suited for application on heat sources having large thermal resistance, e.g., on human beings. It is proposed and shown that an effective TEG for such applications should contain a large hot plate, a large radiator and a tall spacer somewhere in between the plates. The design and technology for the first micromachined thermopiles specially suited for such applications are reported by V. Leonov, P. Fiorini, S. Sedky, T. Torfs and C. Van Hoof in "Thermoelectric MEMS generators as a power supply for a body area network", Proceedings of the 13th International Conference on Solid-State Sensors, Actuators and Microsystems (Transducers '05), 2005, pp. 291-294.

Recently, an effective TEG using any of the above-mentioned thermopile types has been proposed, with specific thermal matching arrangements implemented in the TEG and/or with a multi-stage arrangement of the thermopiles, offering further improvement of its performance on a heat source or/and on a heat sink with high thermal resistance, more specifically when the TEG is used under conditions of non-constant heat flow and non-constant temperature difference (U.S. Ser. No. 12/028,614).

TEGs can be characterised by an electrical and a thermal resistance and by both voltage and power generated per unit temperature difference between the hot and cold sides of the TEG. The relative importance of these factors depends on the specific application. In general, the electrical resistance should be low and, obviously, voltage or power output should be maximised (in particular in applications with small temperature difference between the heat source and the heat sink, i.e. a few degrees C. or few tens degrees C.). If a constant temperature difference is imposed at the boundaries of the TEG, e.g. by means of hot and cold plates at fixed temperatures relative to each other, the value of thermal resistance is not crucial, because the output voltage and the output power are proportional to the temperature difference, which is fixed. Contrary thereto, if the boundary condition is a constant heat flow or a limited heat flow through the device, then the thermal resistance is of primary importance and the voltage and the power produced by the TEG are different from the voltage and the power produced under conditions of constant temperature difference. The term "constant heat flow" means that in the considered range of TEG thermal resistances the heat flow through the device is constant (limited by the ambient). However, this does not mean that the heat flow stays at the same value over time in a practical application. The term "limited heat flow" means that when decreasing the thermal resistance of the TEG, the heat flow through the device increases till a certain value, at which the conditions of constant heat flow are reached. In the case of "limited heat flow" the heat flow through the device is not limited by the ambient, but is limited for example by the thermal resistance of the TEG.

The basic element of a TEG is a thermocouple 10 (FIG. 1). An example of a thermocouple 10 comprises a first thermocouple leg 11 and a second thermocouple leg 12 formed of two different thermoelectric materials, for example of the same but oppositely doped semiconductor material and exhibiting low thermal conductance and low electrical resistance. For example, the thermocouple legs 11, 12 could be formed from BiTe. If the first thermocouple leg 11 is formed of n-type BiTe, then the second thermocouple leg 12 may be formed of p-type BiTe, and vice versa. The thermocouple legs 11, 12 are connected by an electrically conductive interconnect, e.g. a metal layer interconnect 13, which forms a low-resistance ohmic contact to the thermocouple legs 11, 12. The points of contact in between the legs 11, 12 and interconnects 13 are called thermocouple junctions.

In FIG. 2, a TEG 20 comprising a thermopile 21 comprising a plurality of, preferably a large number of thermocouples 10, is shown. The thermopile 21 is sandwiched in between a hot plate 22 and a cold plate 23. The hot plate 22 and the cold plate 23 are made of materials having a large thermal conductivity, so that the thermal conductance of the plates 22, 23 is much larger (at least by a factor of 10) than the total thermal conductance of the thermopile 21.

In case of a heat source or/and a heat sink with high thermal resistance, three types of thermopiles and their arrangement in a TEG may be considered as suitable: (1) commercial small-size thermopiles arranged in a multi-stage structure according to U.S. Ser. No. 12/028,614, (2) a micromachined thermopile on a raised elongated structure or on a spacer according to US-2006-0000502, (3) a thermopile on a polymer tape arranged as e.g. reported by Ingo Stark and P. Zhou in WO 2004/105143, by Ingo Stark in US 2006/0151021 and by 1. Stark and M. Stordeur in "New micro thermoelectric devices based on bismuth telluride-type thin solid films", Proceeding of the 18th International Conference on Thermoelectrics (ICT), 1999, p. 465-472. Membrane-type thermopiles with a thermal difference between the center of the membrane and its side frame (A. Jacquot, W. L. Liu, G. Chen, J.-P. Fleurial, A. Dauscher, B. Lenoir in 'Fabrication and modeling of an in-plane thermoelectric micro-generator', Proceedings ICT'02. 21st International Conference on Thermoelectrics, p. 561-564, 2002) are not appropriate for applications on a heat source and/or on a heat sink with high thermal resistances because of their thermal mismatch (due to their small contact area with the heat source or the heat sink), and consequently the too low voltage and power they would produce.

SUMMARY

It is an object of the present disclosure to provide a method for manufacturing good thermopile chips, thermopile units and TEGs with such thermopile chips for applications on a heat source and/or on a heat sink with high thermal resistance. Thermopiles manufactured according to the present disclosure comprise thermocouples that may be supported by a membrane layer or that may be self-supporting. The thermocouples may have dimensions so as to be flexible, e.g. bendable. Due to this flexibility, the thermocouples may be shock absorbing, leading to a lower risk of damage to the thermocouples as compared to prior art devices, e.g. micromachined devices. The thermocouple legs of thermopile chips according to the present disclosure may be wider and/or longer than in prior art devices, leading to a cheaper technology being available for manufacturing such thermocouple legs. Moreover, better and more reliable electrical contacts may be obtained in thermopile chips according to the present disclosure. Thermopile chips according to the present disclosure may have a reduced sensitivity to dust during manufacturing as compared to prior art methods. Therefore the method for manufacturing thermopile ships according to the present disclosure may have a good manufacturing yield. Furthermore, a good quality of thermoelectric material may be obtained and both types of thermoelectric material may be optimised independently.

In a first aspect, the present disclosure provides a method for manufacturing a thermopile carrier chip comprising a plurality of thermocouples, the method comprising: providing on a first surface of a first substrate a plurality of first type thermocouple legs; thereafter forming a first carrier frame from the first substrate by removing part of the first substrate from a second surface opposite to the first surface, the first carrier frame comprising a first hot carrier part, a first cold carrier part and first removable beams, thus at least partially releasing the first type thermocouple legs from the first substrate, the first type thermocouple legs being attached between the first hot carrier part and the first cold carrier part; and electrically connecting the plurality of first type thermocouple legs with a plurality of second type thermocouple legs, thereby forming an electrical series connection of alternating first type thermocouple legs and second type thermocouple legs.

According to the present disclosure, electrically connecting the plurality of first type thermocouple legs with a plurality of second type thermocouple legs may comprise providing on the first surface of the first substrate a plurality of second type thermocouple legs, wherein the plurality of second type thermocouple legs are attached between the first hot carrier part and the first cold carrier part. Alternatively, according to the present disclosure, electrically connecting the plurality of first thermocouple legs with a plurality of second type thermocouple legs may comprise: providing on a first surface of a second substrate a plurality of second type thermocouple legs and thereafter forming a second carrier frame from the second substrate by removing part of the second substrate form a second surface opposite to the first surface, the second carrier frame comprising a second hot carrier part, a second cold carrier part and second removable beams, thus at least partially releasing the second type thermocouple legs from the second substrate, the second type thermocouple legs being attached between the second hot carrier part and the second cold carrier part. It is an advantage of providing the first type thermocouple legs on a first substrate and the second type thermocouple legs on a second substrate that the quality of both types of thermocouple legs may be improved or even optimised independently.

The method of the present disclosure may furthermore comprise, before providing the plurality of first and/or second type thermocouple legs on the first surface of the first and/or second substrate, providing an electrically insulating membrane layer onto that surface of the first and/or second substrate.

The method may furthermore comprise separating the membrane layer from the first and/or second removable beams. Separating the membrane layer from the first and/or second removable beams may comprise providing windows in the membrane layer, for example by dry etching, or it may comprise cutting, e.g. laser cutting, the membrane layer.

The method of the present disclosure may furthermore comprise providing at least one thermal shunt for thermally connecting one side of the plurality of thermocouples to the first and/or second hot carrier part and/or for thermally connecting the other side of the plurality of thermocouples to the first and/or second cold carrier part.

The method may furthermore comprise removing the first and/or second removable beams of the first and/or second carrier frame. Removing the first and/or second removable beams may for example be done mechanically, e.g. by breaking, cutting or dicing, or chemically, e.g. by etching.

In a second aspect, the present disclosure provides a method for manufacturing a thermopile unit, wherein the method comprises manufacturing at least one thermopile carrier chip according to the first aspect of the present disclosure, assembling the at least one thermopile carrier chip into a thermopile unit and removing the first and/or second removable beams. Assembling the at least one thermopile carrier chip may comprise attaching at least one thermopile carrier chip to a thermally insulating structure, e.g. a thermally insulating pillar or a thermally insulating wall. Assembling the at least one thermopile carrier chip may comprise providing at least one thermally conductive spacer thermally connected to at least one of the first and/or second hot carrier part and the first and/or second cold carrier part.

In a third aspect, the present disclosure provides a method for manufacturing a thermoelectric generator, wherein the method comprises manufacturing at least one thermopile carrier chip in accordance with the first aspect of the present disclosure or a thermopile unit in accordance with the second aspect of the present disclosure, and providing the at least one thermopile carrier chip or thermopile unit between a hot plate and a cold plate.

The method for manufacturing a thermoelectric generator according to the present disclosure may furthermore comprise providing at least one thermally insulating structure between the hot plate and the cold plate.

The at least one thermopile carrier chip or thermopile unit may be placed parallel to the hot plate and/or parallel to the cold plate. The at least one thermopile carrier chip or thermopile unit may be placed in an inclined position with respect to the hot plate and/or the cold plate.

In a fourth aspect, the present disclosure furthermore provides a thermopile chip comprising a plurality of thermocouple legs which are thermally coupled in parallel, and a carrier frame comprising at least a hot carrier part and a cold carrier part, the thermocouple legs being attached between the hot carrier part and the cold carrier part and being at least partially released from a substrate from which the hot carrier part and the cold carrier part are made.

A thermopile chip according to the fourth aspect of the present disclosure may be obtained after removing the removable beams from at least one thermopile carrier chip, e.g. a thermopile carrier chip manufacture according to the first aspect of the present disclosure. On a thermopile carrier chip, thermocouple legs of a first type may be provided. Thermocouple legs may for example be n-type or p-type. For example, on one thermopile carrier chip only thermocouple legs of a first type may be provided, and on another thermopile carrier chip thermocouple legs of a second type different from the first type may be provided. Two such thermopile carrier chips may then be electrically connected together so as to from an electrical series connection of alternating first type and second type thermocouple legs, the thermocouple legs being thermally connected in parallel. Alternatively, both first type and second type thermocouple legs may be provided on a same thermopile carrier chip. In this case again the thermocouple legs are connected so as to form an electrical series connection of alternating first type and second type thermocouple legs, while thermally providing a parallel connection.

A thermopile chip according to the present disclosure may comprise an electrically insulating membrane layer at least partially supporting the plurality of thermocouple legs. In a particular embodiment the thermal conductance of the electrically insulating membrane layer may be substantially smaller than the sum of the thermal conductance of the plurality of thermocouple legs.

The thermopile chip may comprise thermocouple legs having a thermoelectric part and an electrically conductive part, wherein the electrically insulating membrane layer is present underneath the thermoelectric part and/or underneath the electrically conductive part.

The plurality of thermocouple legs may comprise a hot junction and a cold junction, wherein the distance between the hot junction and the cold junction is substantially smaller than the distance between the hot carrier part and the cold carrier part.

A thermopile chip according to the present disclosure may furthermore comprise at least one thermal shunt forming a thermal connection between the cold junction of the plurality of thermocouple legs and the cold carrier part and/or between the hot junction of the plurality of thermocouple legs and the hot carrier part. The at least one thermal shunt may form an electrical connection between adjacent thermocouple legs.

In a fifth aspect, the present disclosure provides a thermopile unit comprising at least one thermopile chip according to the fourth aspect of the present disclosure. A thermopile unit may comprise a plurality of thermopile chips being connected with their hot carrier parts to each other and with their cold carrier parts to each other. The plurality of thermopile chips may be connected to each other by means of thermally insulating material. The thermopile chips may have a front side and a back side, and the plurality of thermopile chips may for example be connected in pairs with their back sides towards each other. There may be an electrically insulating spacer in between two adjacent pairs of thermopile chips.

A thermopile unit in accordance with the present disclosure may furthermore comprise a thermally insulating structure between the hot carrier parts and the cold carrier parts. It may further comprise at least one thermally conductive spacer for thermally connecting the at least one thermopile chip to a heat source and/or to a heat sink.

In a sixth aspect, the present disclosure furthermore provides a thermoelectric generator comprising at least one thermopile chip in accordance with the fourth aspect of the present disclosure or at least one thermopile unit in accordance with the fifth aspect of the present disclosure, placed between a hot plate for providing thermal connection with a heat source and a cold plate for providing thermal connection with a heat sink. A thermoelectric generator in accordance with the present disclosure may comprise at least one thermally insulating structure, e.g. thermally insulating pillar or thermally insulating wall, between the hot plate and the cold plate. The at least one thermopile chip or thermopile unit may for example be placed parallel to the hot plate and/or parallel to the cold plate. The at least one thermopile chip or thermopile unit may be placed in an inclined position with respect to the hot and/or cold plate. The thermoelectric generator may be filled at least partially with a thermally insulating material.

A thermoelectric generator according to the present disclosure may be used for generating electrical power, for example for powering an electrical device such as e.g. a watch. A thermoelectric generator according to the present disclosure may be used with a heat source and/or a heat sink with a high thermal resistance, e.g. wherein the heat source is a human being, a clothed human being, an animal or ambient air and/or wherein the heat sink is a human being, a clothed human being, an animal or ambient air.

These and other characteristics, features and advantages will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1 is a schematic illustration of a thermocouple comprising an n-type and a p-type semiconducting thermocouple leg and conductive interconnects, e.g. metal layer interconnects.

FIG. 2 is a schematic illustration of a simple TEG comprising a large number of thermocouples sandwiched in between a hot plate and a cold plate.

FIG. 8b shows a thermopile chip upon its installation into a thermopile unit or into a TEG, after removal of the removable beams from the carrier frame.

FIGS. 9a-d illustrate Part I of the fabrication process for a polycrystalline SiGe thermopile chip.

FIGS. 10a-c illustrate Part I of the fabrication process for a BiTe thermopile chip.

FIG. 26a and FIG. 26b illustrate a thermopile chip without membrane for supporting the thermal shunts, electrical interconnects and/or thermocouple legs; FIG. 26c shows a side view of a membrane-less thermopile chip with electrically conductive thermal shunts; FIG. 26d shows a side view of a membrane-less thermopile chip with electrically conductive thermal shunts, but fabricated on an electrically insulating substrate; FIG. 26e shows a side view of a silicon thermopile chip, wherein a doped layer of silicon serves as an etch stop barrier and also serves as a thermal shunt.

Figure 3:
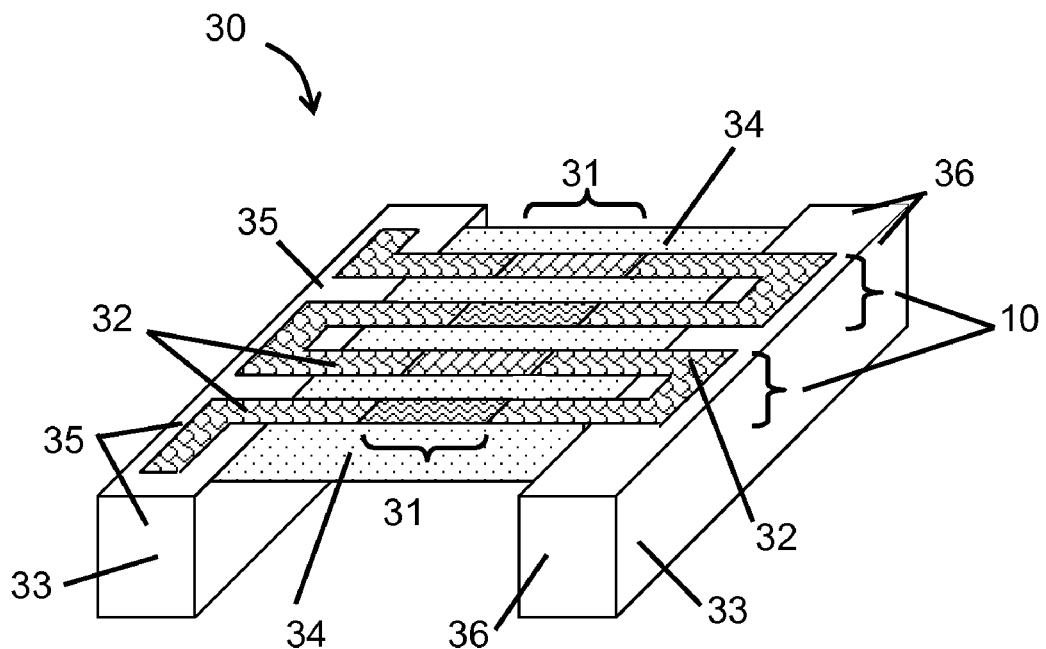
FIG. 3 is a 3D-view of a thermopile chip after removing the removable beams from the carrier frame.

In the different figures, the same reference signs refer to the same or analogous elements.

DESCRIPTION OF ILLUSTRATIVE EMBODIMENTS

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes. The dimensions and the relative dimensions do not necessarily correspond to actual proportions and reductions to practice of the invention.

Furthermore, the terms first, second, third and the like in the description, are used for distinguishing between similar elements and not necessarily for describing a sequential or chronological order. It is to be understood that the terms so used are interchangeable under appropriate circumstances and that the embodiments described herein are capable of operation in other sequences than described or illustrated herein.

It is to be noticed that the term "comprising" should not be interpreted as being restricted to the means listed thereafter; it does not exclude other elements or steps. Thus, the scope of the expression "a device comprising means A and B" should not be limited to devices consisting only of components A and B.

A thermopile chip 30 according to an embodiment is illustrated in FIG. 3 (3D-view). The thermopile chip 30 comprises a large number of thermocouples 10 manufactured on a membrane 34 using a thin or thick film technology. In this context a thin film is defined as a film with a thickness not exceeding 2 μm, and a film thicker than 2 μm is considered as a thick film. Each thermocouple 10 comprises two thermocouple lines, each thermocouple line comprising a thermoelectric part 31 or a thermocouple leg 31 and an interconnect 32. The thermoelectric parts 31 or thermocouple legs 31 of one thermocouple 10 are made of two different thermoelectric materials, for example a p-type semiconductor material for one of the thermocouple legs and an n-type semiconductor material for the other thermocouple leg. Both thermocouple legs may for example be made of a bismuth telluride group material. Other thermoelectric materials may be used. The interconnect 32 may be a metal layer or may comprise the same thermoelectric materials as the thermoelectric parts 31 covered with a metal layer, or may have a metal layer underneath the thermoelectric material. The membrane 34 may be connected to a carrier frame with sides 33, for example a silicon carrier frame, which may be selected because of its high thermal conductivity and compatibility with modern microelectronic technologies. The membrane 34, e.g. a silicon nitride membrane, interconnects the hot side 35 of the thermopile chip 30 and its cold side 36. The hot side 35 will be referred to below as the hot carrier part 35, while the cold side 36 will be referred to below as the cold carrier part 36. The membrane 34 may be made of any technologically compatible material such as for example $SiO_2$, $Si_xN_y$-on-$SiO_2$, polymers, etc.

A TEG 40 may comprise a thermopile unit 50 (FIG. 4) comprising at least one thermopile chip 30, wherein the thermocouples 10 are connected electrically in series and thermally in parallel. The thermopile unit 50 may be placed in between plates 37 and 38. In a preferred embodiment, the thermopile chips 30 in a thermopile unit 50 may be connected electrically in series and thermally in parallel. However, other configurations are possible, such as for example a combination of series/parallel connections, electrically or thermally or both electrically and thermally. The thermopile chips 30 may be mounted parallel to the plates 37, 38, orthogonal to the plates 37, 38 or in an inclined position with respect to the plates 37, 38. Either of the plates 37, 38 is called a hot plate. The other one then has a lower temperature than the first one and thus is called a cold plate. For the sake of simplicity, plate 37 will be further referred to as the hot plate 37 and plate 38 will be referred to as the cold plate 38. The thermopile unit 50 may further comprise other elements, such as for example thermal insulation 51, a radiator or any other structures decreasing the interface thermal resistance to the ambient. The thermal insulation 51 may represent vacuum, air or any other thermally insulating material, and may include thermally insulating pillars 54 and/or thermally insulating encapsulating structures/walls 55, completely or partially surrounding the inner volume in between the hot plate 37 and the cold plate 38, as shown in FIG. 5, where the plate 37 is shown transparent for clarity of presentation. Instead of a plate 37 and/or 38, a radiator similar to the one illustrated in US-2006-0000502 and U.S. Ser. No. 12/028,614 may be used, the entire disclosures of which are incorporated herein by reference. The hot plate 37 and/or the cold plate 38 may also be replaced with any other structure decreasing the interface thermal resistance to the ambient, i.e. to the heat source and/or the heat sink. For example, the hot plate 37 of a TEG 40 for application on the skin of an endotherm may feature micro- or nano-needles penetrating a certain distance into the skin.

Figure 6:
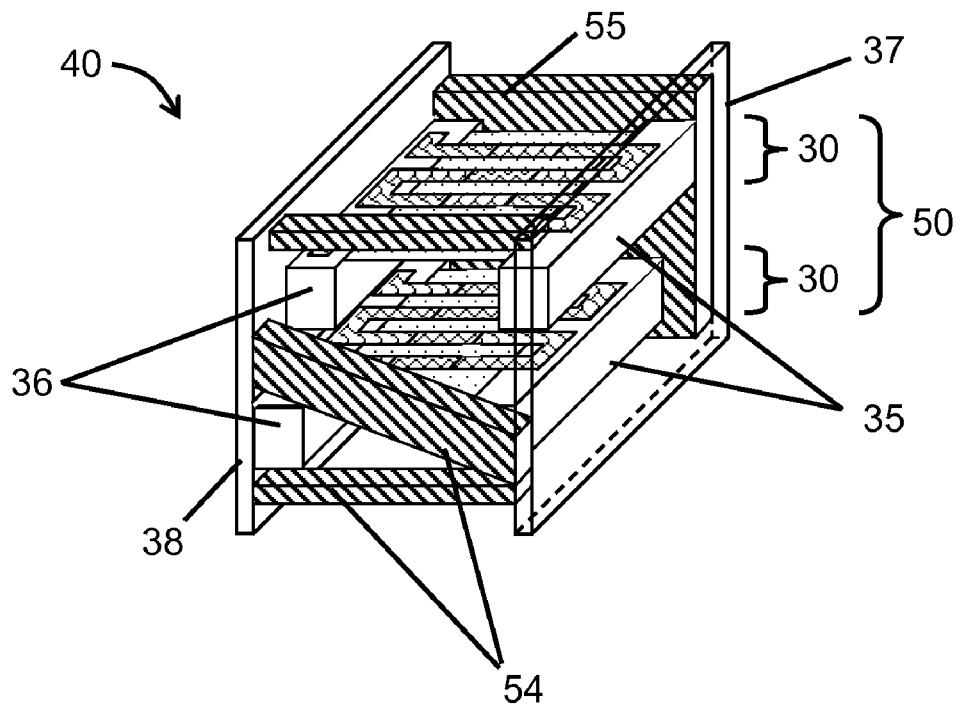
FIG. 6 is a 3D-view of a TEG comprising a thermopile unit with two thermopile chips, after removal of the removable beams from the carrier frame.

A TEG 40 may comprise one or more thermopile chips 30 placed for example in between and orthogonal to the hot plate 37 and the cold plate 38, as shown in FIG. 6. In FIG. 6 two thermopile chips 30 are shown as an example. The hot plate 37 and the cold plate 38 may be supported by at least one thermally insulating pillar 54 and/or at least one thermally insulating wall 55. The hot carrier part 35 serves as a thermally conductive spacer, separating the thermopiles from the hot plate 37, and the cold carrier part 36 serves as a thermally conductive spacer, separating the thermopiles from the cold plate 38. These thermally conductive spacers are equivalent to the spacers and to the raised elongated structures as disclosed in US-2006-0000502, the entire disclosure of which is incorporated herein by reference.

Figure 7:
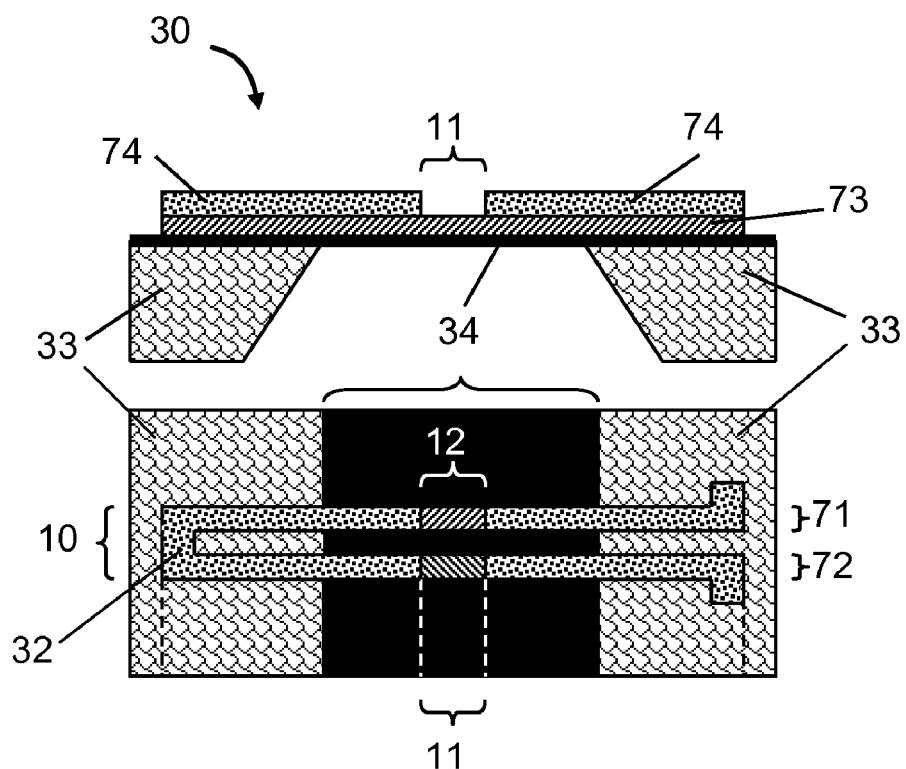
FIG. 7 shows the thin/thick film thermocouple as a basic element of a thermopile according to principles described herein.

In a further aspect, an example of a process for manufacturing a thermopile chip 30 and a TEG 40 is described below. FIG. 7 comprises a side view and a top view of part of a thermopile chip 30, showing one thermocouple as a basic element of a thermopile chip. As an example a silicon-based technology is considered, wherein a thermocouple 10 comprises two thermocouple lines 71, 72 (FIG. 7). The thermocouple lines 71, 72 comprise a thermoelectric layer 73 and an electrically conductive layer, e.g. a metal layer 74. It is assumed, as an example only, that one thermocouple line 71 comprises a p-type bismuth telluride thermoelectric material, and that the other thermocouple line 72 comprises a n-type bismuth telluride thermoelectric material. At one end the lines 71, 72 are electrically interconnected by means of an electrically conductive connection 32, e.g. a metal layer, while at the other end they are interconnected with the neighbouring thermocouples or with output leads. The parts 11, 12 of the thermopile lines 71, 72, being parts only comprising thermoelectric material 73 and not comprising an electrically conductive layer, e.g. metal layer 74, serve as thermocouple legs or as thermoelectric parts 31. The other parts of the thermocouple lines 71, 72, the interconnects between them and the contacts to the neighbouring thermocouples may be coated with an electrically highly conductive layer, e.g. a metal layer, without underlying thermoelectric layer, e.g. bismuth telluride layer, and thus are considered as interconnects 32. In FIG. 7 the thermoelectric layer 73 is shown underneath the metal layer 74 (between the membrane 34 and the metal layer 74) however it may be on top of the metal layer 74 as well.

Figure 8A:
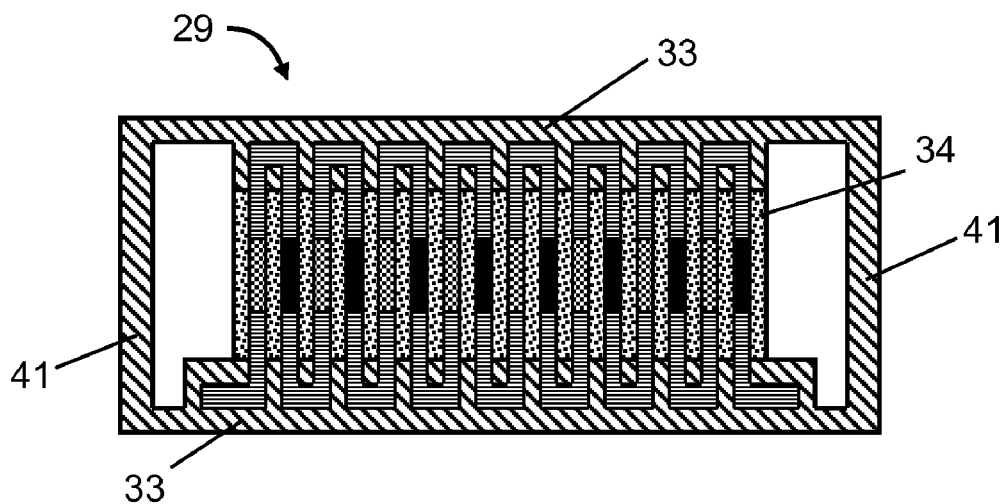
FIG. 8a shows a thermopile carrier chip upon its fabrication, before removal of the removable beams from the carrier frame.

The TEG fabrication may be divided into three parts. In Part I, a thermopile wafer 28 is fabricated using deposition (e.g. chemical vapour deposition (CVD) or other suitable deposition techniques), lithography and etching of various layers on a substrate, e.g. a planar substrate. The various layers may comprise for example layers of thermoelectric material, metal layers and an electrically insulating layer for forming a membrane. In Part II, windows may be etched in the membrane layer, followed by bulk etching of the substrate, thereby releasing the membrane 34 and forming a thermopile carrier chip 29, e.g. a silicon carrier chip, with a carrier frame comprising sides 33 and removable beams 41 as shown in FIG. 8a. The windows in the membrane layers are located such that they separate the membrane 34 from the removable beams 41. In a last Part III, the thermopile carrier chips 29 are mounted into a thermopile unit 50. The thermopile unit 50 is then placed in between the hot plate 37 and the cold plate 38, the thermally insulating pillars 54 and/or walls 55 are installed, and the removable beams 41 of the carrier frame are removed, e.g. broken out mechanically. FIG. 8a shows an example of a thermopile carrier chip 29 after its manufacturing and before its mounting in a TEG, with the removable beams 41. FIG. 8b shows the thermopile chip 30, which is obtained after removal of the removable beams 41. The entire fabrication process, its modifications and peculiarities are described in more detail below.

In Part I of the fabrication process of a TEG 40, thermopile wafers 28 are formed. Although the fabrication principle is the same for different materials, fabrication details may depend on the thermoelectric and other materials used for forming the thermocouples 10. As an example, fabrication processes are described for thermopile wafers 28 comprising SiGe thermocouples and for thermopile wafers 28 comprising BiTe thermocouples. In case $Si_xGe_y$ is used as a thermoelectric material, the process may be easily adapted to Si or similar materials. In case of $Bi_xTe_y$, the process may be easily adapted to $Sb_xTe_y$, $Sb_xBi_yTe_z$, $Bi_xTe_ySe_z$, $Pb_xTe_ySe_z$, $Bi_xSn_y$-$Te_z$ and similar materials. The principle of the fabrication process may be more generally applied to other thermoelectric materials such as for example skutterudites, nanostructured materials, etc. The principle of the fabrication process may furthermore be extended to materials with similar chemical properties.

Firstly, Part I of a fabrication process is described for a TEG 40 comprising thermopile chips 30 comprising SiGe thermocouples. This fabrication process is for simplicity presented for one thermocouple and is illustrated in FIG. 9a to FIG. 9d. In each of these Figures the top view of the thermopile wafer is shown in the bottom part of the Figure, and the corresponding side view is shown in the top part of the Figure. On a substrate 80, which is preferably thermally conductive, an electrically insulating layer 81 is provided, e.g. deposited. The substrate 80 may preferably comprise Si, but may also comprise any other suitable thermally conductive material, such as e.g. aluminium nitride, alumina ceramic, copper, or other materials with lower thermal conductivity such as glass or polymers. The substrate 80 may have a thickness of between, for example, 0.03 and 1 mm. The insulating layer 81 may for example comprise $Si_xN_y$, and have a thickness in the range between 0.1 μm and 5 μm, between 0.1 μm and 3 μm, or between 0.1 μm and 1 μm, for example 0.5 μm. Furthermore, the insulating layer material and its thickness may be selected taking into account the feasibility of further release of the electrically insulating layer 81 to form a membrane 34. Moreover, the thermal conductance of the material forming the electrically insulating layer 81 is preferably smaller than the sum of the thermal conductances of all thermocouples 10 that are to be manufactured on the substrate 80. After providing the electrically insulating layer 81, a thin or thick film 82 of a first thermoelectric material is provided, e.g. deposited, as shown in FIG. 9a. In the example given, the thermoelectric material may be n- or p-type SiGe and may be deposited by e.g. CVD or by any suitable deposition technique known by a person skilled in the art. A protective layer 83 is then provided, e.g. deposited, and patterned as shown in FIG. 9a. The protective layer 83 may for example comprise $SiO_2$ and may have a thickness in the range between 0.1 μm and 5 μm, between 0.1 μm and 3 μm, or between 0.1 μm and 1 μm, for example 0.5 μm. Other materials may be used for forming protective layer 83 and other layer thicknesses are possible, provided that layer 83 protects thermoelectric layer 82 from being damaged during further processing, e.g. during patterning of the layer 82 of thermoelectric material, or during patterning of the layer 84 of second thermoelectric material, as described below. The layer 82 of first thermoelectric material is then patterned using methods known by a skilled person and using protective layer 83 as a mask. FIG. 9b shows the result after patterning of the layer 82 of the first thermoelectric material.

In a next step, a film 84 of a second thermoelectric material is provided, e.g. deposited, and patterned using a protective layer 83' as shown in FIG. 9c. Protective layer 83' may for example be a photoresist layer. The second thermoelectric material may be for example p- or n-type SiGe deposited by e.g. CVD or by any other suitable deposition technique. Important for the second thermoelectric material is that its type (n or p) is opposite to the type of the first thermoelectric material. For example, if the first thermoelectric material is n-SiGe, then the second thermoelectric material is p-SiGe. Protective layer 83 protects the film 82 of the first thermoelectric material during patterning of the film 84 of the second thermoelectric material using the protective layer 83' as a mask.

In a last step of Part I of the fabrication process, protective layers 83 and 83' are removed, e.g. by selective etching, and then a film 85 of electrically conductive interconnection material, e.g. a metal film is provided, e.g. deposited, and patterned as shown in FIG. 9d. The film 85 of electrically conductive interconnection material, e.g. metal film, may for example comprise aluminium, copper, gold, nickel, tungsten or any other suitable metal and may be composed of one or more different layers. As an example, a thin layer of gold or nickel of 10 nm, a 1-3 μm thick aluminium layer on top of it and a 0.5 μm thick layer of nickel on top of the aluminium layer may be used. Such a metal stack has a better contact resistance to SiGe than a single aluminium metal layer, and it has the advantage that the aluminium is not oxidised on open air, providing better wire bonding on aged samples. As can be seen in particular from the bottom part of FIG. 9d, parts of the legs of the thermocouples are not covered by the electrically conductive interconnection material. These parts not covered by the electrically conductive interconnection material form the thermoelectric parts 31 of the legs (see also FIG. 3).

Secondly, an example of Part I of the fabrication process for manufacturing thermopile chips 30 comprising $Bi_xTe_y$ thermocouples is described and is illustrated in FIG. 10a to 10c. In each of these Figures the top view of the thermopile wafer 28 is shown in the bottom part of the Figure, and the corresponding side view is shown in the top part of the Figure. BiTe may be deposited by e.g. sputtering, electroplating or laser ablation. The deposition methods could also be combined with each other, for example an additional electroplating step may be performed on an already fabricated thin BiTe film, in order to increase its thickness to several micrometers or more without using as expensive equipment as the equipment used during sputtering or ablation. If sputtering or laser ablation is chosen, the process may proceed as described above for SiGe, except for the fact that suitable protective layers 83, 83' that can be etched selectively with respect to BiTe may preferably be used. So the material of the protective layers 83, 83' may be any suitable material that can be etched away by an etching compound that does not etch BiTe. In a particular technological process represented in FIG. 10a to FIG. 10c the protective layer 83 may be $SiO_2$ as in the case of SiGe thermocouples. However, as an example, in the process represented in FIG. 10a to FIG. 10c it is not completely removed after patterning of the film 84 of the second thermoelectric material and remains present in the completed device, e.g. for technological reasons or for reasons of controlling stress in the resulting stack of layers.

In a first step of Part I, shown in FIG. 10a, an electrically insulating layer 81 is provided, e.g. deposited, on a substrate 80, for example a thermally conductive substrate. The substrate 80 may preferably comprise Si, but may also comprise any other suitable thermally conductive material, such as e.g. aluminium nitride, alumina ceramic, copper, or other materials with lower thermal conductivity such as glass or polymers. The substrate 80 may have a thickness of between, for example, 0.03 mm and 1 mm. The insulating layer 81 may for example comprise $Si_xN_y$ and have a thickness in the range between 0.1 μm and 5 μm, between 0.1 μm and 3 μm, or between 0.1 μm and 1 μm, for example 0.5 μm. Furthermore, the insulating layer material and its thickness may be selected taking into account the feasibility of further release of this layer to form a membrane 34. Moreover, the thermal conductance of the material forming the electrically insulating layer 81 is preferably smaller than the sum of the thermal conductances of all thermocouples 10 that are to be manufactured on the substrate 80. Then a layer 82 of a first thermoelectric material is provided, e.g. deposited, wherein the first thermoelectric material may be for example n- or p-type $Bi_xTe_y$ or a similar material such as e.g. $Sb_xTe_y$ or $Sb_xBi_yTe_y$, $Bi_xTe_ySe_z$, $Pb_xTe_ySe_z$, $Bi_xSn_yTe_z$, or other thermoelectric materials such as e.g. skutterudites, nanostructured materials etc. A protective layer 83 is then provided, e.g. deposited, and patterned. In a next step layer 82 is patterned using methods known by a person skilled in the art and using protective layer 83 as a mask. The protective layer 83 is then completely removed or thinned down in the areas of its subsequent contact with the electrically conductive layer, e.g. metal layer 85, which is provided, e.g. deposited, in later stages of the process. FIG. 10a shows the thermopile wafer 28 after patterning the protective layer 83 and the layer 82 of a first thermoelectric material, and after locally thinning the protective layer 83.

Then, a film 84 of a second thermoelectric material is provided, e.g. deposited, and patterned using a protective layer 83', e.g. a photoresist layer 83', in a similar way as described in relation with FIG. 9c. FIG. 10b shows the thermopile wafer after deposition and patterning of the layer 84 of second thermoelectric material and after removal of protective layer 83'. As an example, and as illustrated in FIG. 10b, during etching of the layer 84 of the second thermoelectric material, the protective layer 83 may be thinned down, thereby being completely removed in its thinner areas but still staying in its thicker areas, while the layer 82 of first thermoelectric material may be partially etched (thinned down) in non-protected areas.

Finally, a thin film 85 of interconnection material, e.g. a metal film 85, is provided, e.g. deposited, and patterned as shown in FIG. 10c, thereby completing Part I of the fabrication process. The film 85 of electrically conductive interconnection material, e.g. metal, may for example comprise aluminium, copper, gold, nickel, tungsten or any other suitable metal and may be composed of one or more different layers, e.g. to obtain better properties such as providing better contact resistance with underlying layers and protecting the interconnection material from deterioration for example by oxidation. As can be seen in particular from the bottom part of FIG. 10c, parts of the legs of the thermocouples are not covered by the electrically conductive interconnection material. These parts not covered by the electrically conductive interconnection material form the thermoelectric parts 31 of the legs (see also FIG. 3).

Figure 11A:
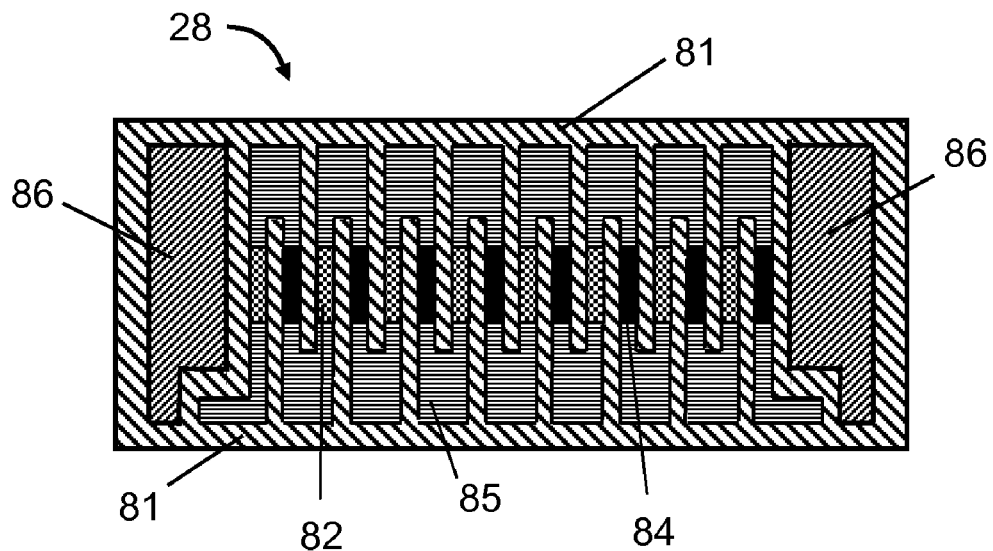
FIGS. 11a,b illustrate Part II of the fabrication process of a thermopile chip.
Figure 11B:
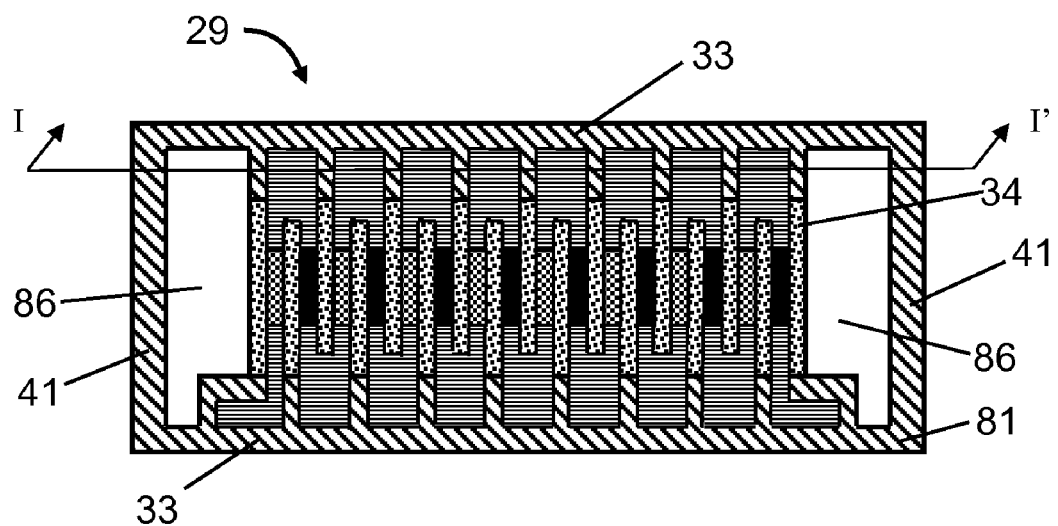

Part II of the fabrication process is shown in FIG. 11a and FIG. 11b, FIG. 11a showing a top view of the thermopile wafer 28 and FIG. 11b showing a top view of the thermopile carrier chip 29. This part of the fabrication process starts with etching windows 86 in the electrically insulating layer 81 as shown in FIG. 11a. The location of these windows 86 is such that the part of insulating layer 81 that will be forming the membrane 34 is separated from the removable beams 41 of the thermopile carrier chip 29 (to be formed in the next step), so as to allow breaking the removable beams 41 (as described below) without damaging the membrane 34 and/or the thermocouples. In a next step, not illustrated in the drawings, part of the substrate 80 is etched from the back side to create a silicon carrier frame comprising sides 33 and removable beams 41, on which a part of electrically insulating material 81 remains. In this way a membrane 34 is created by the electrically insulating layer 81, with no substrate underneath in between sides 33 of the carrier frame and separated from the removable beams 41 (FIG. 11b). For the sake of clarity, the electrically insulating layer 81 is shown in FIG. 11b in a different way on the carrier frame (pattern with 45° lines) and in between the sides of the carrier frame, where the electrically insulating layer 81 forms the membrane 34 (pattern with dots). At this point, Part II of the fabrication process finishes and a thermopile carrier chip 29 is obtained.

Figure 12:
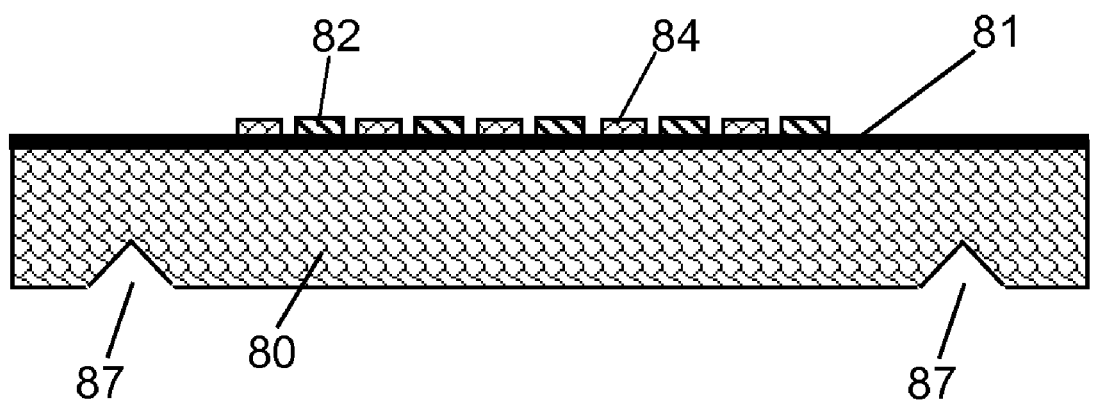
FIG. 12 shows etched grooves on the back side of a thermopile chip for easy and controlled breaking of the removable beams from the carrier frame after its installation into a thermopile unit or into a TEG.
Figure 13:
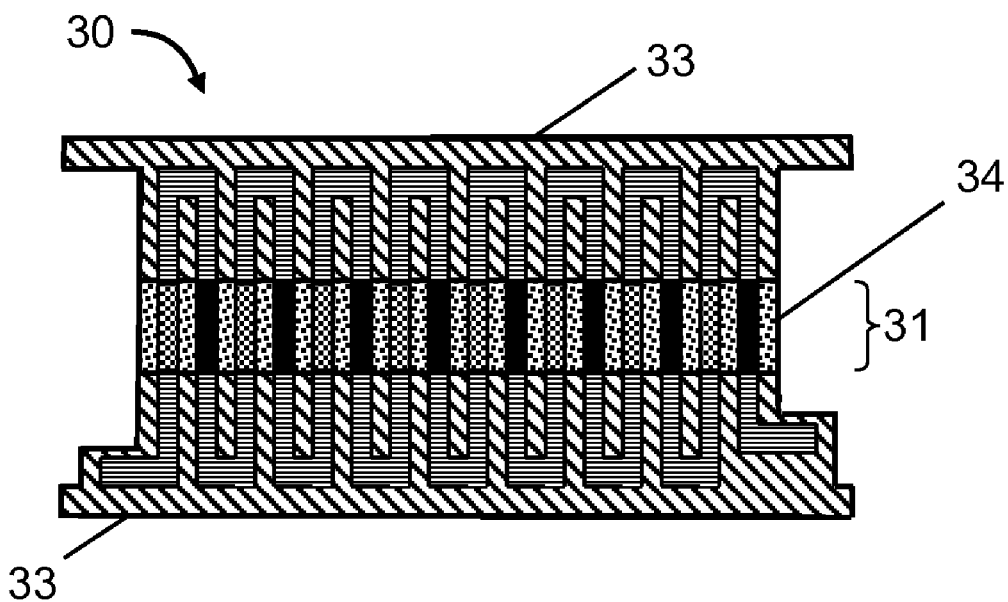
FIG. 13 shows a thermopile chip, fabricated as shown in FIG. 12, after breaking the removable beams from the carrier frame on the etched grooves.

In another embodiment of the fabrication process, grooves 87 may be formed at the back side of the frame as shown in FIG. 12 (side view). This allows for easy and well controlled breaking of the removable beams 41 of the frame, e.g. after installing the thermopile carrier chip 29 in a TEG, such that the frame cracks on the grooves and such that a well controlled shape is obtained as shown in FIG. 13, as opposed to what is shown in FIG. 8b. The grooves may be formed by etching. Etching of the grooves may be performed simultaneously with etching the bulk silicon while creating the carrier frame. For the sake of simplicity, in FIG. 13 the electrically insulating layer 81 is shown as different elements on the carrier frame and on the membrane (as described in relation with FIG. 11b). The electrically insulating layer 81 may either stay in a final device or it may be removed in a further step of the fabrication process, i.e. for forming membrane-type or membraneless-type devices, respectively. Etching of the windows 86 may be performed in Part I of the manufacturing process as well. The grooves 87 may also be fabricated using other techniques than etching methods, e.g. by pre-dicing.

Figure 14A:
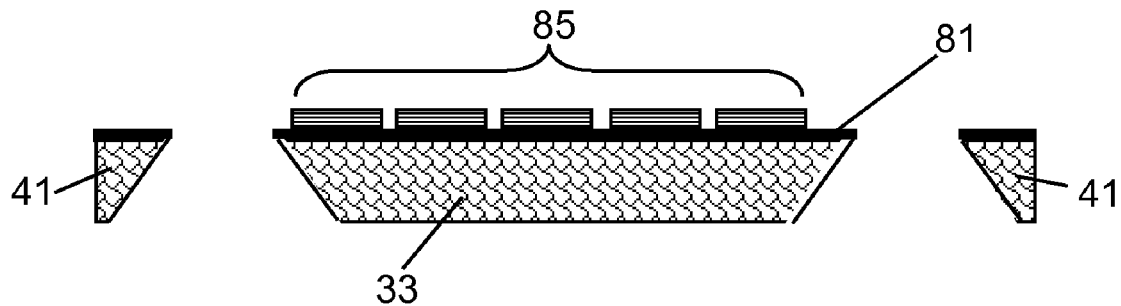
FIG. 14a-c show the cross section of thermopile carrier chips, in which a bulk etch of the substrate is performed in different ways: (a) anisotropic etching, (b) isotropic etching, and (c) deep reactive ion etching.
Figure 14B:
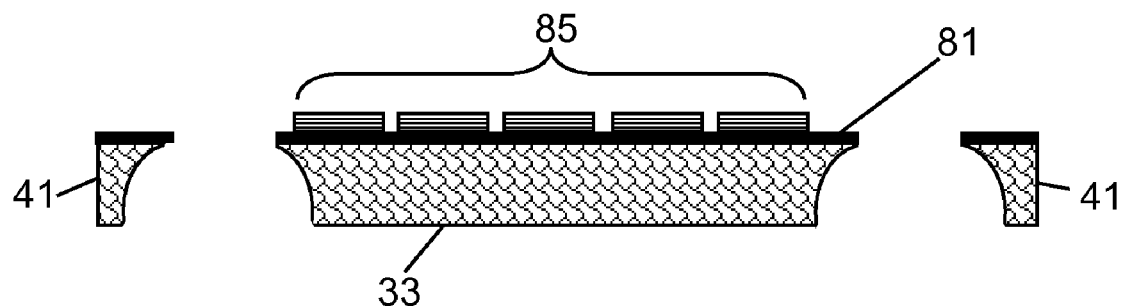
Figure 14C:
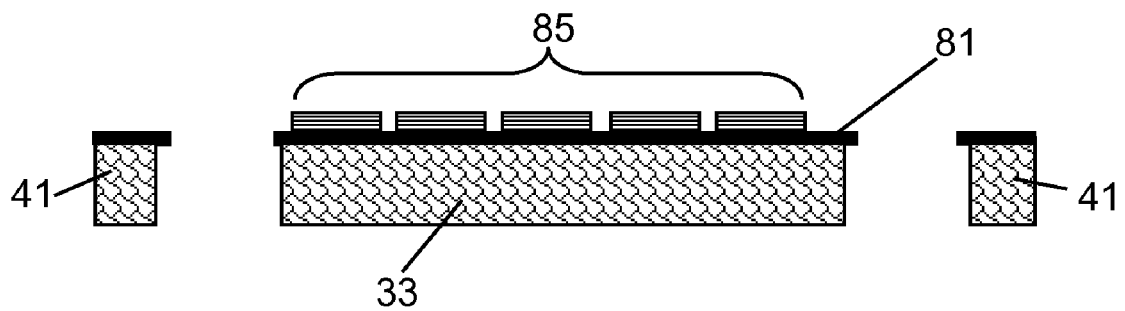

Bulk etching of the substrate from the back side for creating a silicon carrier frame (Part II) may be performed using different technologies, resulting in different profiles of the carrier frame. FIGS. 14a to 14c show the cross section of the thermopile carrier chip 29 according to the line I-I' shown in FIG. 11b when the etching is performed using anisotropic etching (FIG. 14a), isotropic etching (FIG. 14b), and Deep Reactive Ion Etching (DRIE) (FIG. 14c), respectively. In case of DRIE, the etch slope may be varied from the vertical one as shown in FIG. 14c to a slope less than the one shown in FIG. 14a. As described in relation with FIG. 12, grooves 87 may be etched at the back side of the carrier frame, e.g. simultaneously with etching the bulk silicon for creating the carrier frame. Such grooves 87 are not visible in the cross sections of FIGS. 14a to 14c, as these grooves are formed in the sides 33 of the carrier frame at a location where windows 86 have been etched in the electrically insulating layer 81.

Figure 15:
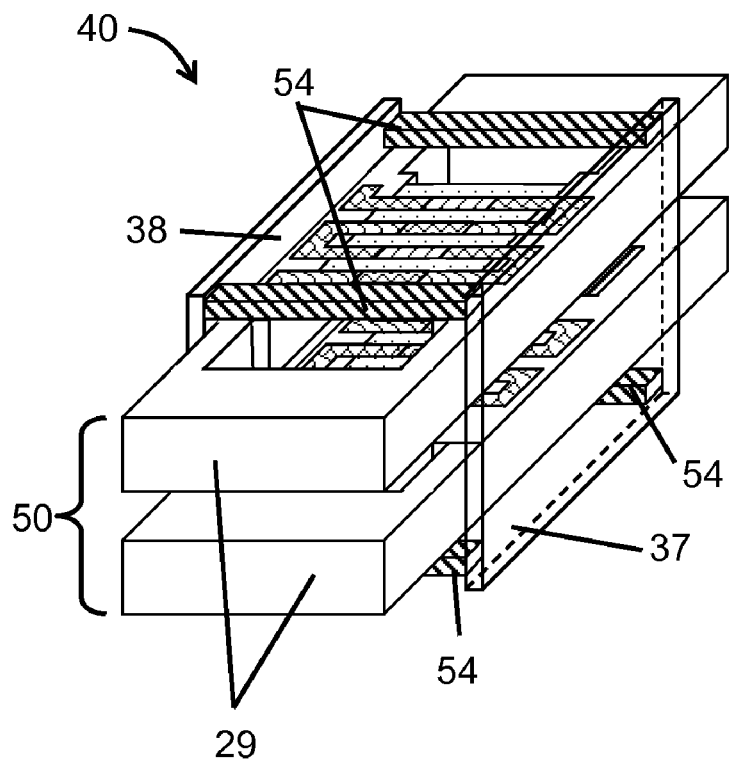
FIG. 15 is a 3D-view of a TEG with thermopile carrier chips before removal of the removable beams from the carrier frame.

Part III of the fabrication process of the TEG 40 starts with mounting the thermopile carrier chip 29 or thermopile carrier chips 29 into a TEG 40. This may be done in two different ways. The first way is to place the thermopile carrier chip 29 or thermopile carrier chips 29 directly into a TEG 40 between the hot plate 37 and the cold plate 38 (FIG. 15). The second way is to assemble first a thermopile unit 50, which is then placed between a hot plate 37 and a cold plate 38, thereby forming a TEG 40.

Figure 42:
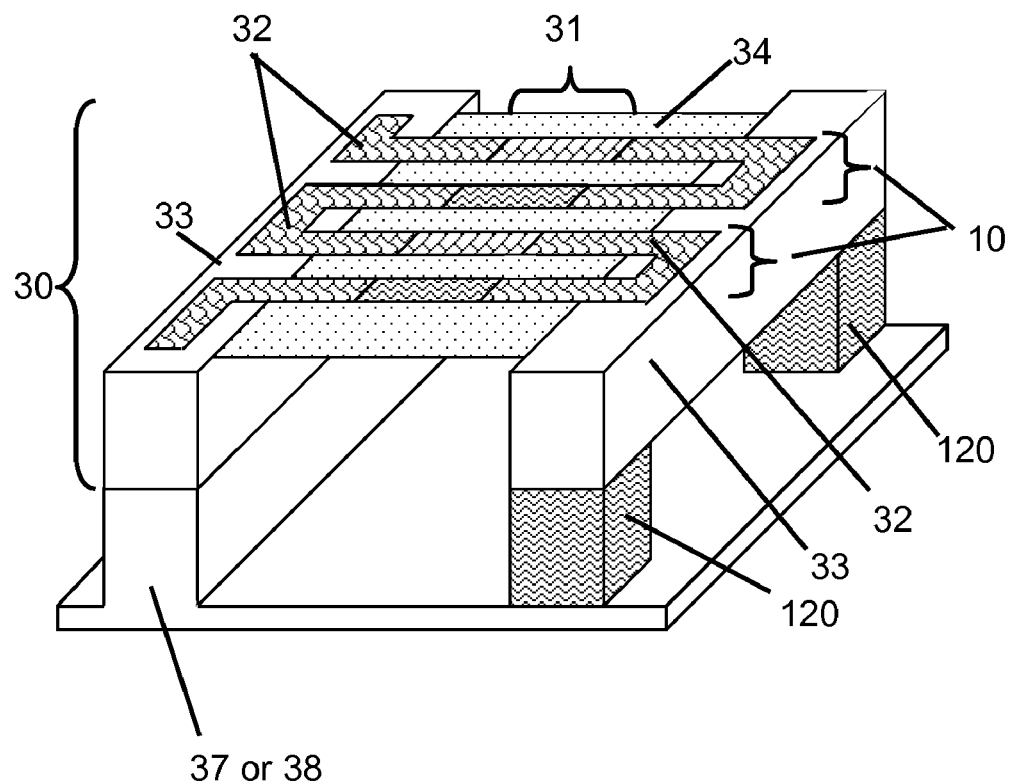
FIG. 42 shows an arrangement wherein a thermopile chip is mounted parallel to the hot plate or the cold plate of a TEG. As an example, two thermally insulating pillars are shown to hold one of the chip sides.
Figure 43:
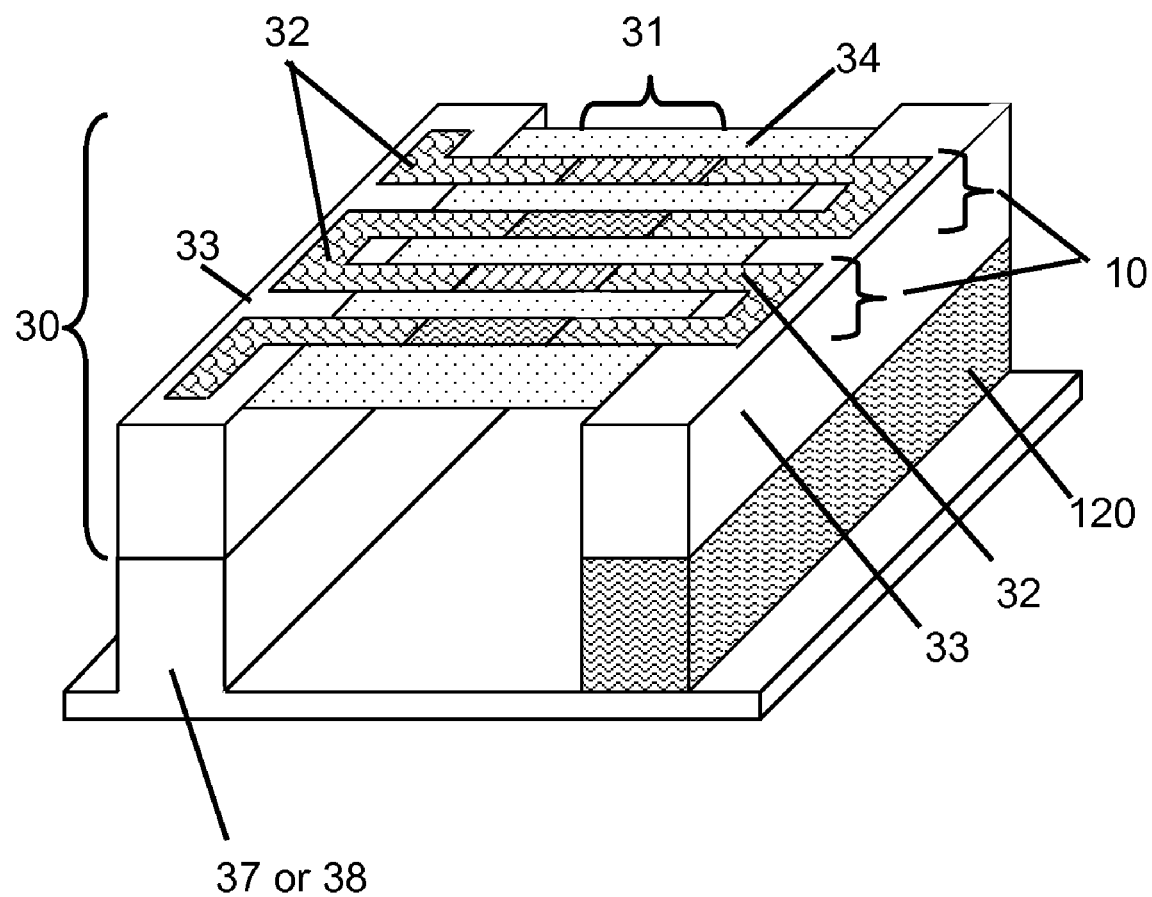
FIG. 43 shows an arrangement wherein a thermopile chip is mounted parallel to the hot plate or the cold plate of a TEG. As an example, a thermally insulating wall is shown to hold one of the chip sides.

The first way of mounting thermopile carrier chips 29 into a TEG 40 comprises first placing the thermopile carrier chips 29 between a hot plate 37 and a cold plate 38, thereby providing a good thermal contact between the thermopile carrier chips 29 and the plates 37, 38, for example by using thermally conductive paste, grease, solder, glue, epoxy or any other suitable material for providing thermal joints, either alone or in any suitable combination. The thermopile carrier chips 29 may be placed orthogonal or not orthogonal to the hot plate 37 and/or the cold plate 38. In the example illustrated in FIG. 15, the thermopile carrier chips 29 are placed orthogonally to both the hot plate 37 and the cold plate 38. In the examples shown in FIG. 42 and FIG. 43, a thermopile chip 30 is parallel with one of the hot or cold plates. For clarity purposes, only one of the hot plate 37 and cold plate 38 is shown in FIG. 42 and FIG. 43. In the example illustrated in FIG. 44, a thermopile chip 30 is parallel with the cold plate 38, and in an inclined position with respect to the hot plate 37. In the example illustrated in FIG. 45, a thermopile chip 30 is parallel with both the cold plate 38 and the hot plate 37. In the example illustrated in FIG. 46, a thermopile chip 30 is in an inclined position with respect to both the hot plate 37 and the cold plate 38. The thermopile chips 30 may be in an inclined position for different reasons, such as for example for better mechanical stability or better resistance to mechanical shocks or vibrations, or for example for fitting the thermopile chips in thin TEGs or in other devices. After placing the thermopile carrier chips 29 between the hot plate 37 and the cold plate 38, thermally insulating pillars 54, e.g. for supporting and thermally insulating hot and cold plates 37, 38, are installed and fixed (FIG. 15). The thermally insulating pillars 54 may for example be glued, preferably with thermally insulating glue, a thermoplastic or an epoxy, but other means of mechanical attachment are also possible.

Figure 4:
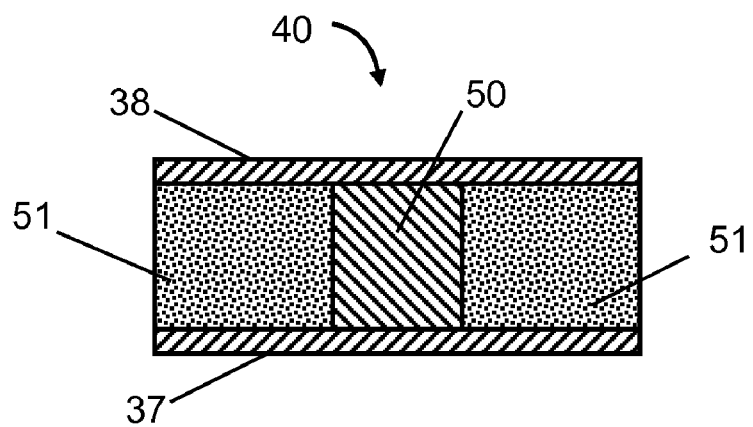
FIG. 4 is a cross-sectional general view of the TEG, comprising the assembly of a thermopile unit with hot and cold plates.
Figure 5:
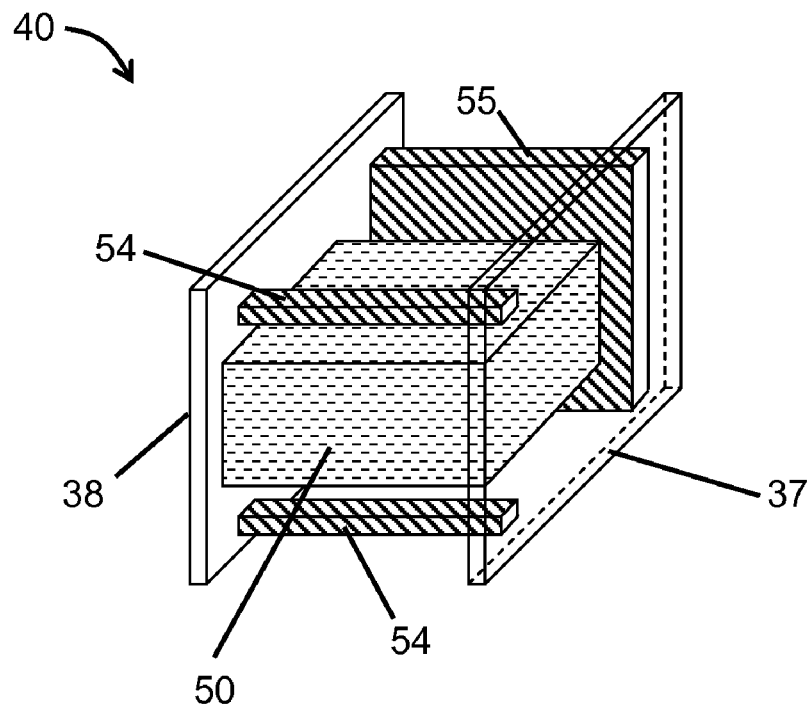
FIG. 5 is a 3D-view of a TEG, showing the assembly of a thermopile unit with hot and cold plates wherein a thermally insulating wall and thermally insulating pillars are installed.
Figure 16:
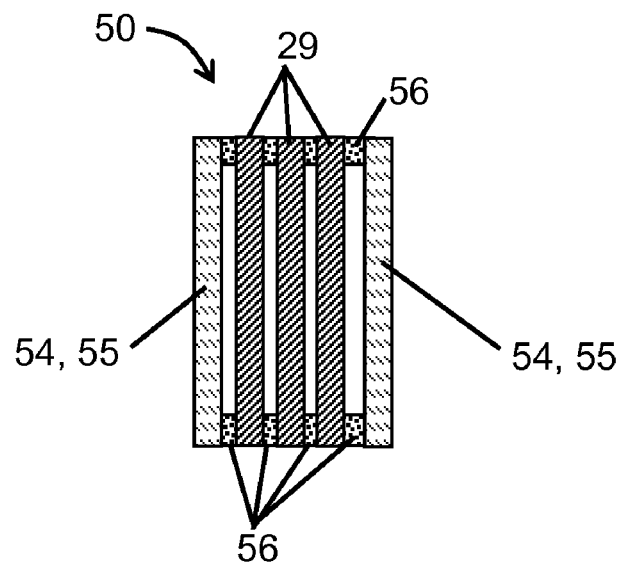
FIG. 16 shows a side view of a thermopile unit, supported by attached thermally insulating pillars or walls, before breaking the removable beams from the carrier frame.

The second way for mounting the thermopile carrier chips 29 into a TEG 40 is to assemble first a thermopile unit 50 which is then to be placed in between the hot plate 37 and the cold plate 38 (see also FIG. 4). There are many possible ways of doing this. For example, a thermopile carrier chip 29 may be glued to a pillar or pillars 54 or to a wall 55 made of a material with low thermal conductivity such a glass, an epoxy, or a polymer. Then, if necessary, additional thermopile carrier chips 29 may be glued to each other, for example in the area of the carrier frame, and finally a second set of pillars 54 or a second wall 55 may be glued using a thermally insulating joint material 56, which may be for example a glue, preferably thermally insulating glue, a polymer, e.g. a thermoplastic, an epoxy, glass, a solder or any other material or materials in any suitable combination for making such joints. The resulting thermopile unit 50 is illustrated in FIG. 16.

Figure 17:
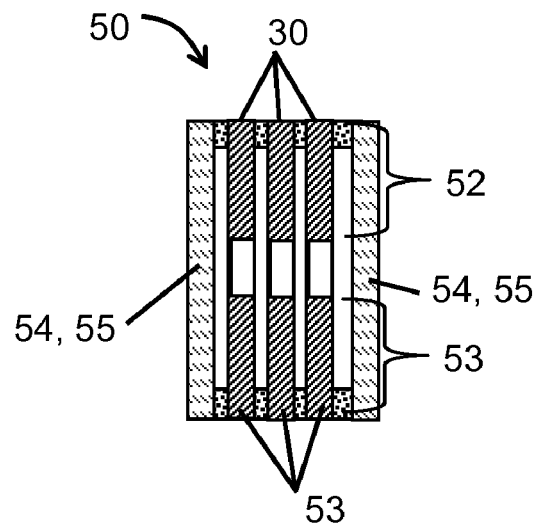
FIG. 17 shows a side view of a thermopile unit after breaking the removable beams from the carrier frame.

Upon assembling the thermopile carrier chips 29 into a TEG 40 or thermopile unit 50 as described above, the removable beams 41 of the carrier chips are removed, e.g. broken out mechanically. FIG. 17 illustrates an example of a thermopile unit 50 after removing the removable beams 41 from the thermopile carrier chips. If the thermopile unit 50 has walls 55 or pillars 54 as in FIG. 17, the additional walls 55 or pillars 54 shown in FIG. 5 in some cases may not be necessary in the TEG 40, because these walls 55 or pillars 54 are already present in thermopile unit 50. FIG. 6 shows the thermopile chips 30 after removal of the removable beams 41 in case of not mounting the thermopile carrier ships into a unit 50 first, but directly mounting them into a TEG 40.

Figure 18:
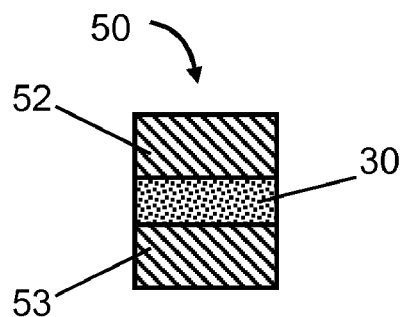
FIG. 18 shows the general design of a thermopile unit with thermally conductive pillars installed thermally in series to the thermopile chips.
Figure 19:
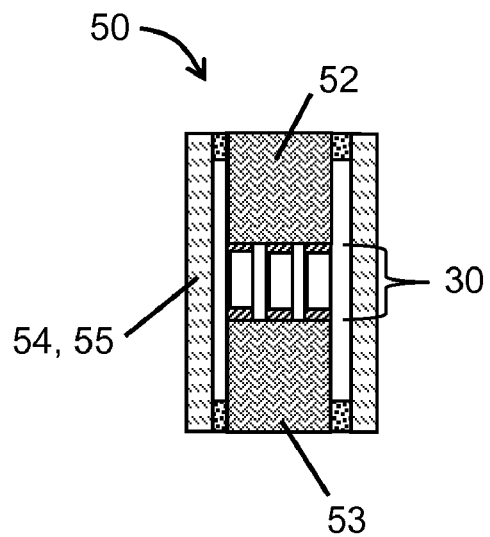
FIG. 19 shows an example of thermopile unit with thermally conductive spacers or pillars installed thermally in series to the thermopile chips.

It is clear from FIG. 6 and FIG. 17 that, after removal of the removable beams 41, the remaining parts of the silicon frame, i.e. hot carrier part 35 and cold carrier part 36, serve as thermally conducting pillars 52, 53 and may correspond to the thermally conductive spacers as described in US-2006-0000502 and U.S. Ser. No. 12/028,614, the entire disclosure of which is incorporated herein by reference. The height of these thermally conducting pillars (hot carrier part 35 and cold carrier part 36) is not limited technologically. Therefore, additional spacers in between the plates 37 and/or 38 and the thermopile chip or chips 30, as described in US-2006-0000502 and U.S. Ser. No. 12/028,614, may not be necessary. However, to decrease the cost of a technological process, the chip area per one TEG may be minimized. Therefore, it may be worth to replace a substantial part of the hot carrier parts 35 and the cold carrier parts 36 with an additional thermally conductive spacer 52, 53 or with more than one thermally conductive spacer 52, 53, e.g. as shown in FIG. 18. In between the thermally conductive spacers 52, 53, one thermopile chip 30 or several thermopile chips 30 may be present, for example as shown in FIG. 19.

Figure 20:
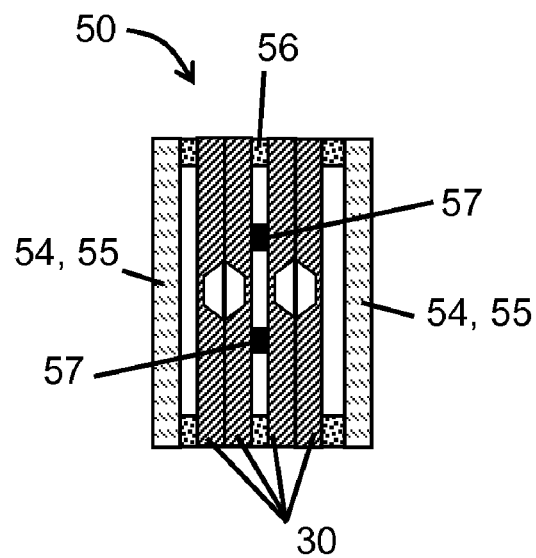
FIG. 20 shows a thermopile unit with coupled thermopile chips, wherein the two chips in each chip couple are facing with their back sides to each other.

If more than one thermopile chip 30 is used in a TEG 40 or in a thermopile unit 50, the thermopile chips 30 may be grouped in couples facing with the same side to each other such as e.g. shown in FIG. 20. Coupling of thermopile chips 30 as shown in FIG. 20 results in an increased thermal resistance of the air inside the TEG, and consequently a larger temperature difference between the thermocouple hot and cold junctions (as compared to a TEG with non-coupled thermopile chips), resulting in a higher voltage and power generated by the TEG (e.g. under conditions of non-constant heat flow and non-constant temperature difference). Care has to be taken to prevent electrical shorts within a couple and between couples. This is especially the case for thick film thermopiles or micromachined thermopiles (discussed below), because thick films may show larger stress than thin films, causing bending of the thermocouple legs and/or the membrane, or may have a larger surface roughness as compared to thin films. Therefore, an insulating layer such as electrically insulating glue 56 or at least one electrically insulating spacer 57 may be placed in between the surfaces of the thermopile chips 30 that comprise thermocouples or electrical contacts. The at least one spacer 57 may be made of a layer of photoresist or any other suitable electrically insulating material. Instead of using one or more spacers 57, also a complete electrically insulating layer covering the surface of at least one of the thermopile chips 30 in each couple of thermopile chips may be used.

It is to be understood that although preferred embodiments, specific constructions and configurations, as well as materials, are discussed herein, various changes or modifications in form and detail may be made without departing from the scope and spirit of this invention. For example, other thermoelectric materials may be used besides BiTe or SiGe, and other materials may be used for the different elements of the device. The parts and their particular configurations shown in the Figures are interchangeable between the different technologies and are not limited to the cases shown. The configurations shown in the Figures are for illustration purposes only; the diversity of possible embodiments is actually much greater.

The performance of a TEG 40 as described in the above embodiments may be enhanced in several ways, e.g. (i) by adding a thermally conducting spacer 52, or 53, or two spacers 52, 53 into the thermopile unit 50, further separating the thermopile chip or chips 30 from at least one of the plates 37 and 38. This leads to improved Rayleigh/Reynolds numbers at the surface of the cold plate according to U.S. Ser. No. 12/028,614, (ii) by varying the contact area of the TEG 40 with the heat source and the heat sink according to US 2006-0000502 and U.S. Ser. No. 12/028,614, and (iii) by appropriately selecting the materials and the design in order to obtain the desired thermal isolation between the hot plate 37 and the cold plate 38. These possibilities are described in US 2006-0000502 and U.S. Ser. No. 12/028,614, the entire disclosure of which is incorporated herein by reference.

Hereinafter, additional possibilities to enhance the performance of the thermopile chip 30 and TEG 40 will be discussed for a TEG 40 attached to a human being. However, this is only by means of an example and thus is not limiting the present invention, which is applicable for all ambient heat sources and heat sinks with high thermal resistance, i.e. with low thermal conductivity, such as for example endotherms or for materials used in building construction, for example bricks and glass.

Figure 21:
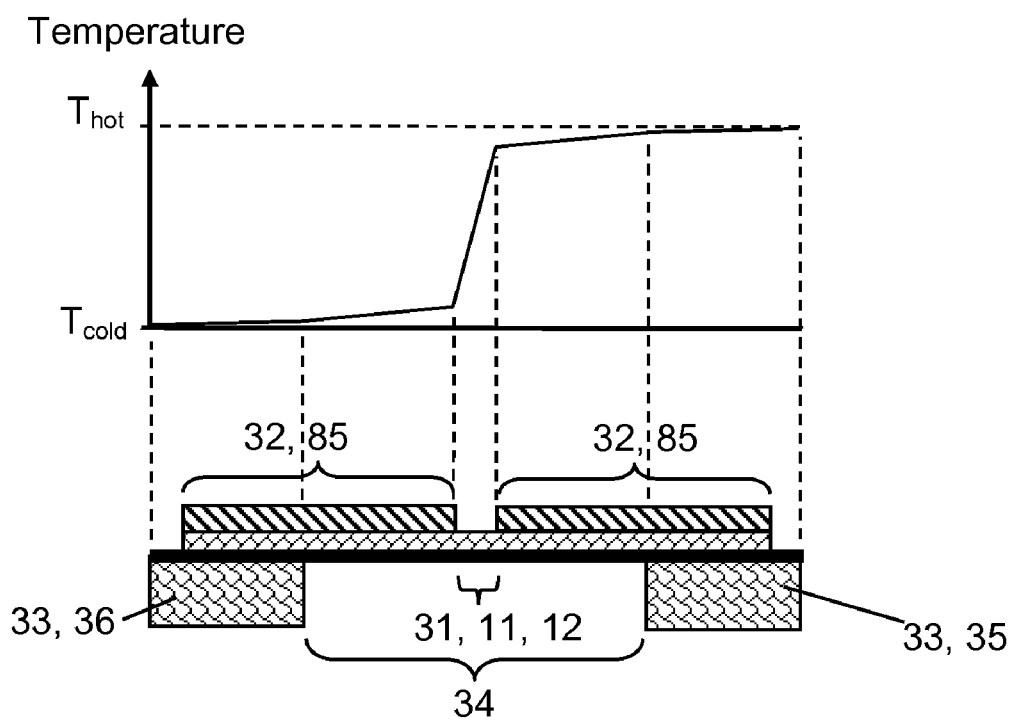
FIG. 21 illustrates the effect of thermal shunts used to decouple the distance between the hot carrier part and the cold carrier part of a thermopile chip from the distance over which the main temperature drop occurs.

When placing a TEG 40 on a human body, there is a small temperature difference between the hot junctions and the cold junctions of the thermocouples, i.e. several degrees Celsius or less. Therefore a large number of thermocouples (thousands of thermocouples) may be required to produce a voltage of at least 0.7-1.5 V as needed for powering accompanying electronics. However, because of user comfort, such TEGs may be limited in size and often also limited in thickness. The useful power (e.g. microwatt to milliwatt level) may then be obtained with a membrane-type TEG using narrow (several μm wide) thermocouple legs. However, narrowing the legs results in a high electrical resistance of the TEG (many megaohms), and therefore such a TEG may become useless for practical applications. If, however, the length of the membrane (i.e. the size of the membrane along the thermocouple lines) is made small enough to decrease the electrical resistance of the TEG, the resulting parasitic thermal conductance through the air in between the plates 37, 38 increases and it thermally shunts the thermopiles, resulting in low voltage and power. These are the main reasons that membrane thermopiles have not previously been practical. The present disclosure offers a solution to this problem, by making thermal shunts on the membrane, such that the distance between the hot carrier part 35 and the cold carrier part 36 remains large, but the length of the thermoelectric part 31 is smaller, thereby decreasing the electrical resistance of the thermocouples and increasing the produced voltage and power as compared to a membrane TEG without thermal shunts. FIG. 13 shows a thermopile chip 30 in which the length of the thermoelectric part 31 of the thermocouple lines is approximately equal to the length of the membrane 34. FIGS. 6 and 8b show the more advantageous design, where the electrically conductive interconnects 32, e.g. metal lines, extend to the central part (i.e. the part in the centre between the hot carrier part 35 and the cold carrier part 36) of the membrane 34. In the examples shown in FIGS. 6 and 8b the length of the thermoelectric part 31 of the thermocouple lines is smaller than the length of the membrane 34. The parasitic thermal conductance through the air increases a little, but despite of this, the voltage and the power may increase significantly. The effect of thermal shunts is shown in FIG. 21. Most of the available thermal gradient appears on the relatively small thermoelectric part 31 when using thermal shunts 32, 85. It is clear that the methods of manufacturing reported above are fully applicable to this thermopile design.

Figure 22:
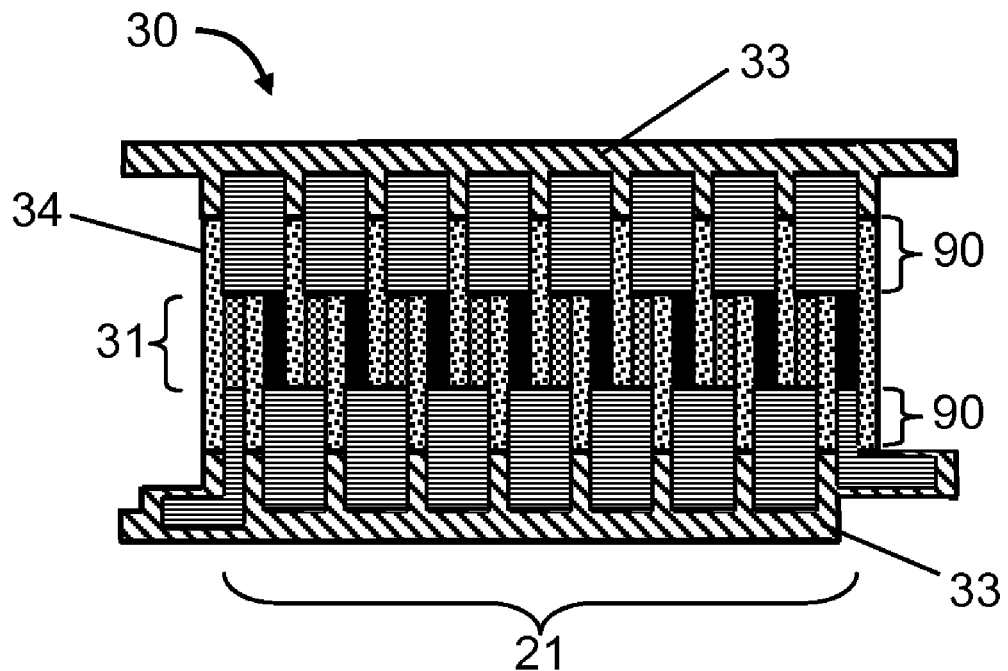
FIG. 22 shows a thermopile chip with thermal shunts made of electrically and thermally conductive material between the thermocouple legs and the sides of the carrier frame. The shunts perform also the function of electrical interconnection of two adjacent thermocouple legs.

In a preferred embodiment, the thermal shunts 90 are fabricated in such a way that the electrical resistance of the shunts between the adjacent thermocouple legs 11, 12 is minimised through minimising the electrical length of the shunts, as shown in FIG. 22. For comparison, FIG. 8b illustrates another embodiment, wherein the electrical resistance of the thermal shunts is not minimised.

Figure 23:
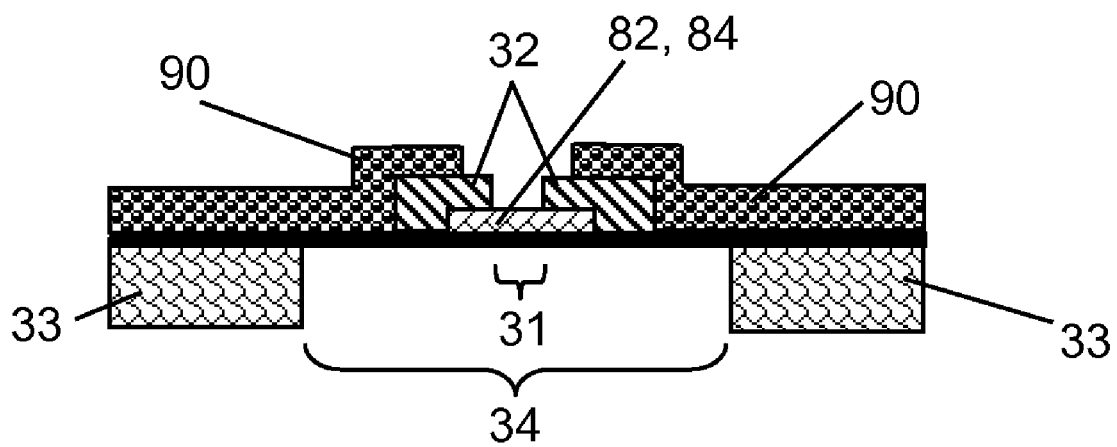
FIG. 23 shows a side view of a thermopile chip with thermal shunts made of thermally conductive material, while electrical interconnects are made of electrically conductive material.

The thermal shunts 90 as shown in FIG. 22 perform two independent functions at once, i.e. electrical connection between the thermoelectric parts 31 and thermal connection of the thermoelectric parts 31 with the sides 33 of the carrier frame. These two functions may be split into two separate elements, i.e. a thermally conductive thermal shunt 90 and an electrically conducting interconnect 32, as shown in FIG. 23. The fabrication process stays generally the same. Only one fabrication step is added: deposition and patterning of the thermal shunt layer 90, which is performed in between Part I and Part II of any of the fabrication processes described above. An advantage of this design and technology is that the thermally conductive shunt 90 may have larger thermal conductivity as compared with a thermal shunt made of the same material (metal) as the interconnects 32. The material for the thermal shunt 90 may then be chosen from a large family of thermally conductive materials irrespective of their electrical conductivity, such as for example pyrolytic graphite, diamond or silicon carbide. This improves the generated voltage and the power.

Figure 24:
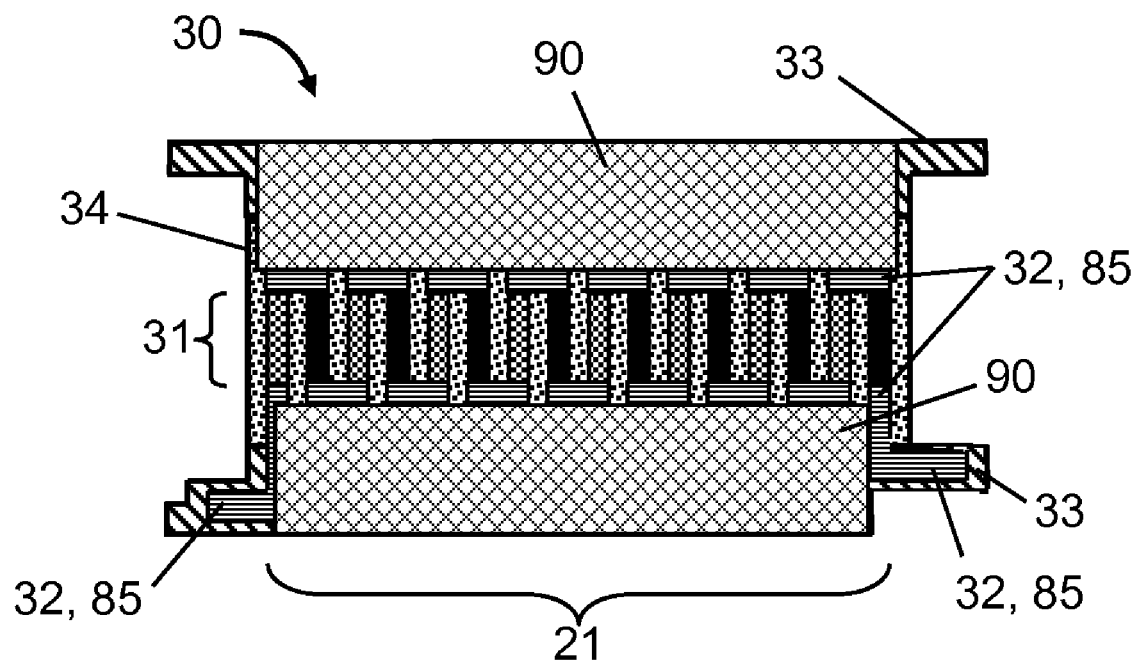
FIG. 24 shows a thermopile chip with thermal shunts made of material that is thermally conductive but not electrically conductive.

If the material selected for the thermal shunts 90 is not electrically conductive, then the space in between the thermal shunts 90 may be reduced to zero as shown in FIG. 24, thereby improving the voltage and the power.

Figure 25:
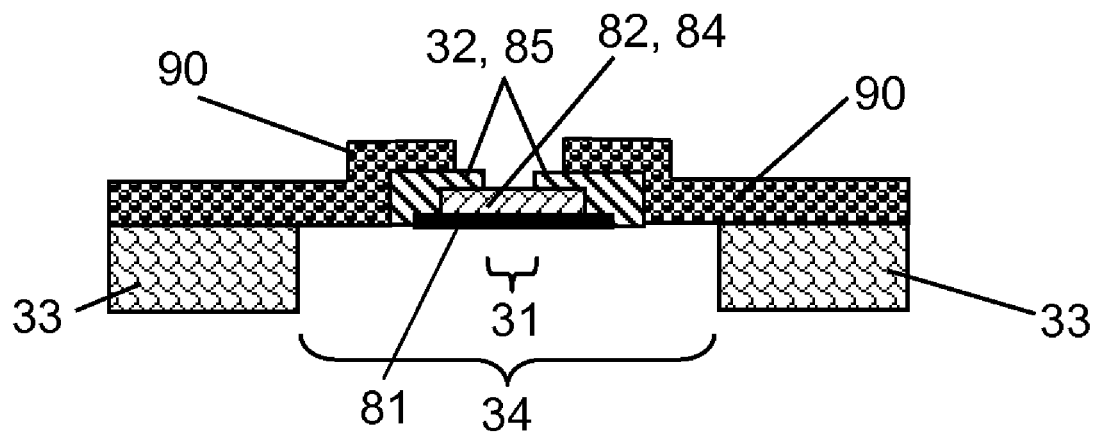
FIG. 25 shows a side view of a thermopile chip with thermal shunts as in FIG. 24, in which a membrane is only present in the area of thermocouple legs, i.e. under the legs and in between them.

If the material selected for the thermal shunts 90 is not electrically conductive, the insulating layer 81 may not be necessary on a part of the structure between the sides 33 or on the whole structure (as will be shown below in FIGS. 26c and 26d), and the layer 90 may perform functions of the membrane 34, as shown in FIG. 25.

Figure 26A:
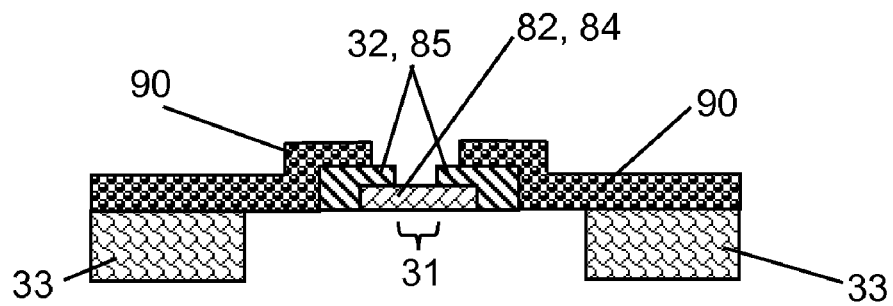
FIGS. 26a-e show examples of a thermopile chip structure.
Figure 26B:
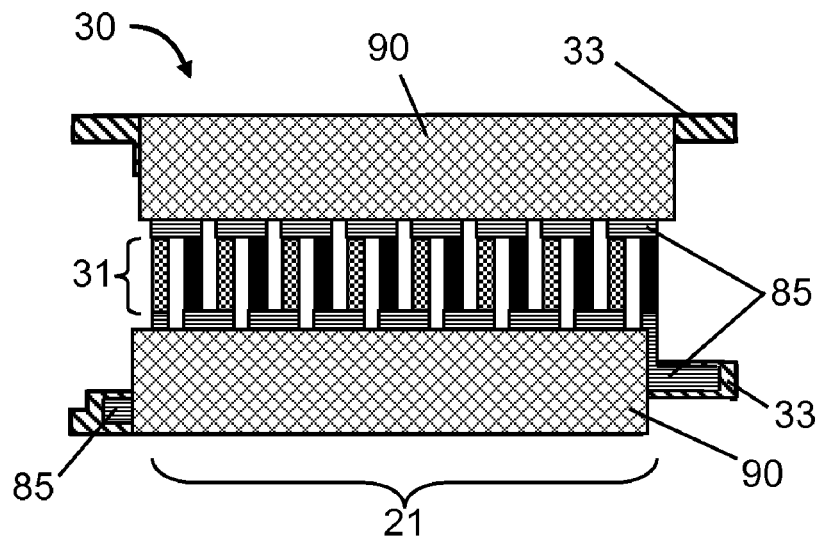
Figure 26C:
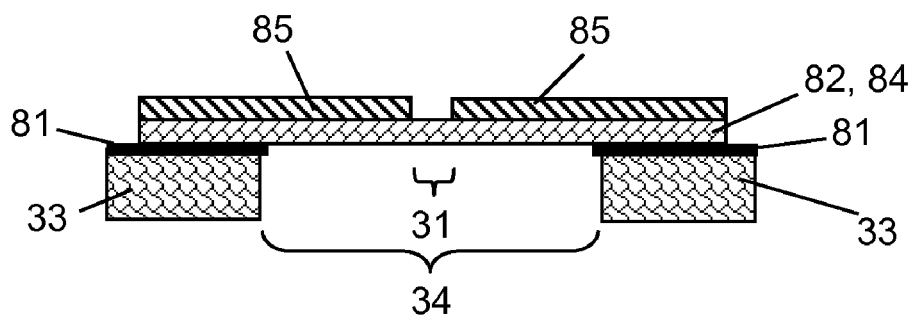
Figure 26D:
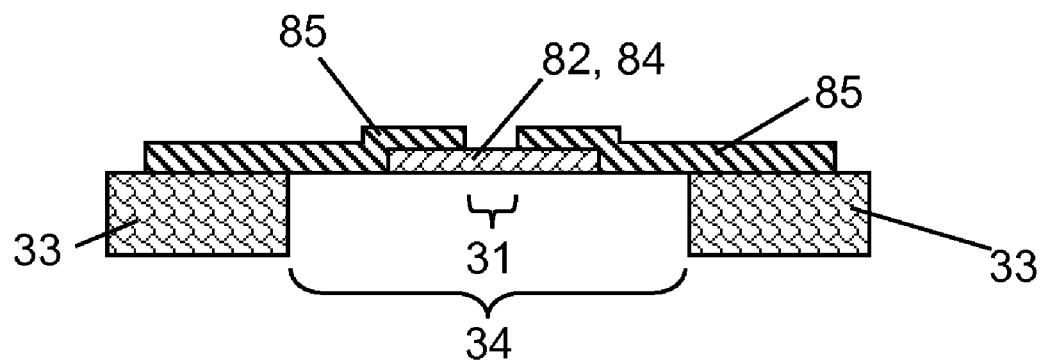

If the stiffness and thickness of the film 82 of a first thermoelectric material, the film 84 of a second thermoelectric material and the film 85 of interconnection material are sufficient to hold the structure, i.e. if the structure is self-supporting, the insulating layer 81 may not be necessary. This results in a membrane-less thermopile chip 30, as illustrated in FIG. 26a (side view) and FIG. 26b (top view). As one can see, the membrane function is shared between thermal shunting layer 90 and the layers 82, 84, and 85. Moreover, there may be holes in between the thermoelectric parts 31, and/or in between the interconnect lines 85, thereby further improving the voltage and power output. The membrane-less thermopile chip 30 may also be made with thermal shunts as in FIGS. 8b, 11b, 13, and 22. A membrane-less thermopile chip 30 may be manufactured with a slightly modified fabrication process as compared to a membrane-type thermopile chip 30 (described above). Either the deposition of an electrically insulating layer 81 may be omitted from Part I of the manufacturing process, or an electrically insulating layer 81 may be provided as described above and may then be removed at least between the sides 33 of the carrier frame at the end of Part II of the manufacturing process. The electrically insulating layer 81 is used on the sides 33 if these sides are electrically conductive, as shown in FIG. 26c. However, if the sides 33 themselves are made of electrically insulating material, the electrically insulating material 81 is not required at all, as in the example shown in FIG. 26d. In some cases, a very thin, e.g. 50-100 nm membrane may still be used for technological reasons, for example as an etch stop for etching in Part II of the fabrication process.

The invention is not limited to the shown examples and embodiments, and a much wider spectrum of membranes or membrane structures may be proposed. For example, a doped n-layer of silicon on top of a p-type wafer may serve as an etch stop barrier, e.g. for KOH. Then, a part 94 of a substrate, more in particular a layer with a different type of doping as compared to the bulk of the substrate, may serve as a thermal shunt as shown in FIG. 26e.

Figure 26E:
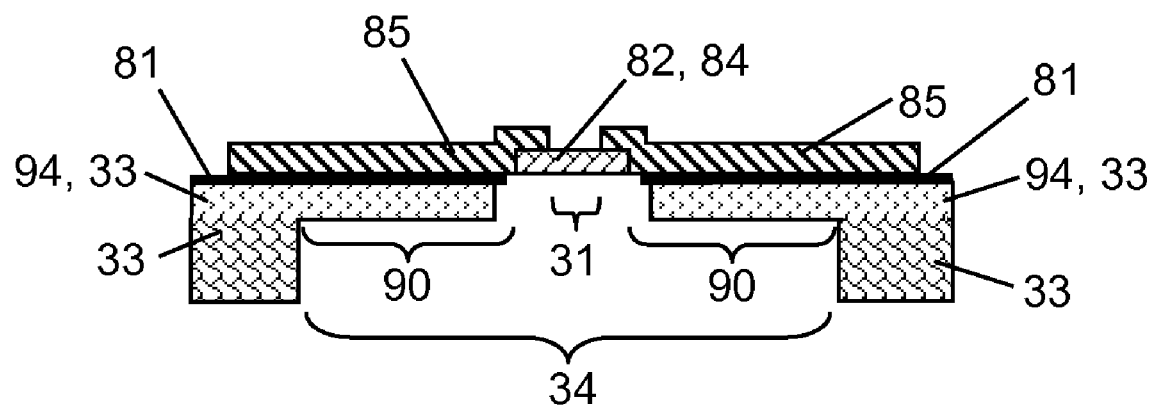

Despite the better power and voltage obtainable in the structures according to FIGS. 25 to 26e, as compared with the thermopile chip 30 comprising a membrane 34 made of an electrically insulating material (FIGS. 21 to 24), the latter version is considered to be preferable for a first implementation of TEGs 40 in factories for mass production. This is due to (i) the smaller number of technological steps required, which may result in a better performance/cost ratio and a lower cost, and (ii) the better mechanical stiffness due to the presence of one non-segmented membrane 34, which may provide better reliability and therefore an extremely long life time of the thermopiles in customer products.

Figure 27:
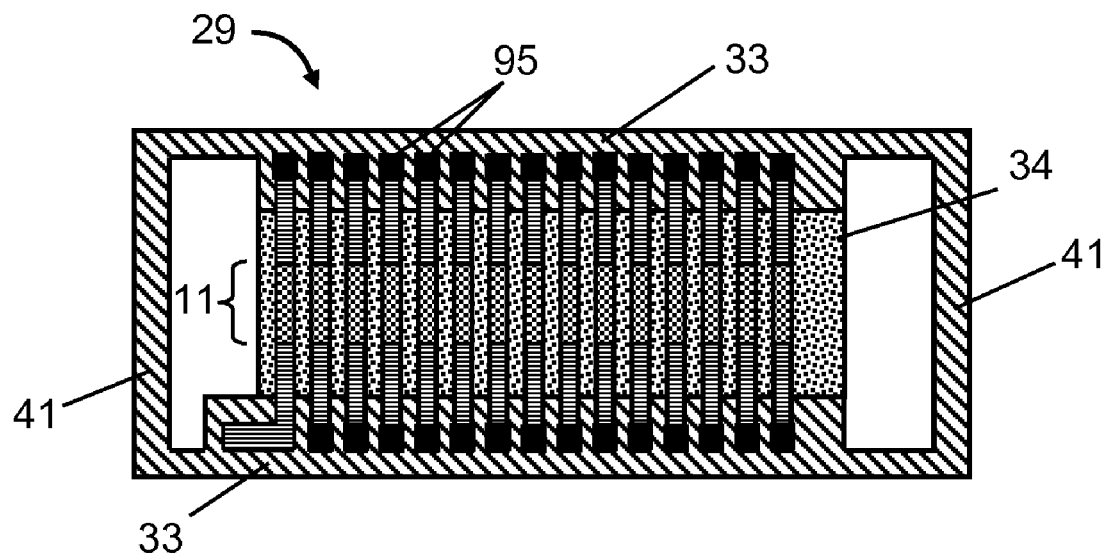
FIG. 27 shows one of two thermopile chips to be bonded and electrically connected to another chip (with opposite type of conductivity) as shown in FIG. 28.
Figure 28:
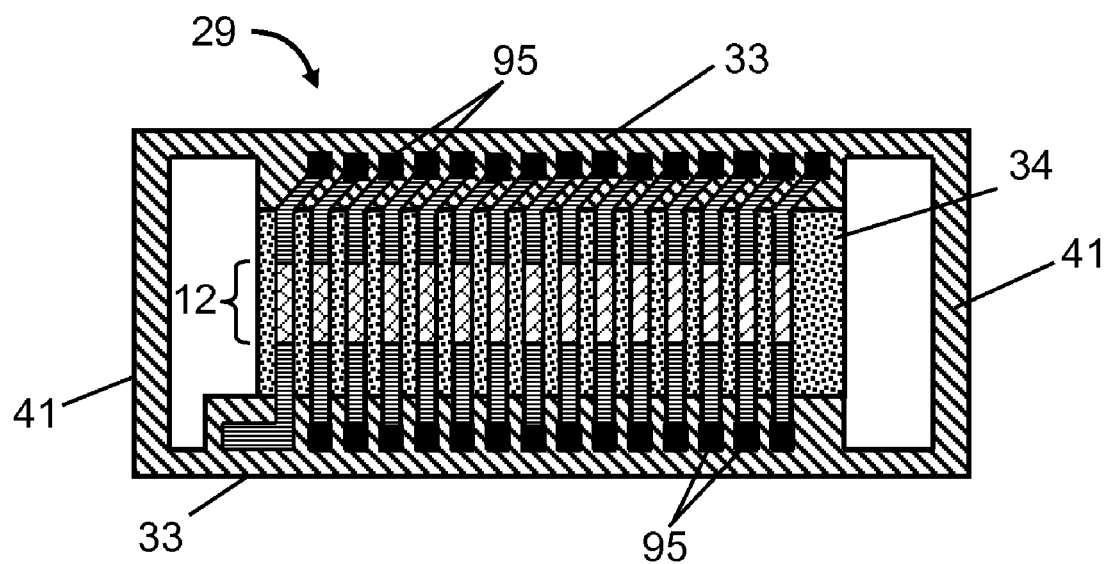
FIG. 28 shows the second thermopile chip to be bonded and electrically connected to the chip shown in FIG. 27. If the first chip is p-type, the second one is n-type and vice versa.
Figure 29:
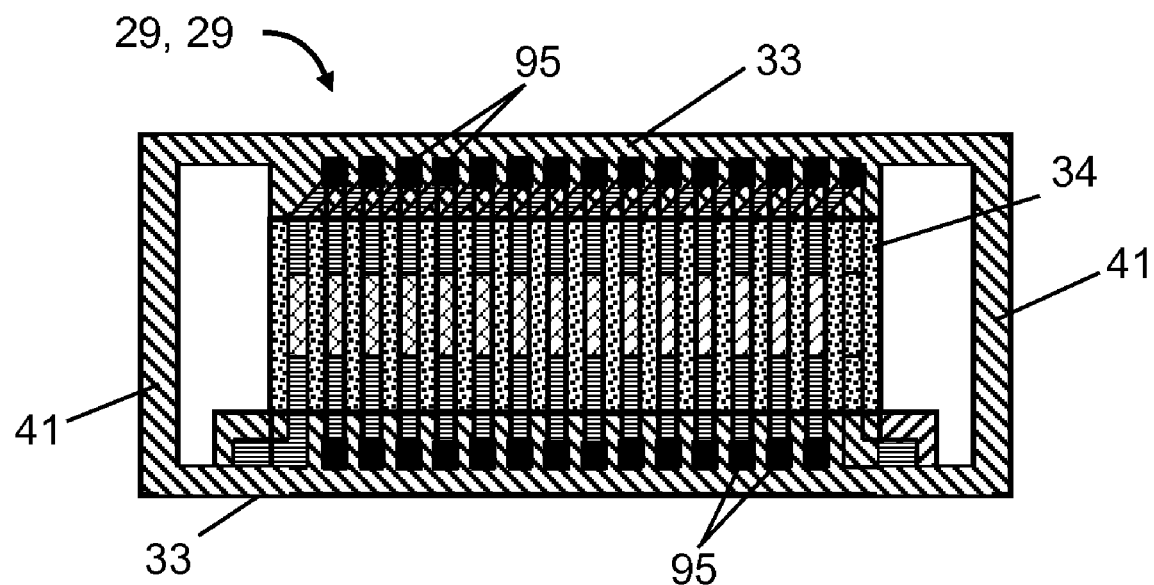
FIG. 29 shows the two coupled thermopile carrier chips of FIG. 27 and FIG. 28. For illustration purposes, the chips are shown semi-transparent.

In some cases, optimising the thermoelectric and/or thermal and/or electrical properties of the first thermoelectric material comprised in layer 82 on one hand and of the second thermoelectric material comprised in layer 84 on the other hand, may require different fabrication parameters to obtain the best properties for both materials. For example, different annealing temperatures may be used for p-type BiTe and n-type BiTe. Therefore, the fabrication of p-type and n-type thermocouple legs on one substrate results in competing considerations in determining the annealing temperature. In order to obtain optimum performance for both p-type and n-type thermoelectric layers, e.g. tellurium-containing thermoelectric layers, separate n-type and p-type carrier chips 29 may be fabricated, as illustrated in FIG. 27 and FIG. 28. The two thermopile carrier chips 29 of FIG. 27 and of FIG. 28 then may be coupled and attached face-to-face to each other, e.g. using wafer-to-wafer or chip-to-chip bonding. This is illustrated in FIG. 29, where the front thermopile carrier chip 29 is shown transparent for the sake of clarity. For example, reflow of indium bumps 95 may be used for the electrical interconnection of an n-type chip and a p-type chip with each other. In order to obtain a good reliability of the chip-to-chip interconnects, indium bumps may be created on both p-type and n-type thermopile carrier chips 29. The thermopile carrier chips 29 may be arranged in a thermopile unit 50 or in a TEG 40 as shown in FIG. 20.

Breaking the removable beams 41 of the carrier frame in a TEG 40 or in a thermopile unit 50 may not be necessary if other means are selected to remove them. Examples of other methods that may be used for removing the removable beams 41 are standard dicing, other mechanical cutting methods, laser dicing, or wet etching (e.g. by immersing removable beams 41, side by side, into an etching solution). However, breaking the sides of the carrier frame along the grooves 87 (FIG. 12) is considered as a particularly advantageous manufacturing method.

Figure 30:
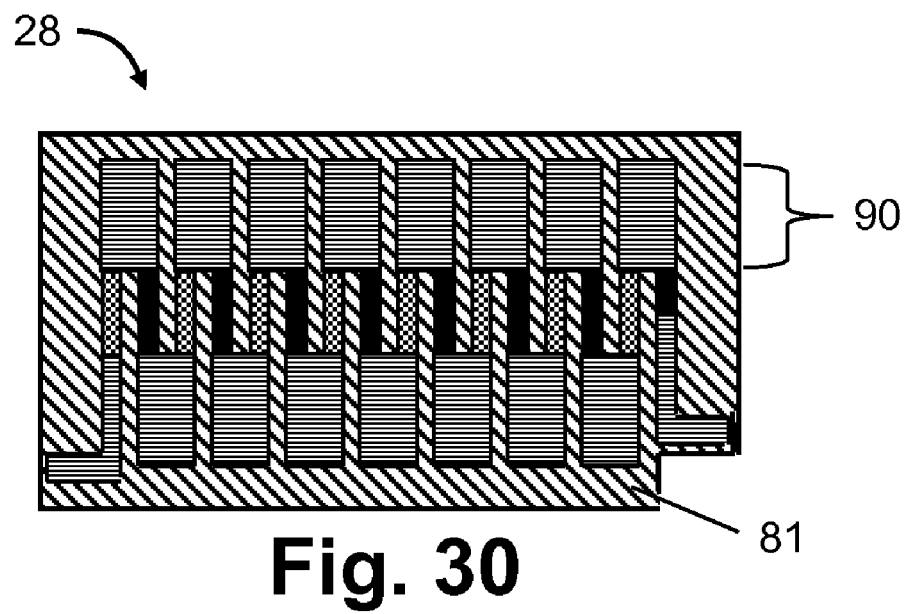
FIG. 30 illustrates an additional possible method of fabrication of a thermopile chip.
Figure 31A:
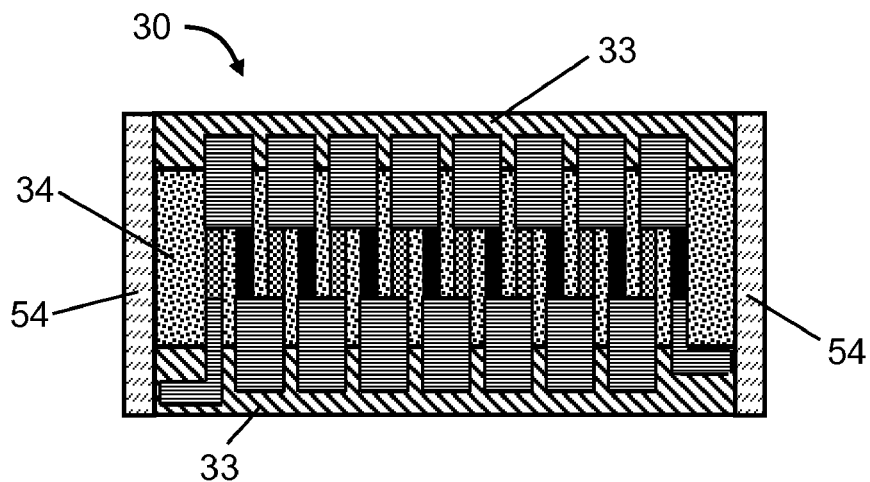
FIG. 31a and FIG. 31b show diced thermopile chips as in FIG. 30 after permanent or temporary (e.g. only for technological reasons) attachment of side pillars.
Figure 31B:
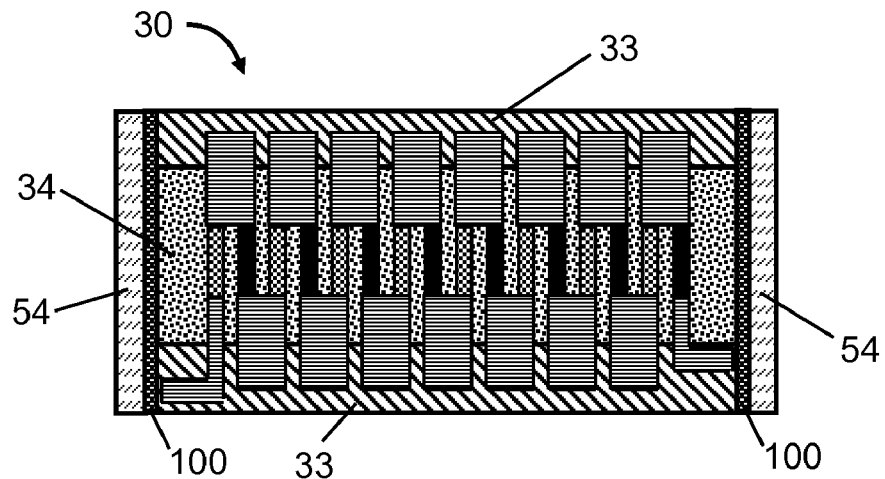

A further example of a method for eliminating the removable beams 41 is described below. After performing Part I of the fabrication process, the thermopile wafer 28 may be diced into thermopile dies such as shown in FIG. 30. Then, thermally isolating pillars 54 may be formed against the sides of the thermopile dies (FIG. 31a) or may be attached, e.g. glued or soldered, thereto using thermally insulating interconnecting material 100 (FIG. 31b). If the material of pillars 54 and of interconnecting material 100 is resistant to the etchant used for etching the substrate 80, then Part II of the fabrication process can be performed as described above. If however the material of pillars 54 and/or of interconnecting material 100 is not resistant to the etchant used for etching the substrate 80, then all surfaces coming into contact with the etchant during Part II of the fabrication process may be protected with etch-resistant coatings or layers. The thermopile die after Part II of the fabrication process looks for example as shown in FIG. 31a or FIG. 31b. The use of pillars 54 on each thermopile die does not exclude the use of additional pillars 54 or walls 55 in a thermopile unit 50 or in a TEG 40. An advantage of such an approach, i.e. an approach wherein the removable beams 41 are diced and not broken from the carrier frame, is that opening of the windows 86 is not needed, which decreases the number of lithographic steps required. In the approach where the removable beams 41 are broken from the carrier frame, opening of windows 86 may be performed in order to avoid damaging the membrane and/or the thermocouples during breaking.

Figure 32:
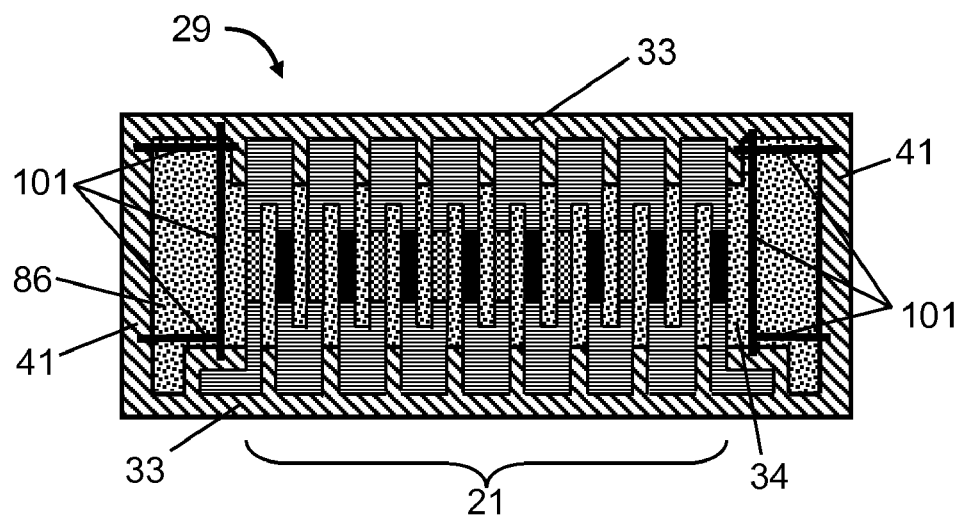
FIG. 32 illustrates an alternative way of separation of the membrane from the removable beams.
Figure 33:
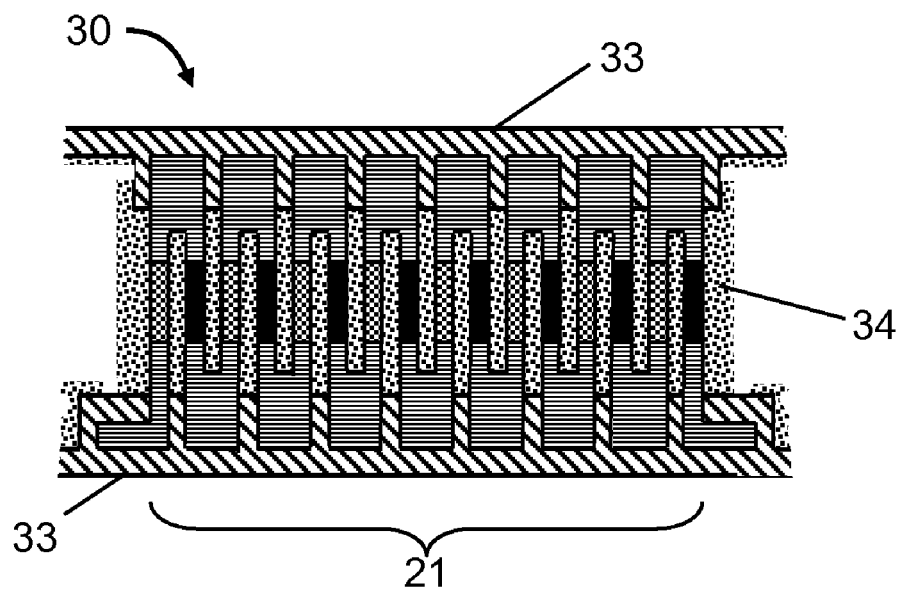
FIG. 33 shows the result of removing the removable beams from the thermopile carrier chip shown in FIG. 32.

In Part II of the fabrication process, etching of windows 86 in the membrane 34 may not be necessary if the membrane is separated from the sides 41, for example by laser cutting of the membrane. This is illustrated in FIG. 32, showing an example of cutting lines 101. Other methods than laser cutting may be used, such as for example cutting using a diamond cutting tool. An example of a thermopile chip 30 after completing such a fabrication process, i.e. after removing the removable beams 41 and the parts of the electrically insulating layer 81 which have been cut lose, is shown in FIG. 33.

In order to quantify the performance of the TEG 40, calculations have been performed for a TEG 40 comprising membrane-type thermopile chips 30 of the two different versions shown in FIG. 13 and in FIG. 22, i.e. without thermal shunts (FIG. 13) and with thermal shunts (FIG. 22), respectively. It is assumed that the TEG is on a human wrist indoors (i.e. with no wind). Moreover, the person is supposed to be sitting. The calculations are performed for bismuth telluride thermopile chips of 10×28 mm$^2$ size with an etch profile as shown in FIG. 14a. A standard 8-inch microelectronic process is chosen for manufacturing the thermopile chips 30, wherein the substrate is made of 0.725 mm-thick silicon. It is assumed that the cold plate 38 has a size of 3×3 cm$^2$ and the hot plate has a size of 2×3 cm$^2$. The plates 37, 38 have a thickness of 0.5 mm each, so the size of the TEG 40 is 3×3×1.1 cm$^3$, i.e. similar to the size of a watch. The thermal shunts 90 and electrical interconnects 32 are assumed to be fabricated of 2 µm thick aluminium. The air temperature is 22° C. The thermal resistance of the body at an air temperature of 22° C. is assumed to be 150 cm$^2$K/W on a human wrist near the radial artery. An output voltage of at least 5 V is assumed as major requirement for the TEG, to be sure that the TEG still produces at least 2 V at an ambient temperature of 30° C. Calculations have been performed for different cases.

Figure 34:
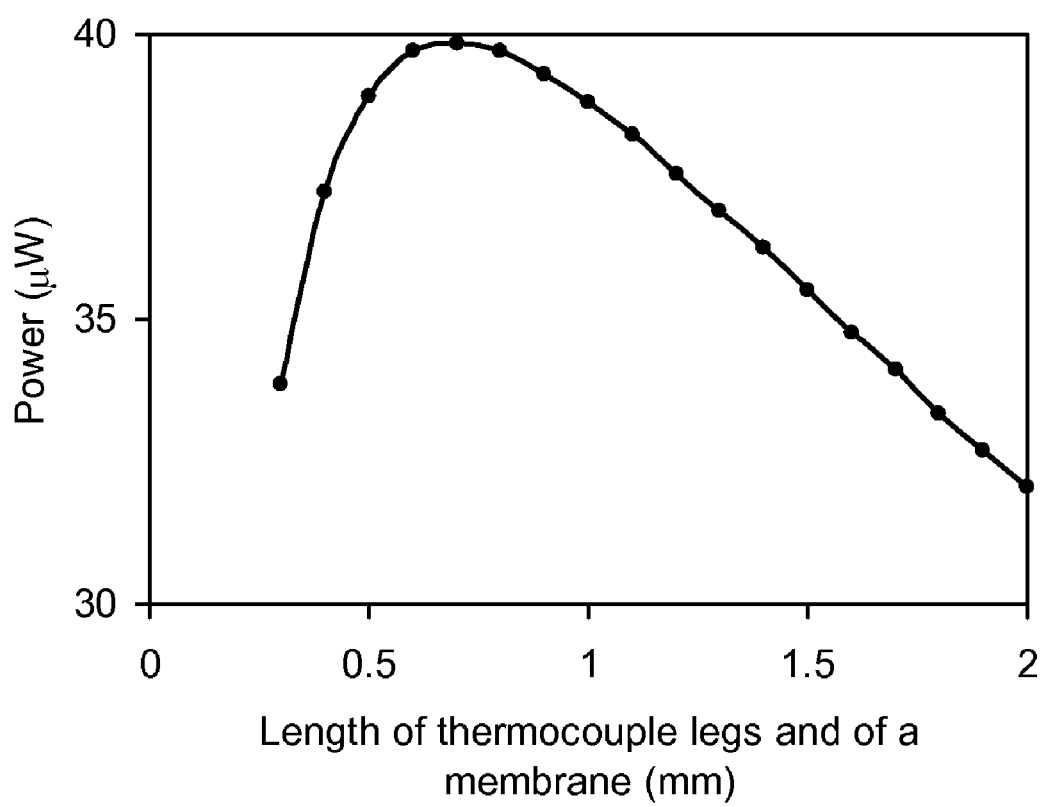
FIG. 34 shows the dependence of the output power on the length of the thermocouple legs and of a membrane for a TEG according to FIG. 13, with 14 thermopile chips and with no thermal shunts, for a first TEG design.

Case 1: without thermal shunts (FIG. 13). A 3 µm thick film of BiTe is used for forming the layers of thermoelectric material. In the TEG, 14 thermopile chips are coupled into 7 couples in a way similar to the one shown in FIG. 20, face to face on a couple by couple basis. A good electrical contact resistance of 10Ω·µm$^2$ between the interconnection metal and the thermoelectric material is assumed. The dependence of the power produced by the TEG on the length of the thermocouple legs (or on a membrane length which is the same in the case considered here) at such conditions is shown in FIG. 34.

Figure 35:
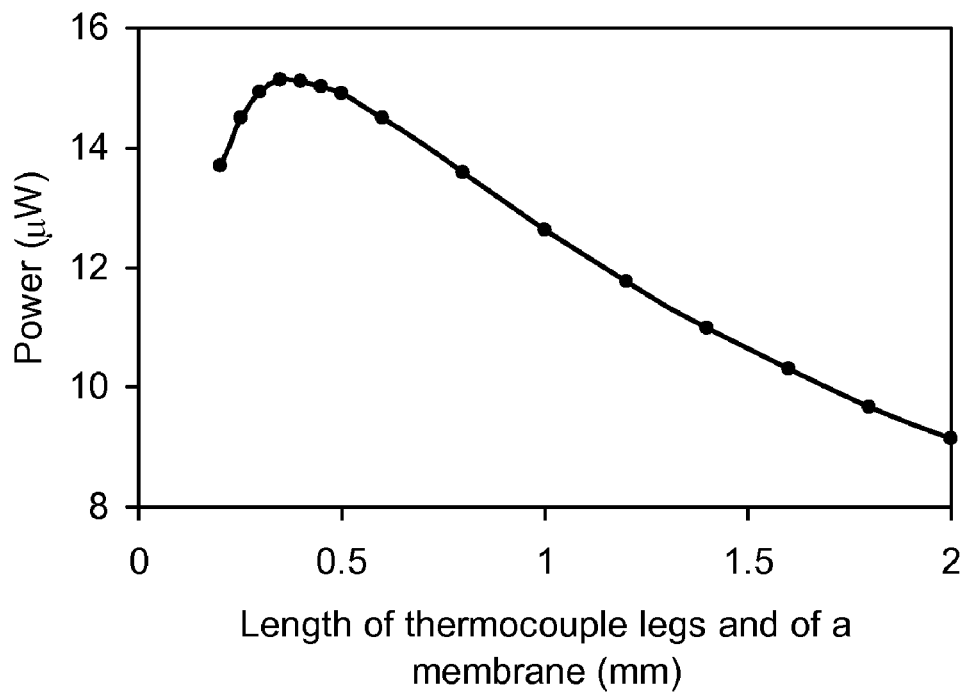
FIG. 35 shows the dependence of the output power on the length of the thermocouple legs and of a membrane for a TEG according to FIG. 13, with 10 thermopile chips and with no thermal shunts, for a second TEG design.

Case 2: without thermal shunts (FIG. 13). A 1 µm thin film of BiTe is considered, to obtain a 3-fold decrease of the film deposition time as compared to Case 1. In the TEG, 10 thermopile chips are coupled into 5 couples in a way similar to the one shown in FIG. 20, face to face on a couple by couple basis. As compared to Case 1, this results in a decrease of the production cost per TEG. A moderately good electrical contact resistance of 100Ω·µm$^2$ between the interconnection metal and the thermoelectric material is assumed. The dependence of the power produced by the TEG on the length of the thermocouple legs (or on the membrane length which is the same in the case considered here) at such conditions is shown in FIG. 35.

Figure 36:
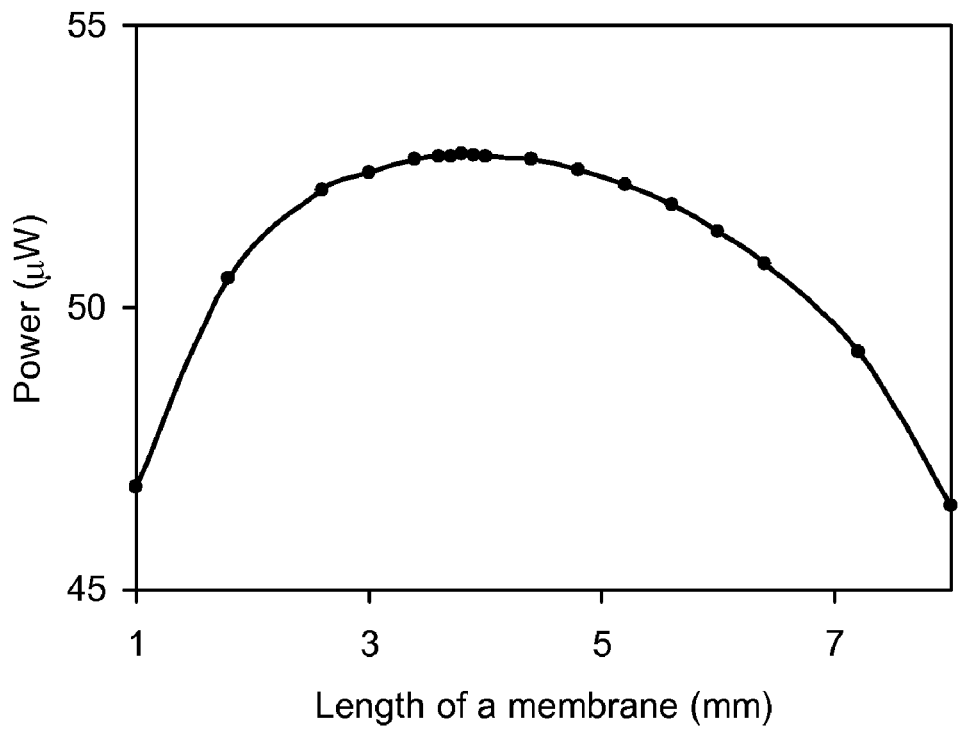
FIG. 36 shows the dependence of the output power on the length of a membrane for a TEG according to FIG. 22, with 14 thermopile chips and with thermal shunts, for a third TEG design.
Figure 37:
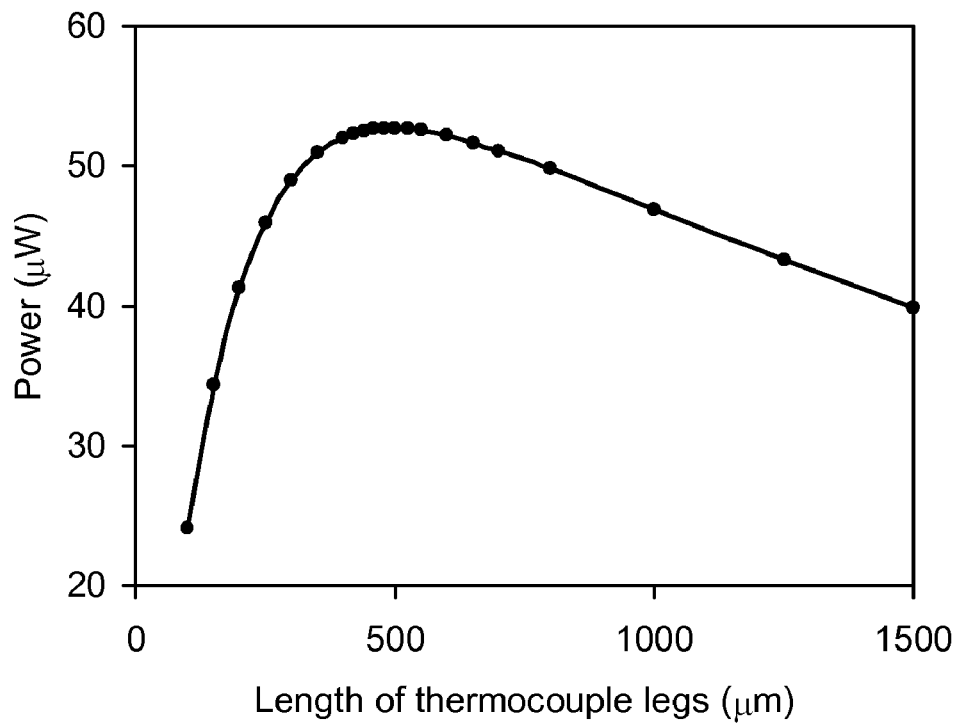
FIG. 37 shows the dependence of the output power on the length of the thermocouple legs for a TEG according to FIG. 22, with 14 thermopile chips and with thermal shunts, for the third TEG design.

Case 3: with thermal shunts (FIG. 22). In this case the length of the thermocouple legs is less than the length of the membrane. A 3 µm thick film of BiTe is used for forming the layers of thermoelectric material. The TEG comprises 14 thermopile chips and a contact resistance of 10Ω·µm$^2$ between the interconnection metal and the thermoelectric material is assumed, as in Case 1. The dependence of the power produced by the TEG on the length of a membrane is shown in FIG. 36 for a 0.5 mm-long thermocouple leg. The dependence of the power produced by a TEG with a 3.8 mm-long membrane on the length of the thermocouple legs is shown in FIG. 37.

Figure 38:
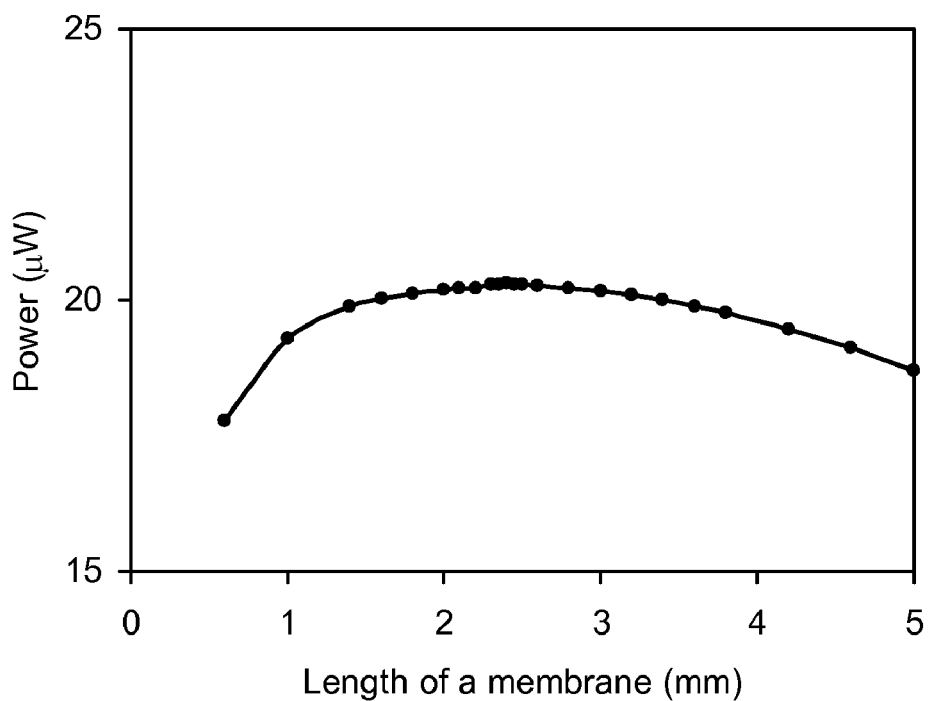
FIG. 38 shows the dependence of the output power on the length of a membrane for a TEG according to FIG. 22, with 10 thermopile chips and with thermal shunts, for a fourth TEG design.
Figure 39:
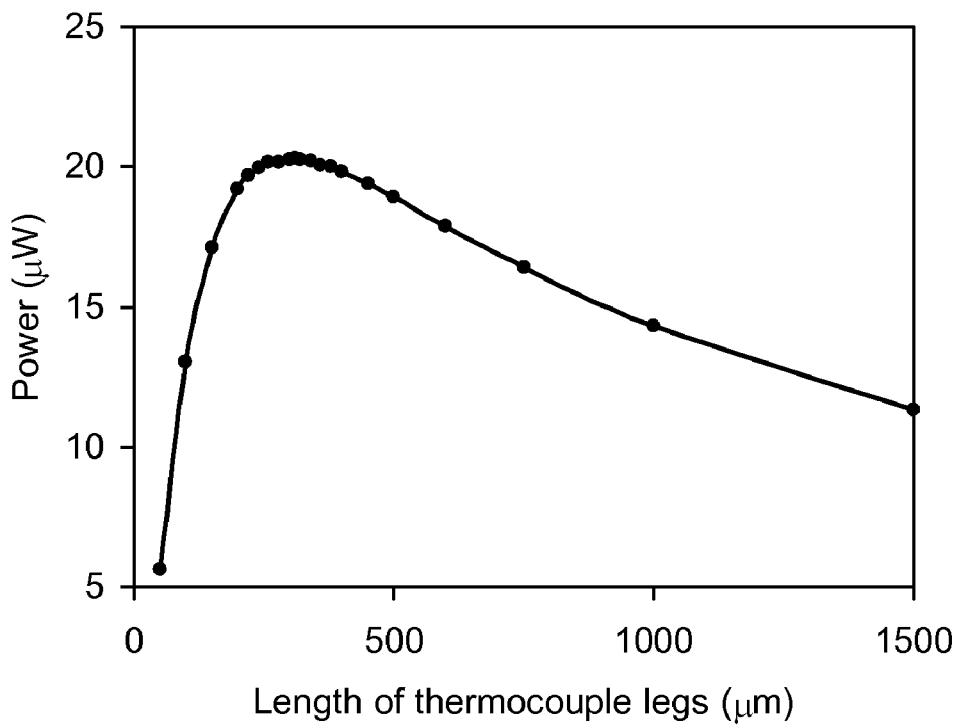
FIG. 39 shows the dependence of the output power on the length of the thermocouple legs for a TEG according to FIG. 22, with 10 thermopile chips and with thermal shunts, for the fourth TEG design.

Case 4: with thermal shunts (FIG. 22). A 1 μm thin BiTe film is assumed, 10 thermopile chips are used, and an electrical contact resistance of 100Ω·μm² between the interconnection metal and the thermoelectric material is assumed. The dependence of the power on the length of the membrane is shown in FIG. 38 for 0.31 mm-long thermocouple legs. The dependence of the power with a 2.4 mm long membrane on the length of the thermocouple legs is shown in FIG. 39.

Summarizing the results of Cases 1 and 2, an output power between 15 μW and 40 μW can be obtained with thermopile chips 30 without thermal shunts (as in FIG. 13), depending on the thickness of the BiTe film and the contact resistance between the interconnection metal and the thermoelectric material. As can be seen by comparing cases 1 and 3 or cases 2 and 4 with each other, the power increases when thermal shunts are used in the design, and this improvement is not related to particular values of the thermoelectric layer thickness and/or the contact resistance between the interconnection metal and the thermoelectric material. Further increase of the thermoelectric layer thickness results in a TEG performance similar to the best performances of micromachined thermopiles according to US-2006-0000502 or of other types of thermopiles according to U.S. Ser. No. 12/028,614.

Figure 40:
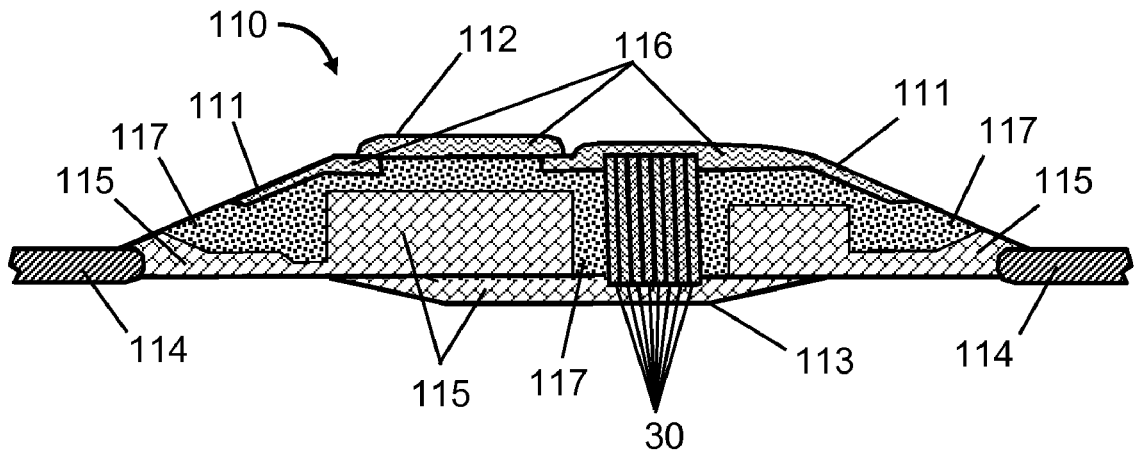
FIG. 40 shows an example of an integration of thermopile chips into a watch.
Figure 41:
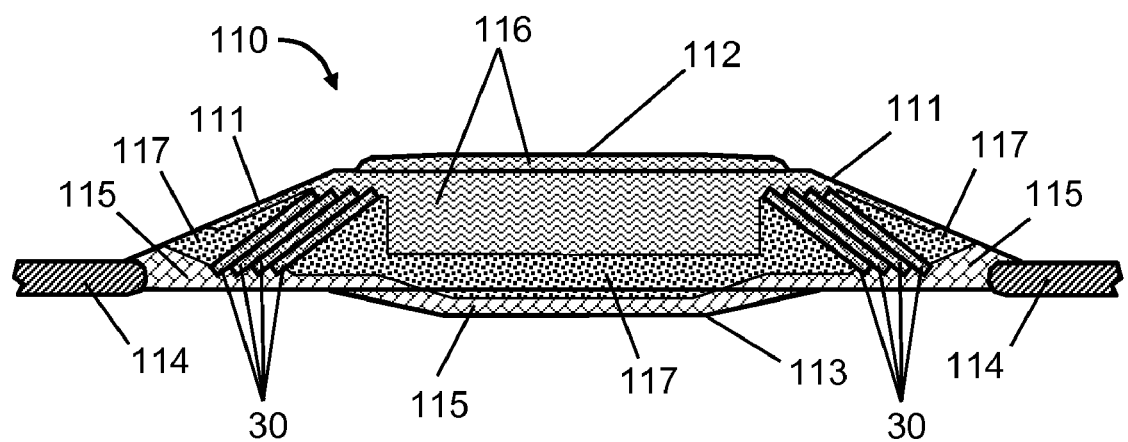
FIG. 41 shows an example of an integration of thermopile chips into a watch.

Hereinafter, specific designs of thermopile chips 30 are discussed for application in small (e.g. few centimeters and less) or thin (e.g. several millimeters) devices such as for example wireless sensor nodes. An appropriate device to be used as an example is a watch 110, being self-powered, for example by a TEG 40. Of course, all TEGs 40 and thermopile units 50 discussed above may be implemented into a watch, e.g. as shown in FIG. 40, when a special watch body is fabricated, or as shown in FIG. 41 for a more "classical" watch shape. The numbers in these simplified cross sections of a watch denote the following items: 111 is a watch body; 112 is an optically transparent front lid; 113 is a backside lid; 114 is a watchstrap; 115 are all watch components that could be referred as to "hot parts", equivalent to a hot plate 37; 116 are all watch components that could be referred as to "cold parts", equivalent to a cold plate 38, wherein the zone 116 may also include elements specially shaped as a fin or pin radiator; and 117 is a thermal insulation which may include components made of thermally insulating materials or which may include compartments filled with gases at different pressure or under vacuum. As a further example, the TEG 40 shown in FIG. 41 is split in two sub-units each comprising a plurality of thermopile chips 30, both sub-units being electrically connected in series. The sub-units are representing one TEG composed of 8 thermopile chips 30. This splitting into sub-units may be done to fit the available space in a watch. The invention is not limited by the examples shown, and any other arrangement is possible which provides enough power and voltage to power the watch (or any other self-powered device). However, the problem of fitting a TEG 40 into a thin or a small-size watch remains. Therefore reduction of the size of a TEG 40 and/or of a thermopile unit 50 is desirable to fit the available volume in a watch. In advanced wrist devices, more and more functionalities will be added, making it a personal assistant, adviser, security/safety/emergency and health monitoring device, personal ID tag, messenger, mobile phone (with limited call duration), GPS, etc. Therefore, the volume available for an energy scavenger will always be an issue. A TEG 40 then can be incorporated into a watchstrap as an insert into it and it may be forced to be located on a radial or ulnar artery through its design.

In certain applications there may be a desire for TEGs 40 with a thickness that is as small as possible. In order to decrease the thickness of a TEG 40 and/or of a thermopile unit 50, the thermopile chip or chips 30 may be placed parallel to at least one of the hot plate 37 and/or the cold plate 38, as shown in FIGS. 42-45. Alternatively, the thermopile chips 30 may be otherwise inclined, but preferably more parallel than perpendicular to the hot plate 37 and the cold plate 38, as shown in FIG. 46. This TEG arrangement generates a lower output power as compared to the above configurations wherein the thermopile chips 30 are perpendicular to at least one of the hot plate 37 and/or the cold plate 38. However, this approach allows a much more compact design of a TEG 40 and a thermopile unit 50, while still providing reasonably good operation at very small temperature differences between the heat source and the heat sink.

Future self-powered devices on a human body should not only produce the maximal output power at normal air temperatures like e.g. 22° C. or less, but they may be optimized for the temperature range of their operation. At about 36-37° C. air temperature, the performance of any TEG on a human body dramatically deteriorates due to the extremely low temperature difference between the skin temperature and the air. The same is valid for any technical application of TEGs, when the temperature difference between the hot plate 37 and the cold plate 38 becomes very small. Therefore, a TEG 40 for application in a watch may be optimised in such a way that the non-operational range of air temperatures which takes place around a temperature of human skin is as small as possible.

Figure 44:
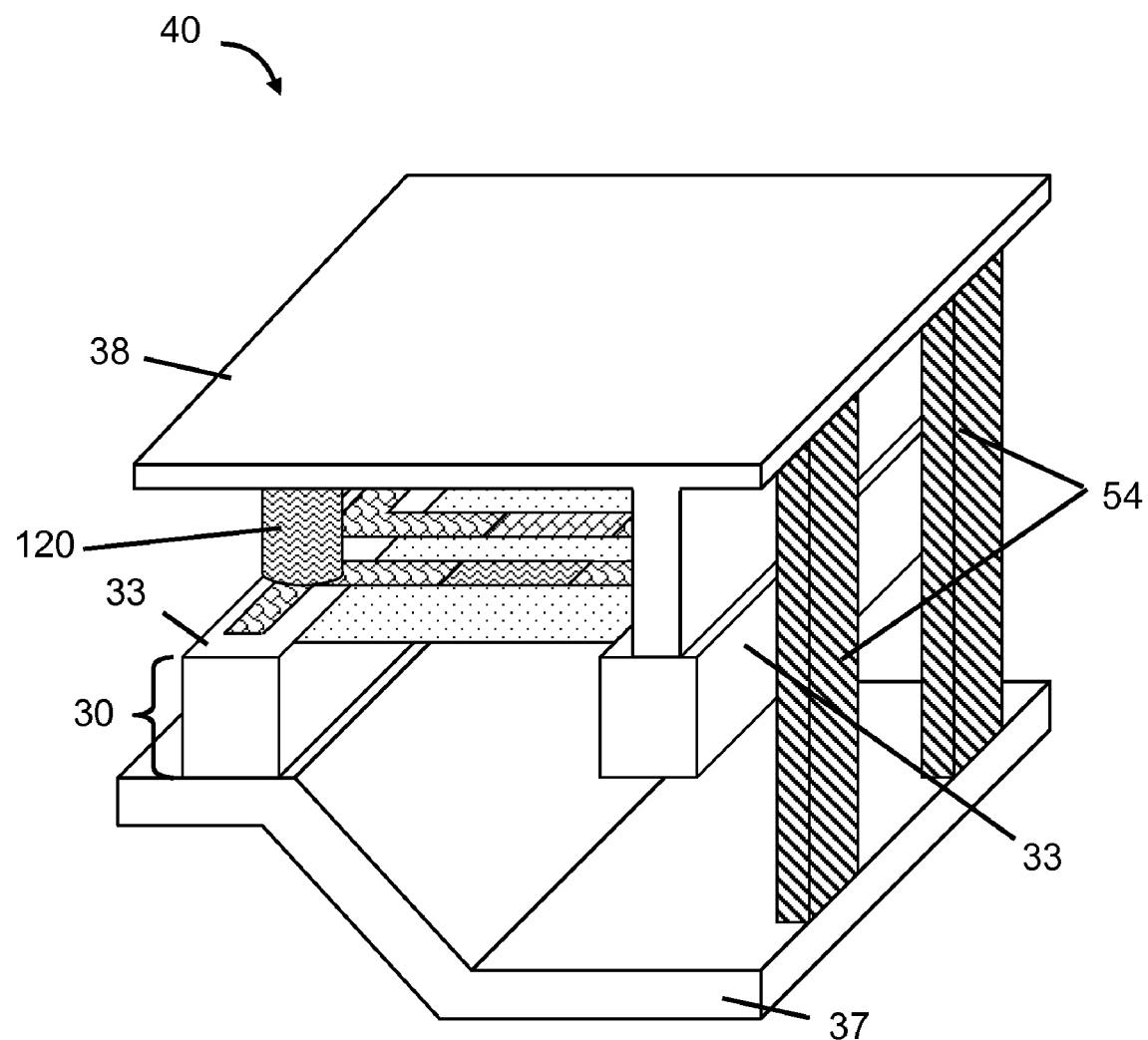
FIG. 44 illustrates an arrangement wherein a thermopile chip is mounted parallel to the cold plate of a TEG. As an example, the hot plate has a non-flat complex shape, while two thermally insulating pillars (only one is seen; the other is behind the cold plate) are to hold one of the chip sides. The other side, as an example, is being held by a pillar.
Figure 45:
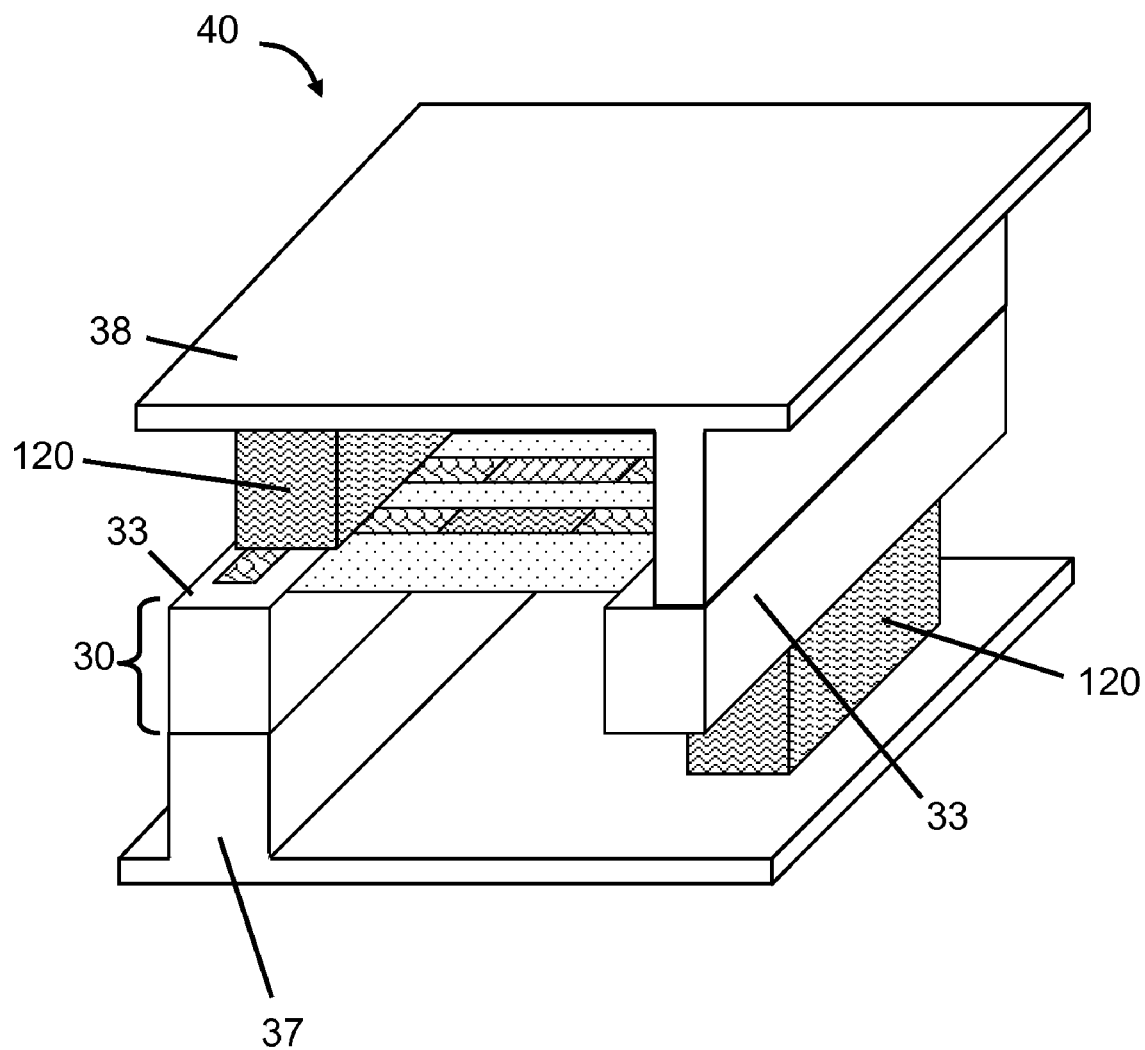
FIG. 45 illustrates an example of an arrangement wherein a thermopile chip is mounted parallel to the hot plate and the cold plate of a TEG, wherein two thermally insulating walls hold both sides of the chip.
Figure 46:
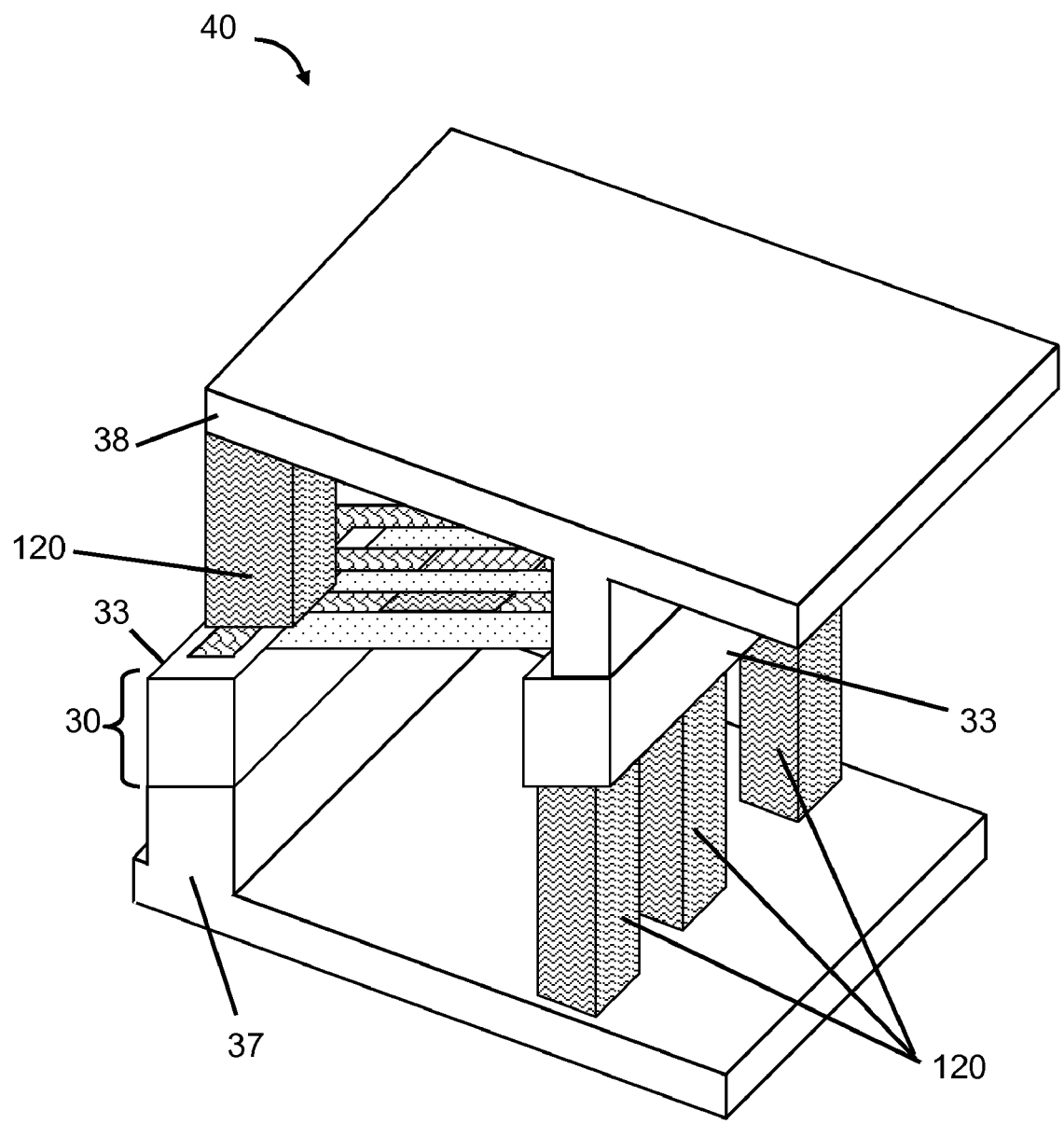
FIG. 46 illustrates an arrangement wherein a thermopile chip is mounted non-parallel with and non-orthogonal to both the hot plate and the cold plate of a TEG.

Examples of TEG designs for miniature devices are shown in FIGS. 42-46. The manufacturing technology is not affected by changing the design. As shown in FIGS. 42-46, thermally insulating elements (pillars, walls, etc.) 120 may be introduced in a TEG 40. These thermally insulating elements 120 can be installed in between the hot plate 37 or/and cold plate 38 and a carrier frame 33 and may be used for additional mechanical support. Thermally insulating elements 120 shaped as pillars are shown in FIGS. 42, 44, 46; thermally insulating elements 120 shaped as a wall are shown in FIGS. 43, 45. The shape of plates 37, 38 and the insulating elements 120 may be very different. The thermally insulating elements 120 may be used temporarily, only during assembling the device, or permanently, left in the final device. However, the elements 120 are preferably removed upon assembling the TEG 40 or thermopile unit 50. The TEG 40 may contain several thermopile chips 30, for example connected electrically in series and thermally in parallel. However, other configurations are possible, such as for example a combination of series/parallel connections, electrically or thermally or both electrically and thermally.

Figure 47:
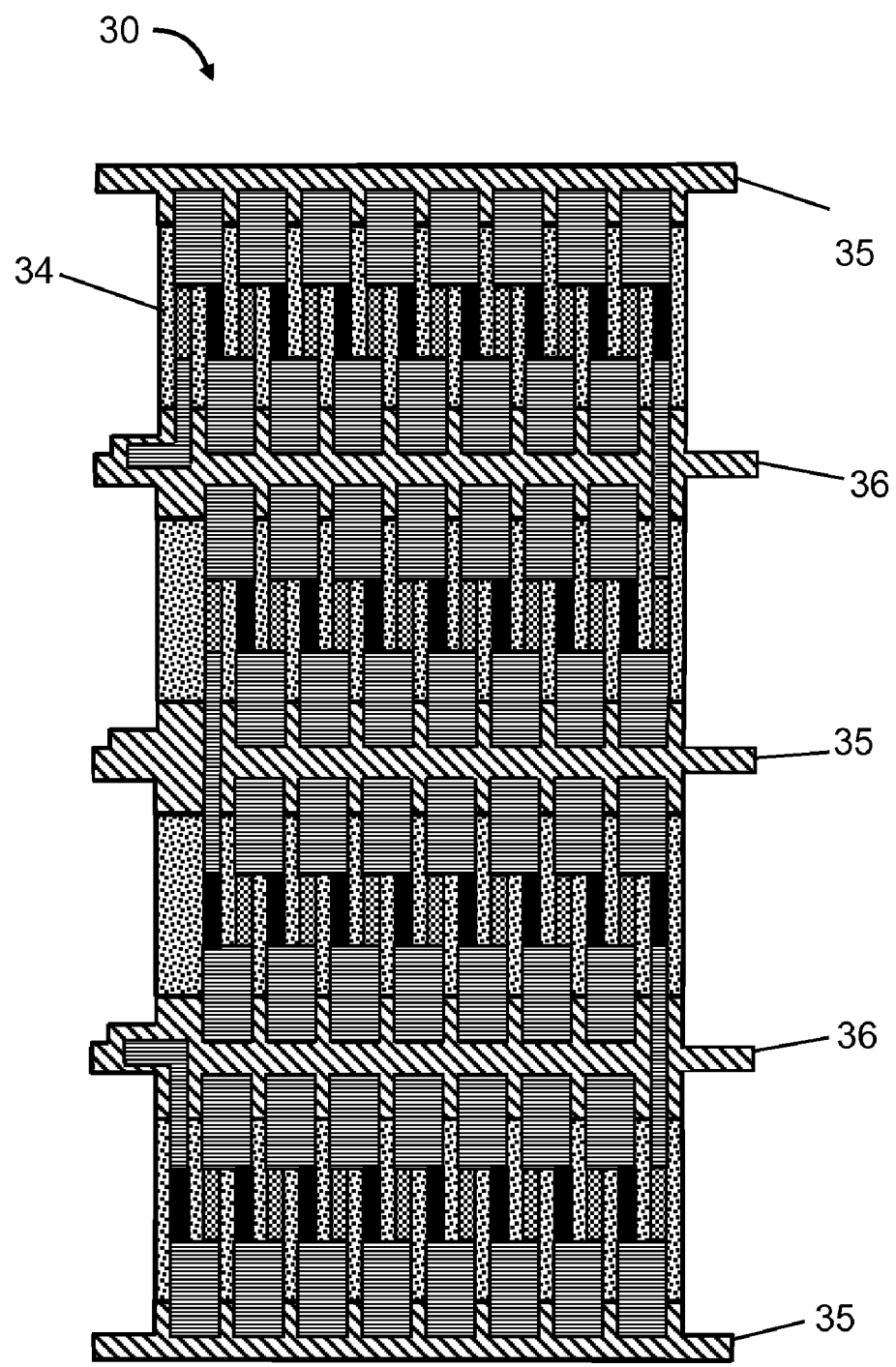
FIG. 47 shows a diced thermopile chip containing four thermopiles intended for an arrangement of the chip parallel to the hot plate and the cold plate in a thermopile unit or in a TEG.

In many practical cases, wherein the thermopile chips 30 are mounted parallel to the plates 37, 38 or inclined with respect to the plates 37, 38, there may be no need for separating, e.g. dicing, the thermopile chips from each other, e.g. as shown in FIG. 47. As an example, the thermopile chip 30 shown in FIG. 47 comprises four rows of thermocouples being connected electrically in series. The electrical connections in between rows of thermocouples may be done on chip, e.g. as shown in FIG. 47. Adjacent rows of thermocouples may share a hot carrier part 35 or a cold carrier part 36. Hot and cold carrier parts 35, 36 can be interchanged as compared to what is shown in FIG. 47. Mounting a thermopile chip 30 according to FIG. 47 in a thermopile unit 50 or in a TEG 40 may be done for example as illustrated in FIGS. 48a-c, resulting in a thermally parallel connection of the thermocouple rows.

Figure 48A:
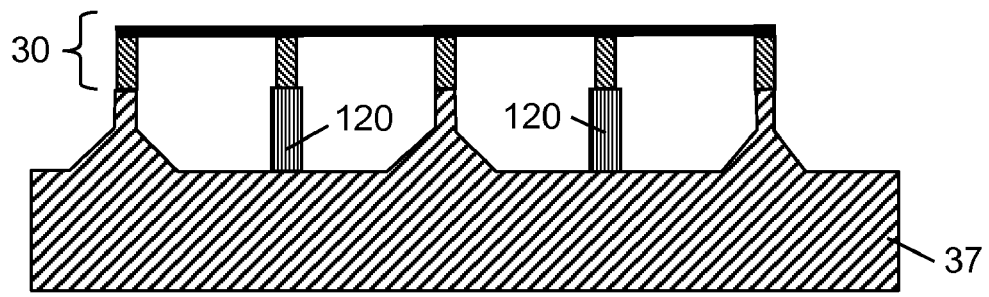
FIG. 48a-c illustrate an example of the assembly of a thermopile chip as shown in FIG. 47 with the hot plate and the cold plate of a thermopile unit, of a TEG, or of a product: (a) a thermopile chip installed on a shaped hot plate with thermally insulating cylindrical pillars holding the chip during removal of the removable beams; (b) possible final view of the assembly of the thermopile chip with the cold and hot plates; (c) another possible final view of the assembly of the thermopile chip with the cold and hot plates wherein the thermally insulating elements are removed and wherein the position of the plates is fixed by thermally insulating pillars or walls (not shown) or by a part of a product in which the TEG is embedded.
Figure 48B:
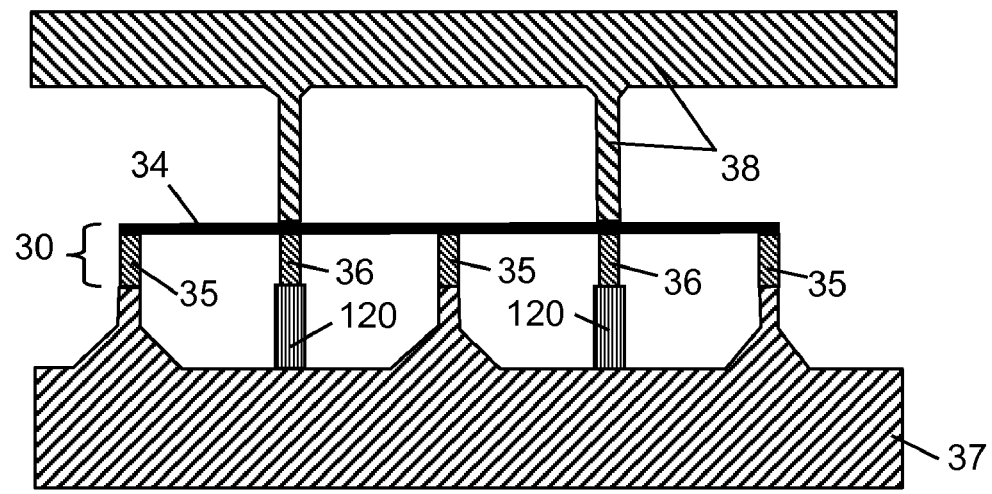
Figure 48C:
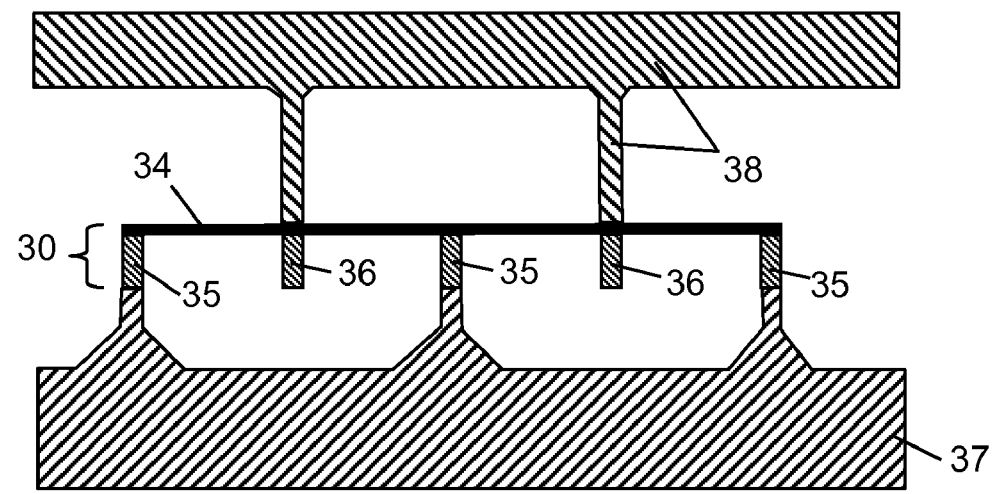

In FIG. 48 a-c, an example is shown of an assembling procedure for an arrangement of a thermopile chip 30 as shown in FIG. 47 parallel to the plates 37, 38. Assembling may start from any of the plates 37, 38. As an example, shown in FIG. 48a, thermally insulating elements 120 are installed on a hot plate 37. Then, the thermopile carrier chip 29, e.g. a thermopile carrier chip comprising rows of thermocouples (as e.g. shown in FIG. 47) is installed and thermally attached with any means discussed above. The removable beams 41 are then removed using any of the ways described above. FIG. 48a shows the assembly after removing the removable beams 41. Then, the cold plate 38 is mounted as shown in FIG. 48b and thermally attached with any means described above. At this stage of assembling, the device is ready for being used. However, if the position of the plates 37, 38 is fixed with respect to each other, e.g. with pillars 54 or walls 55, or if the product wherein the TEG 40 is used provides fixation of plates 37, 38 with respect to each other, then the thermally insulating elements 120 may be removed. The TEG 40 may then for example look as shown in FIG. 48c.

Figure 49:
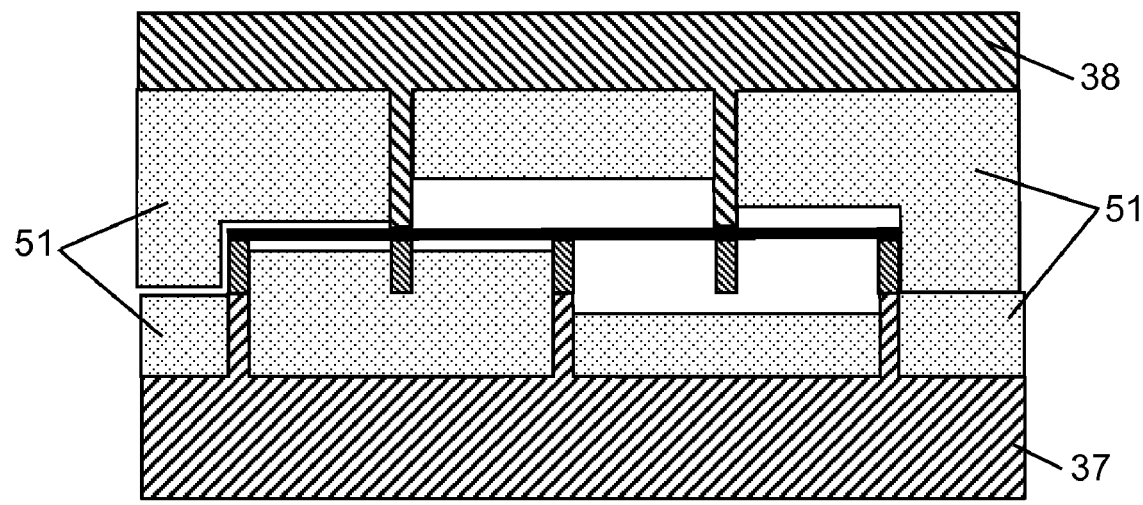
FIG. 49 shows a TEG with the inner space filled with thermally insulating material, the material preferably having a thermal conductivity less than the thermal conductivity of air. Several ways, with air gaps and without such gaps are shown.

FIG. 49 shows an example of a TEG 40 filled with a thermal insulation material 51, such as for example a nanoporous material. Several ways of putting thermal insulation 51 are shown at once: with gaps, and without gaps.

Figure 50:
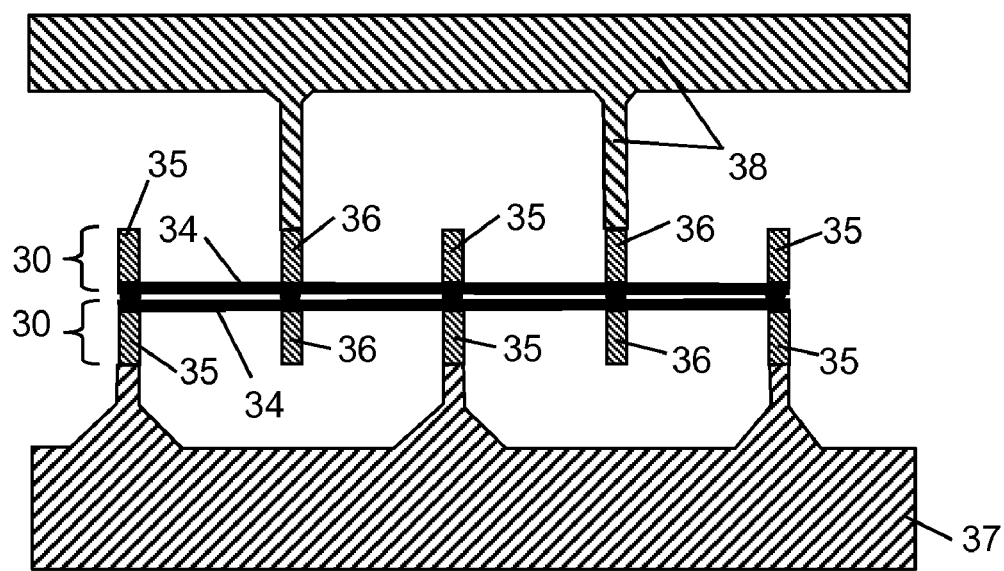
FIG. 50 shows an example of a way of mounting two thermopile chips bonded to each other, e.g., in case of a separate p-type chip and n-type chip.

All other innovations discussed in this patent application are applicable to the parallel arrangement of thermopile chips (parallel to plates 37, 38). For example, the coupled thermopile chips 30 as shown in FIG. 20, or the embodiment shown in FIGS. 27-29 may be used. An example of a possible arrangement is shown in FIG. 50, where the number of thermopile chips 30 can be different. Also, whenever the Figures refer to a membrane 34, it may be clear that the membrane-less thermopiles as disclosed above are also possible and an indication of a membrane in drawings is only for easier explanation and just for the sake of clarity.

Figure 51:
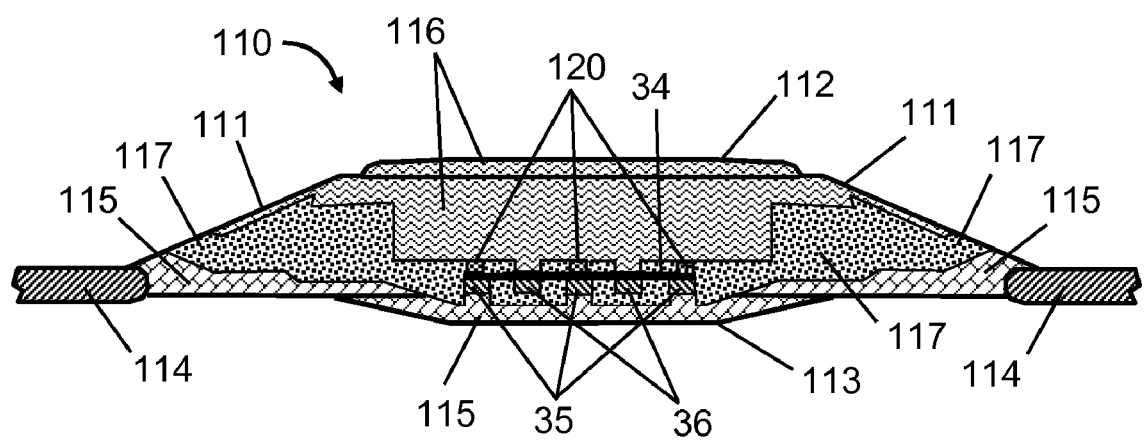
FIG. 51 shows an example of a product, e.g. a watch, with an arrangement of a thermopile chip parallel to the hot plate and the cold plate.

An example of a TEG 40 with parallel arrangement of thermopile chips 30 (i.e. parallel to plates 37, 38) is shown in FIG. 51, for application in a watch, where the parts of a watch body 115, 116 play the role of the hot plate 37 and the cold plate 38, respectively. Such parallel-arranged thermopile chips may be easily embedded into thin devices and garment like e.g. a wrist or head strap, belt, cap, and clothes, glasses and earphones, jewelry such as a necklace or a bracelet, and into thin portable devices.

To minimize the radiation heat exchange inside a TEG 40, all inner surfaces of the TEG 40 may have low emissivity (lower than 20%, preferably lower than 10%) in the infrared region of the electromagnetic spectrum. For example, a number of metals may serve as low-emissivity materials. Thus, if plastics or other materials used for forming the TEG 40 have large emissivity, they preferably may be covered with highly reflecting (low emissivity) material, such as for example a metal. The thermal shunts and/or interconnects covering a large part of the membrane of the proposed thermopile chips also may help to minimize the radiation heat exchange to/from the membrane and direct heat exchange between the plates 37 and 38 because the metal layer has a large reflection coefficient and a low emission coefficient.

As the TEG 40 may also be used for outdoor applications at temperatures above body core temperature and with a radiant heat from sun or from ambient, the TEG 40 may be used in reverse mode of operation, i.e. when the heat flow direction is from the ambient into a body, or to another surface, on which the device is mounted.

Thermal shunts 90 as described in the present disclosure may also be used in other types of thermopiles or thermoelectric generators than the membrane-type and membrane-less type devices described above. For example, thermal shunts 90 may advantageously be used in thermopiles or thermoelectric generators comprising micromachined thermocouples, such as for example described in US-2006-0000502 and U.S. Ser. No. 12/028,614. This is illustrated in FIGS. 52 to 56.

Figure 52:
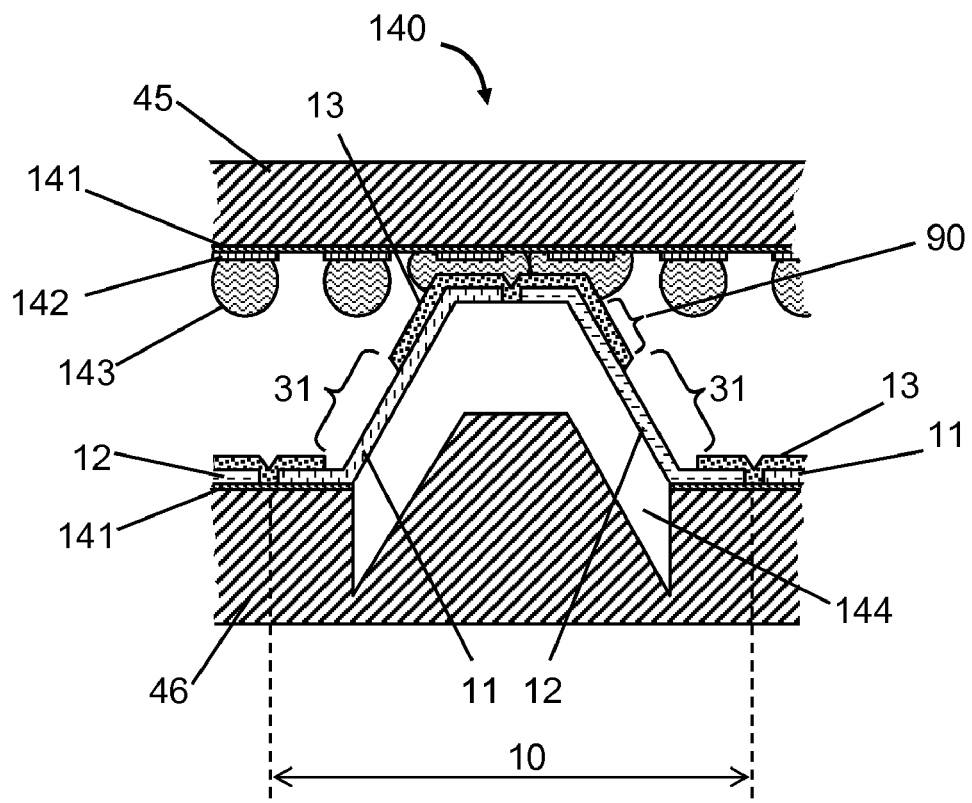
FIG. 52 shows a micromachined thermocouple with thermal shunts according to the present disclosure.

FIG. 52 shows part of a micromachined thermopile chip 140 (only one thermocouple is shown), wherein thermal shunts 90 made of a thermally and electrically conducting material such as e.g. a metal are provided. Thermal shunts 90 may be provided on the cold side and/or on the hot side of the thermocouple legs. In the example shown, the thermocouple is fabricated on a thermopile die 46, e.g. hot die 46. A die 45, e.g. cold die 45, is attached to the thermocouples using solder bumps 143, which are fabricated on top of metal pads 142. In the example shown, the dies may for example be manufactured on silicon wafers. In this case electrically insulating but thermally conducting layers 141 may be formed on the dies. Layers 141 may not be needed if the material of the dies 45, 46 is electrically insulating.

Figure 53:
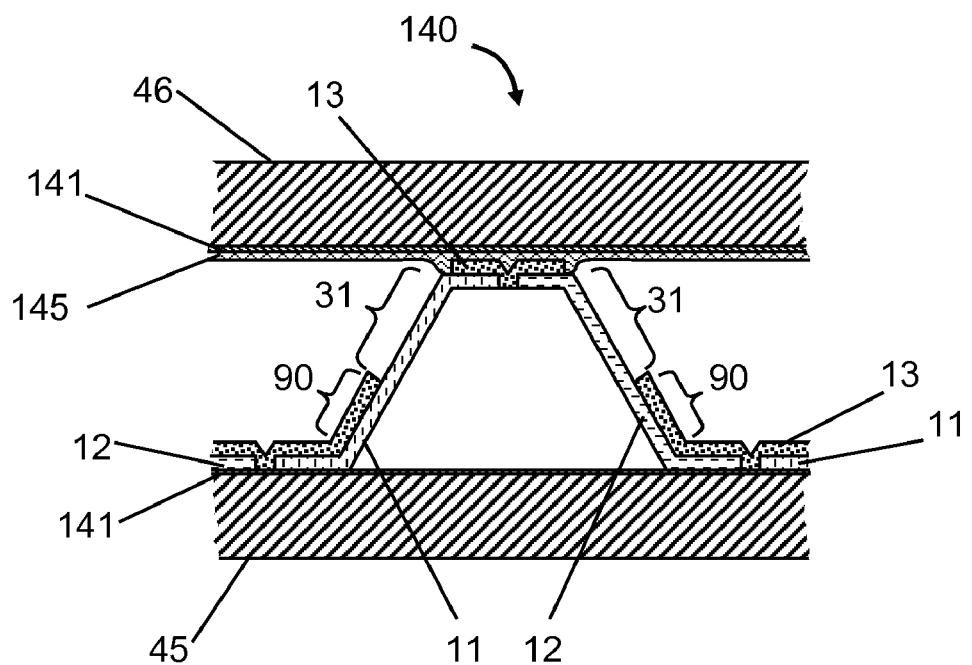
FIG. 53 shows a micromachined thermocouple with thermal shunts according to the present disclosure.
Figure 54:
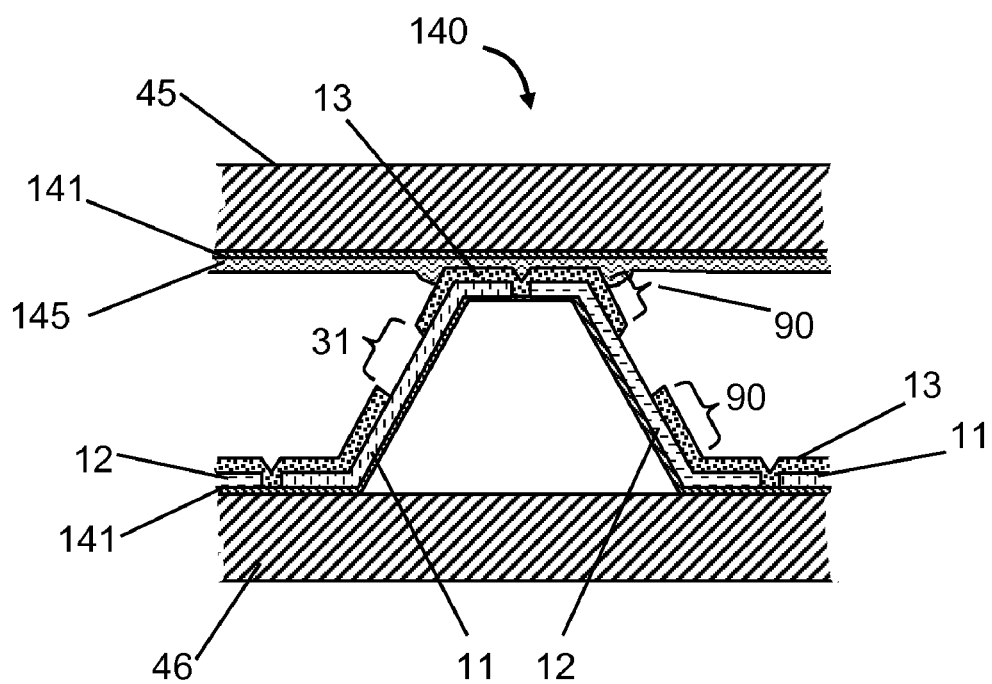
FIG. 54 shows a micromachined thermocouple with thermal shunts according to the present disclosure.

FIG. 53 and FIG. 54 show part of another micromachined thermopile chip 140 (only one thermocouple is shown) comprising thermal shunts 90 made of a thermally and electrically conducting material such as e.g. a metal. Thermal shunts 90 may be located on the hot side (as in FIG. 53), on the cold side or on both sides (as in FIG. 54) of the thermocouple legs. However, other locations, such as e.g. in the central part of the thermocouple legs are possible. Dies 45 and 46 may be attached to the thermopile using a thermally conducting and electrically insulating material 145 such as glue. For example, an epoxy layer with thermal conductivity of 0.006 W/cm·K or more, or a photoresist can be used for forming layer 145.

Figure 55:
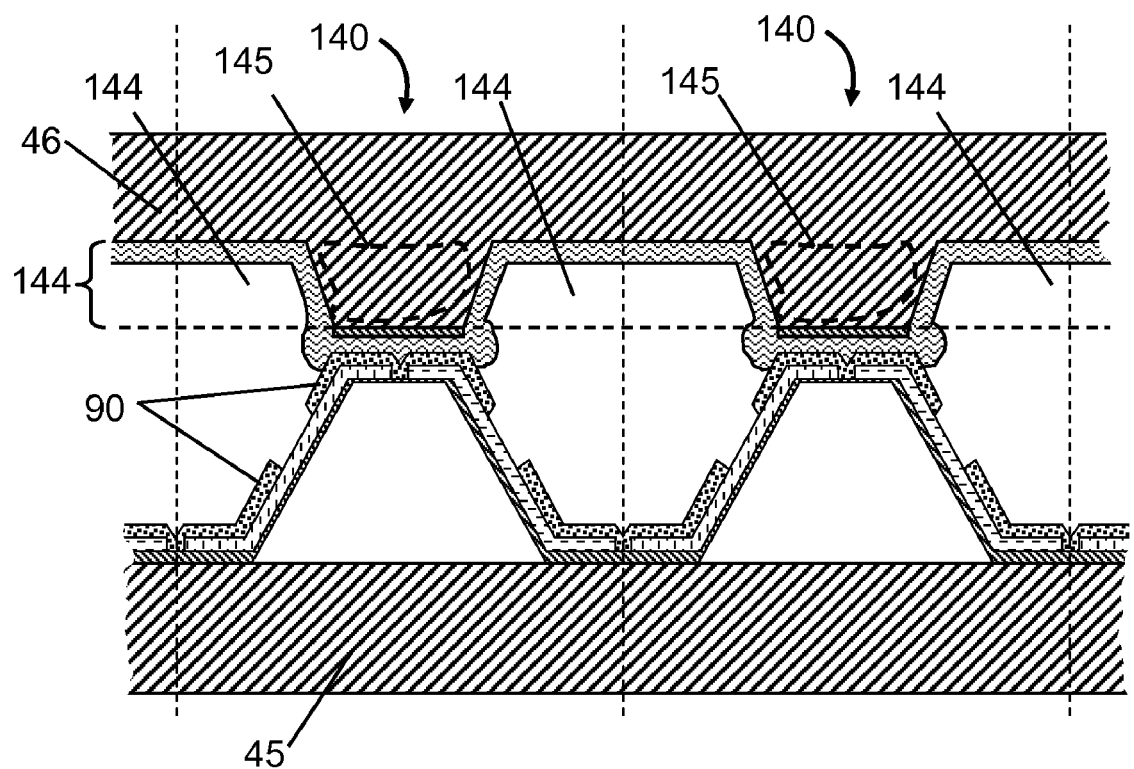
FIG. 55 shows two adjacent micromachined thermocouples with thermal shunts and wherein a die comprises pillars or bumps to increase an average distance in between both dies.

FIG. 55 shows another example, wherein thermal shunts 90 are provided on both the hot and cold side of the thermocouples. In addition, die 45 comprises bumps or pillars 145 to increase an average distance in between dies 45 and 46, which is similar to the raised elongated structures as disclosed in US-2006-0000502.

Figure 56:
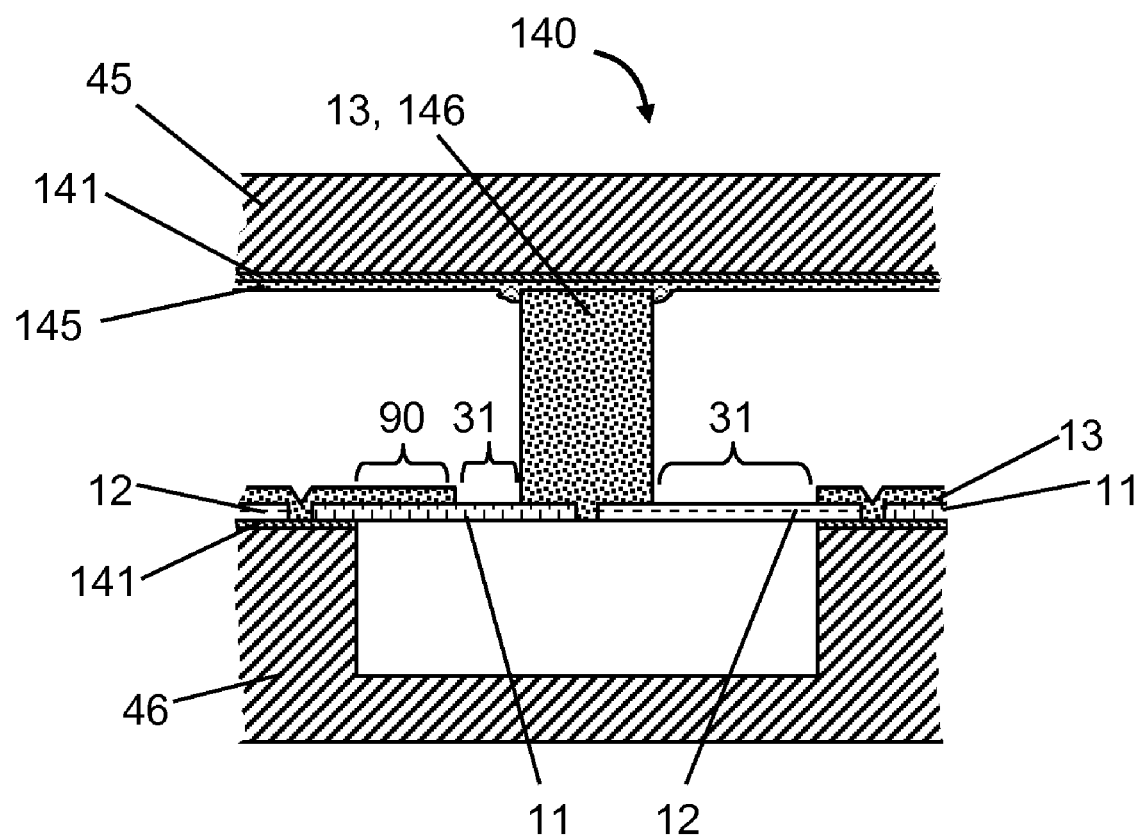
FIG. 56 shows a micromachined thermocouple with thermal shunts in between the thermocouples and a die.

Yet another example of a thermal shunt 146 is illustrated in FIG. 56. It comprises several micrometer-thick thermal shunts 146 performing also the function of a metal layer interconnect 13. One or more thermal shunts 90 can still be useful on one or more legs and/or on one or more sides of the thermocouple legs. As an example, in FIG. 56 a shunt 90 is only present on first thermocouple leg 11 but not on second thermocouple leg 12.

The invention claimed is:

1. A method of manufacturing a thermopile carrier chip comprising a plurality of thermocouples, the method comprising:

on a first surface of a first substrate comprising a first material, providing a plurality of first-type thermocouple legs;

thereafter removing part of the first material from a second surface opposite to the first surface to form a first carrier frame from the first substrate, the first carrier frame comprising a first hot carrier part, a first cold carrier part, and first removable beams, wherein the first hot carrier part, the first cold carrier part, and the first removable beams comprise a contiguous structure made of the first material, and wherein the first-type thermocouple legs are at least partially released from the first material of the first substrate, the first-type thermocouple legs being attached between the first hot carrier part and the first cold carrier part; and electrically connecting the plurality of first-type thermocouple legs with a plurality of second-type thermocouple legs, thereby forming an electrical series connection of alternating first-type thermocouple legs and second-type thermocouple legs.

2. The method according to claim 1, wherein electrically connecting the plurality of first-type thermocouple legs with a plurality of second-type thermocouple legs comprises:
on the first surface of the first substrate, providing a plurality of second-type thermocouple legs.

3. The method according to claim 1, wherein electrically connecting the plurality of first-type thermocouple legs with a plurality of second-type thermocouple legs comprises:
on a first surface of a second substrate, providing a plurality of second-type thermocouple legs; and
thereafter removing part of the second substrate from a second surface opposite to the first surface to form a second carrier frame from the second substrate, the second carrier frame comprising a second hot carrier part, a second cold carrier part, and second removable beams, wherein the second-type thermocouple legs are at least partially released from the second substrate, the second-type thermocouple legs being attached between the second hot carrier part and the second cold carrier part.

4. The method according to claim 2, further comprising, before providing the plurality of first-type thermocouple legs on the first surface of the first substrate, providing an electrically insulating membrane layer onto the first surface of the first substrate.

5. The method according to claim 4, further comprising separating the membrane layer from the first removable beams.

6. The method according to claim 5, wherein separating the membrane layer from the first removable beams comprises providing windows in the membrane layer.

7. The method according to claim 5, wherein separating the membrane layer from the first removable beams comprises cutting of the membrane layer.

8. The method according to claim 2, further comprising providing at least one thermal shunt for thermally connecting at least one side of the plurality of thermocouples to at least one of the carrier parts.

9. The method according to claim 1, further comprising:
assembling the thermopile carrier chip into a thermopile unit; and
removing the first removable beams.

10. The method according to claim 9, wherein assembling the thermopile carrier chip comprises attaching the thermopile carrier chip to a thermally insulating structure.

11. The method according to claim 9, wherein assembling the at least one thermopile carrier chip comprises providing at least one thermally conductive spacer thermally connected to at least one of the carrier parts.

12. The method according to claim 2, further comprising:
providing the thermopile carrier chip between a hot plate and a cold plate.

13. The method according to claim 12, further comprising:
providing at least one thermally insulating structure between the hot plate and the cold plate.

14. The method according to claim 12, wherein the thermopile carrier chip or thermopile unit is placed parallel to the hot plate.

15. The method according to claim 12, wherein the at least one thermopile carrier chip or thermopile unit is placed parallel to the cold plate.

16. A method of manufacturing a thermopile carrier chip comprising a plurality of thermocouples, the method comprising:
on a first surface of a first substrate comprising a first material, providing a plurality of first-type thermocouple legs;
thereafter removing part of the first material from a second surface opposite to the first surface to form a first carrier frame from the first substrate, the first carrier frame comprising a first hot carrier part, a first cold carrier part, and first removable beams, wherein the first hot carrier part, the first cold carrier part, and the first removable beams comprise a contiguous structure made of the first material, and wherein the first-type thermocouple legs are at least partially released from the first material of the first substrate, the first-type thermocouple legs being attached between the first hot carrier part and the first cold carrier part;
electrically connecting the plurality of first-type thermocouple legs with a plurality of second-type thermocouple legs, thereby forming an electrical series connection of alternating first-type thermocouple legs and second-type thermocouple legs; and
providing at least one thermal shunt for thermally connecting at least one side of the plurality of thermocouples to at least one of the carrier parts.

\* \* \* \* \*